(12) United States Patent
Song et al.

(10) Patent No.: US 12,198,630 B2
(45) Date of Patent: Jan. 14, 2025

(54) DISPLAY DEVICE

(71) Applicant: Samsung Display Co., LTD., Yongin-si (KR)

(72) Inventors: Hee Rim Song, Yongin-si (KR); Hee Jean Park, Yongin-si (KR); Cheol Gon Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/424,074

(22) Filed: Jan. 26, 2024

(65) Prior Publication Data

US 2024/0242670 A1 Jul. 18, 2024

Related U.S. Application Data

(63) Continuation of application No. 18/107,681, filed on Feb. 9, 2023, now Pat. No. 11,887,542.

(30) Foreign Application Priority Data

Apr. 29, 2022 (KR) .................. 10-2022-0053380

(51) Int. Cl.
*G09G 3/3233* (2016.01)
*G06V 40/13* (2022.01)
*H10K 59/126* (2023.01)
*H10K 59/131* (2023.01)
*H10K 59/60* (2023.01)

(52) U.S. Cl.
CPC ....... *G09G 3/3233* (2013.01); *G06V 40/1318* (2022.01); *H10K 59/126* (2023.02); *H10K 59/131* (2023.02); *H10K 59/60* (2023.02); *G09G 2360/14* (2013.01)

(58) Field of Classification Search
None
See application file for complete search history.

(56) References Cited

U.S. PATENT DOCUMENTS

| | | | |
|---|---|---|---|
| 10,714,554 B2 | 7/2020 | Choo et al. | |
| 2022/0012453 A1* | 1/2022 | Choi | H10K 59/1216 |
| 2023/0343290 A1* | 10/2023 | Lee | G06V 40/1318 |
| 2023/0351962 A1* | 11/2023 | Song | G06V 40/1318 |

FOREIGN PATENT DOCUMENTS

| | | |
|---|---|---|
| JP | 5073742 | 11/2012 |
| KR | 10-2019-0135585 | 12/2019 |
| KR | 10-2114344 | 5/2020 |
| KR | 10-2020-0115832 | 10/2020 |

* cited by examiner

Primary Examiner — Stephen T. Reed
(74) Attorney, Agent, or Firm — KILE PARK REED & HOUTTEMAN PLLC

(57) ABSTRACT

A display includes a light emitting element that emits light, a driving transistor that controls a driving current flowing through the light emitting element, a light sensing element spaced apart from the light emitting element and generating a photocurrent according to external light, a first sensing transistor that controls a sensing current flowing to a readout line according to a voltage of a gate electrode of the first sensing transistor, which is electrically connected to an electrode of the light sensing element, and a shielding electrode disposed around a side of the gate electrode of the first sensing transistor in plan view.

20 Claims, 28 Drawing Sheets

ACT1: D4, A4, S4, D5, A5, S5
GTL1: G4, G5
GTL2: BML2
ACT2: S2, A2, D2
GTL3: G2
DTL1: SHE, BE5, BE1
DTL2: VDL, ANDE, DLj

DISPLAY DEVICE

CROSS-REFERENCE TO RELATED APPLICATION(S)

This is a continuation application of U.S. patent application Ser. No. 18/107,681 filed Feb. 9, 2023, the disclosure of which is incorporated herein by reference in its entirety. U.S. patent application Ser. No. 18/107,681 claims priority to and benefits of Korean Patent Application No. 10-2022-0053380 under 35 U.S.C. § 119, filed on Apr. 29, 2022 in the Korean Intellectual Property Office, the entire contents of which are incorporated herein by reference.

BACKGROUND

1. Technical Field

Embodiments relate to a display device including a biometric sensor.

2. Description of the Related Art

Display devices have been applied to various electronic devices such as smartphones, tablets, notebook computers, monitors, and televisions. As the development of mobile communication technology is greatly increased, portable electronic devices such as smartphones, tablets, and notebook computers have been used in various fields. The portable electronic devices store privacy information. Therefore, biometric authentication by using fingerprint information of a user has been used to protect the privacy information of the portable electronic devices.

For example, a display device may authenticate a user's fingerprint by an optical method, an ultrasonic method, a capacitive method, or the like. The optical method may authenticate a user's fingerprint by sensing light reflected from the user's fingerprint. In order to authenticate a user's fingerprint by the optical method, the display device may include a display panel including pixels for displaying an image and light sensors for sensing light.

SUMMARY

Embodiments provide a display device capable of preventing or minimizing variation of a sensing current flowing through a transistor of a light sensor, which is caused by a voltage change of an adjacent signal line by minimizing parasitic capacitance between the transistor of the light sensor and the adjacent signal line.

Additional features of embodiments will be set forth in the description which follows, and in part may be apparent from the description, or may be learned by practice of an embodiment or embodiments herein.

According to an embodiment, a display may include a light emitting element that emits light, a driving transistor that controls a driving current flowing through the light emitting element, a light sensing element spaced apart from the light emitting element, the light sensing element that generates a photocurrent according to external light, a first sensing transistor that controls a sensing current flowing to a readout line according to a voltage of a gate electrode of the first sensing transistor, the gate electrode electrically connected to an electrode of the light sensing element, and a shielding electrode disposed around a side of the gate electrode of the first sensing transistor in plan view.

The shielding electrode may include a first shielding portion disposed around the side of the gate electrode of the first sensing transistor, and a second shielding portion disposed around another side of the gate electrode of the first sensing transistor.

The shielding electrode may further include a third shielding portion connected to the first shielding portion, a fourth shielding portion connected to the second shielding portion, and a fifth shielding portion connecting the third shielding portion and the fourth shielding portion.

The display device may further include a first transistor electrically connected to a first electrode of the driving transistor, and a first signal line that applies a voltage to the first transistor and extending in a direction. The first shielding portion may be disposed between the first signal line and the gate electrode of the first sensing transistor in plan view.

The display device may further include a second signal line spaced apart from the first signal line and extending in the direction. The second shielding portion may be disposed between the second signal line and the gate electrode of the first sensing transistor in plan view.

The display device may further include a second sensing transistor disposed on a substrate and electrically connected to the gate electrode of the first sensing transistor. The fifth shielding portion may overlap a channel layer of the second sensing transistor in a thickness direction of the substrate.

The channel layer of the second sensing transistor may include an oxide semiconductor, and a channel layer of the first sensing transistor may include a silicon semiconductor.

The first shielding portion, the second shielding portion, the third shielding portion, the fourth shielding portion, and the fifth shielding portion may surround at least three sides of the gate electrode of the first sensing transistor in plan view.

The display device may further include a driving voltage line to which a driving voltage is supplied. The shielding electrode may be electrically connected to the driving voltage line.

The display device may further include a first transistor that applies the driving voltage to a first electrode of the driving transistor according to an emission control signal of an emission control line. The shielding electrode may be electrically connected to a first electrode of the first transistor through a first contact hole.

The shielding electrode may include a first shielding portion extending in a direction, a second shielding portion extending in the direction and spaced apart from the first shielding portion, and a third shielding portion connecting the first shielding portion and the second shielding portion. The first shielding portion may be electrically connected to a second initialization voltage line to which a second initialization voltage is applied.

The display device may further include a first sensing connection electrode electrically connected to the gate electrode of the first sensing transistor through a first sensing contact hole. The first sensing connection electrode and the shielding electrode may be disposed on a same layer.

The display device may further include a second sensing transistor including a first electrode electrically connected to an electrode of the light sensing element and extending in a first direction, a first sub-reset voltage line electrically connected to the first electrode of the second sensing transistor, and a second sub-reset voltage line electrically connected to the first sub-reset voltage line and extending in a second direction perpendicular to the first direction. The second sub-reset voltage line may be disposed around the side of the gate electrode of the first sensing transistor.

The gate electrode of the first sensing transistor may be disposed between the second sub-reset voltage line and the readout line.

The display device may further include an initialization voltage line electrically connected to a first electrode of the first sensing transistor. The initialization voltage line may overlap the gate electrode of the first sensing transistor.

According to an embodiment, a display may include a substrate, a first signal line disposed on the substrate, a light sensing element disposed on the substrate, the light sensing element that generates a photocurrent according to external light, a first sensing transistor that controls a sensing current flowing to a readout line according to a voltage of a gate electrode of the first sensing transistor, the gate electrode electrically connected to an electrode of the light sensing element, and a first shielding portion disposed between the first signal line and the gate electrode of the first sensing transistor in plan view.

The display device may further include a second shielding portion electrically connected to the first shielding portion and overlapping the first signal line in a thickness direction of the substrate.

The display device may further include a second signal line extending in a first direction in which the first signal line extends, a first sub-reset voltage line electrically connected to a first electrode of a second sensing transistor and extending in a second direction perpendicular to the first direction, and a second sub-reset voltage line electrically connected to the first sub-reset voltage line and extending in the first direction. The second sub-reset voltage line may be disposed between the gate electrode of the first sensing transistor and the second signal line in plan view.

The first shielding portion may partially overlap the readout line.

The display device may further include a first organic layer disposed on the first shielding portion and the first sub-reset voltage line. The second sub-reset voltage line and the readout line may be disposed on the first organic layer.

According to an embodiment, a display may include a substrate, a light sensing element disposed on the substrate, the light sensing element that generates a photocurrent according to external light, a first sensing transistor that controls a sensing current flowing to a readout line according to a voltage of a gate electrode of the first sensing transistor, the gate electrode electrically connected to an electrode of the light sensing element, a first sensing connection electrode electrically connected to the gate electrode of the first sensing transistor through a first sensing contact hole, and a shielding electrode disposed around at least one side of the first sensing connection electrode.

The first sensing connection electrode and the shielding electrode may be disposed on a same layer.

The display device may further include a first organic layer disposed on the first sensing connection electrode and the shielding electrode, and a signal line disposed on the first organic layer.

The shielding electrode may have a first shielding portion disposed between the first sensing connection electrode and the signal line in plan view.

The display device may further include an anode connection electrode electrically connected to the first sensing connection electrode through a second sensing contact hole. The anode connection electrode may be electrically connected to a sensing anode of the light sensing element.

The display device may further include a signal line. The signal line and the anode connection electrode may be disposed on a same layer. The shielding electrode may have a first shielding portion disposed between the anode connection electrode and the signal line in plan view.

The gate electrode of the first sensing transistor, the first sensing connection electrode, and the anode connection electrode may overlap in a thickness direction of the substrate.

According to an embodiment, a display may include a first shielding portion extending in a first direction, a second shielding portion extending in the first direction and spaced apart from the first shielding portion, a third shielding portion connected to the first shielding portion, a fourth shielding portion connected to the second shielding portion, and a fifth shielding portion extending in a second direction intersecting the first direction and connecting the third shielding portion and the fourth shielding portion.

The display device may further include a light sensing element that generates a photocurrent according to external light, and a first sensing transistor that controls a sensing current flowing to a readout line according to a voltage of a gate electrode of the first sensing transistor, the gate electrode electrically connected to an electrode of the light sensing element.

A length of a shielding electrode comprising the first shielding portion and the third shielding portion in the first direction may be greater than a length of the gate electrode of the first sensing transistor in the first direction.

A length of the fifth shielding portion in the second direction may be greater than a length of the gate electrode of the first sensing transistor in the second direction.

The display device may further include a first signal line and a second signal line extending in the first direction. The first shielding portion may be disposed between the gate electrode of the first sensing transistor and the first signal line in plan view. The second shielding portion may be disposed between the gate electrode of the first sensing transistor and the second signal line in plan view.

The display device may further include a first signal line and a second signal line extending on a substrate in the first direction. The third shielding portion may overlap the first signal line in a thickness direction of the substrate. The fourth shielding portion may overlap the second signal line in the thickness direction of the substrate.

According to an embodiment, it is possible to prevent a sensing current flowing through a transistor of a light sensor from being changed according to a voltage change of an adjacent signal line by minimizing parasitic capacitance between the transistor of the light sensor and the signal line.

Other features and embodiments may be apparent from the following detailed description, the drawings, and the claims.

BRIEF DESCRIPTION OF THE DRAWINGS

The accompanying drawings, which are included to provide a further understanding of the disclosure, illustrate embodiments in which.

DETAILED DESCRIPTION OF THE EMBODIMENTS

Figure 1:
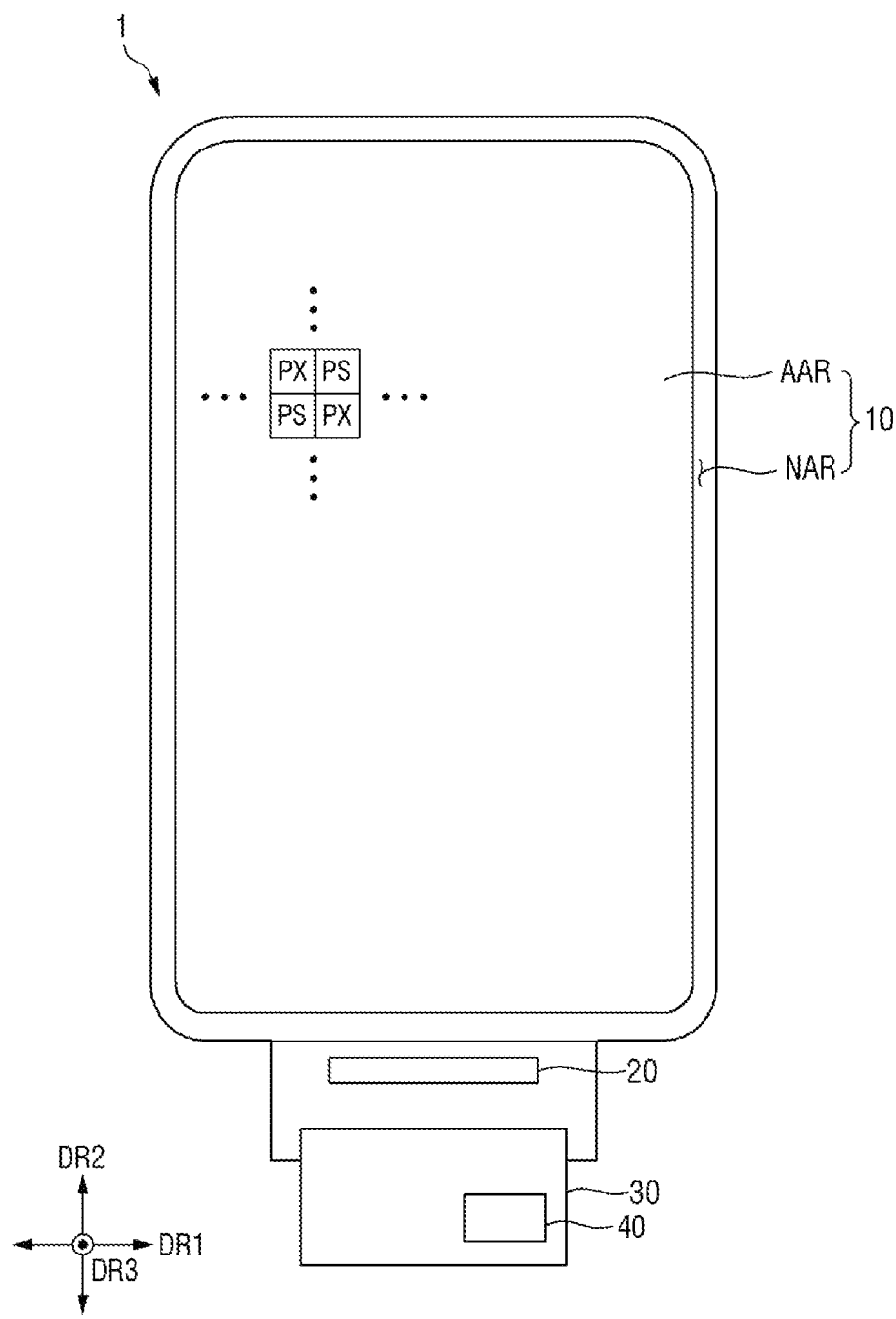
FIG. 1 is a schematic plan view of a display device according to an embodiment.

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts which are not associated with the description may not be provided in order to describe embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a schematic plan view of a display device 1 according to an embodiment.

In FIG. 1, a first direction DR1, a second direction DR2, and a third direction DR3 are shown. The first direction DR1 may be a direction parallel to a side of the display device 1 in plan view, for example, a horizontal direction of the display device 1. The second direction DR2 may be a direction parallel to another side in contact with the above side of the display device 1 in plan view, for example, a vertical direction of the display device 1. For case of description, a side in the first direction DR1 is referred to as a right direction in plan view, another side in the first direction DR1 is referred to as a left direction in plan view, a side in the second direction DR2 is referred to as an upward direction in plan view, and another side in the second direction DR2 is referred to as a downward direction in plan view. The third direction DR3 may be a thickness direction of the display device 1. However, directions mentioned in embodiments may be relative directions, and the embodiments are not limited to the mentioned directions.

Unless otherwise defined, the terms "upper" and "upper surface" used herein based on the third direction DR3 refer to a display surface side of a display panel 10, and the terms "lower," "lower surface" and "back surface" refer to an opposite side of the display panel 10 from the display surface side.

Referring to FIG. 1, examples of the display device 1 may include various electronic devices including a display screen. Examples of the display device 1 may include a mobile phone, a smartphone, a tablet personal computer (PC), a mobile communication terminal, an electronic notebook, an electronic book, a personal digital assistant (PDA), a portable multimedia player (PMP), a navigation device, an ultra-mobile PC (UMPC), a television, a game console, a wristwatch-type electronic device, a head mounted display, a monitor of a PC, a notebook computer, a car dashboard, a digital camera, a camcorder, an external billboard, an electronic board, various medical devices, various inspection devices, various home appliances including a display area such as a refrigerator and a washing machine, and an Internet of things (IoT) device. However, embodiments are not limited thereto. Representative examples of the display device 1 to be described later may include a smartphone, a tablet PC, and a notebook computer. However, embodiments are not limited thereto.

The display device 1 may include the display panel 10, a panel driving circuit 20, a circuit board 30, and a readout circuit 40.

The display device 1 may include the display panel 10 having an active area AAR and a non-active area NAR. The active area AAR may include a display area in which a screen is displayed. The active area AAR may completely overlap the display area. Pixels PX displaying an image may be disposed in the display area. Each pixel PX may include a light emitting element EL (see FIG. 6).

For example, the active area AAR further may include a fingerprint sensing area. The fingerprint sensing area may be an area that reacts to light and an area configured to sense the amount or wavelength of incident light. The fingerprint sensing area may overlap the display area. For example, the fingerprint sensing area may be disposed only in a limited area necessary for fingerprint recognition (or fingerprint detection) within the active area AAR. For example, the fingerprint sensing area may overlap a part of the display area but may not overlap the other part of the display area. In another example, the fingerprint sensing area may be defined as an area exactly the same as the active area AAR. For example, the entire active area AAR may be utilized as an area for fingerprint sensing. Light sensors (or photo sensors) PS that react to light may be disposed in the fingerprint sensing area. Each of the light sensors PS may include a light sensing element PD (see FIG. 6) that senses incident light and converts the incident light into an electrical signal.

The non-active area NAR may be disposed around the active area AAR. The non-active area NAR may be a bezel area. The non-active area NAR may surround all sides (e.g., four sides in the drawing) of the active area AAR, but embodiments are not limited thereto.

The non-active area NAR may be disposed around the active area AAR. The panel driving circuit 20 may be disposed in the non-active area NAR. The panel driving circuit 20 may drive the pixels PX and/or the light sensors PS. The panel driving circuit 20 may output signals and voltages for driving the display panel 10. The panel driving circuit 20 may be formed as an integrated circuit and mounted on the display panel 10. In the non-active area NAR, signal lines for transmitting signals between the panel driving circuit 20 and the active area AAR may be further disposed. In another example, the panel driving circuit 20 may be mounted on the circuit board 30.

For example, signal lines or the readout circuit 40 for transmitting signals to the active area AAR may be disposed in the non-active area NAR. The readout circuit 40 may be connected to each light sensor PS through a signal line and may receive a current flowing through each light sensor PS to sense a user's fingerprint input. The readout circuit 40 may be formed as an integrated circuit and attached onto a display circuit board by using a chip on film (COF) method. However, embodiments are not limited thereto, and the readout circuit 40 may be attached onto the non-active area NAR of the display panel 10 by using a chip on glass (COG) method, a chip on plastic (COP) method, or an ultrasonic bonding method.

The circuit board 30 may be attached to an end of the display panel 10 by using an anisotropic conductive film (ACF). Lead lines of the circuit board 30 may be electrically connected to a pad portion of the display panel 10. The circuit board 30 may be a flexible film such as a flexible printed circuit board or a chip on film.

Figure 2:
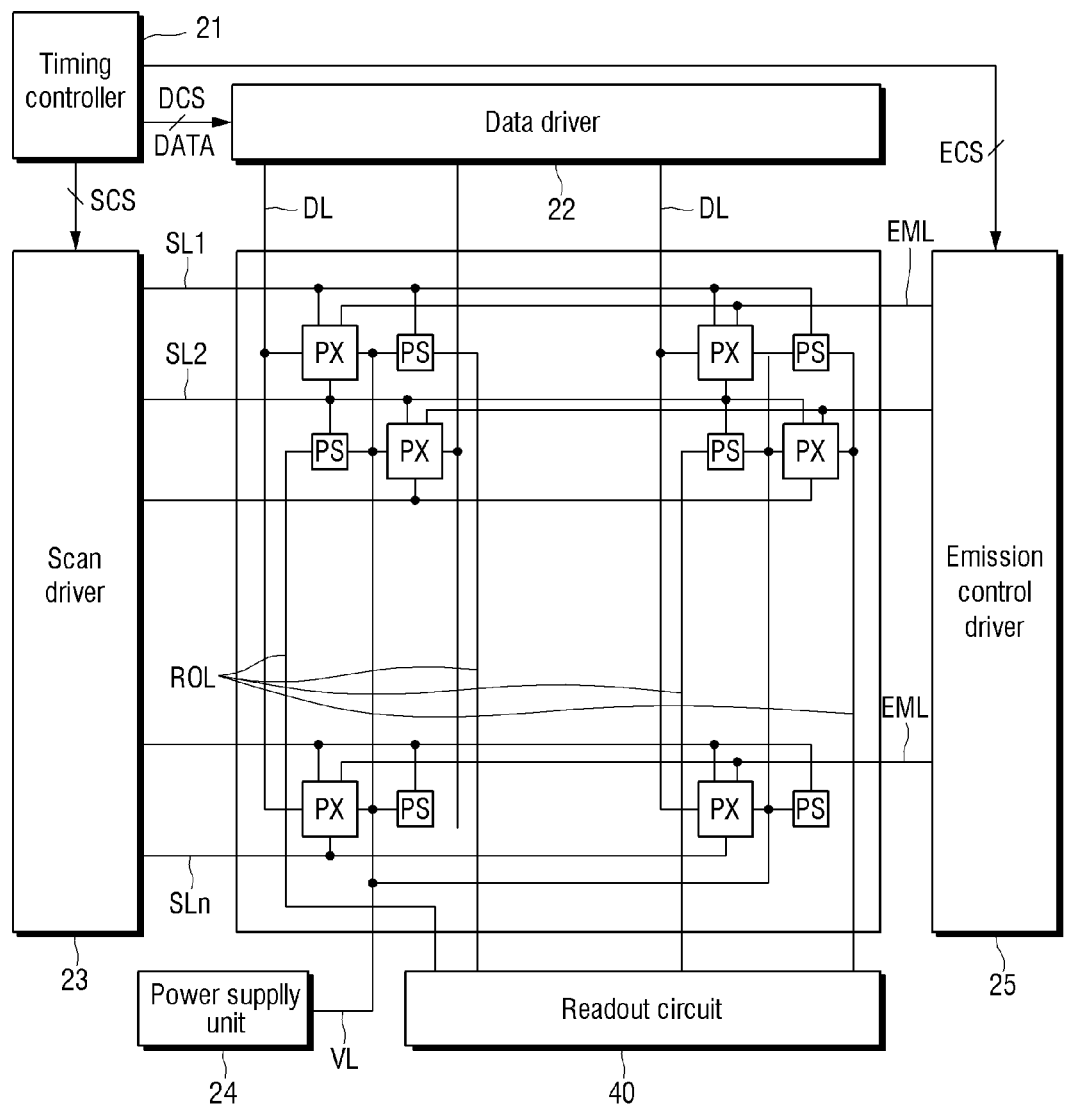
FIG. 2 is a schematic block diagram of the display device of FIG. 1.

FIG. 2 is a block diagram of the display device 1 of FIG. 1.

Referring to FIG. 2, the pixels PX and the light sensors PS disposed in the active area AAR of the display panel 10 may be driven by the panel driving circuit 20.

The panel driving circuit 20 may include a data driver 22 for driving the pixels PX of the display panel 10, a scan driver 23 for driving the pixels PX and the light sensors PS, and a timing controller 21 for controlling driving timings of the data driver 22 and the scan driver 23. For example, the panel driving circuit 20 may further include a power supply unit 24 and an emission control driver 25.

The timing controller 21 may receive an image signal supplied from outside the display device 1. The timing controller 21 may output image data DATA and a data control signal DCS to the data driver 22. For example, the timing controller 21 may generate a scan control signal SCS for controlling the operation timing of the scan driver 23 and an emission control driving signal ECS for controlling the operation timing of the emission control driver 25. For example, the timing controller 21 may generate the scan control signal SCS and the emission control driving signal ECS and may output the scan control signal SCS to the scan driver 23 through a scan control line and output the emission control driving signal ECS to the emission control driver 25 through an emission control driving line.

The data driver 22 may convert the image data DATA into analog data voltages and output the analog data voltages to data lines DL. The scan driver 23 may generate scan signals according to the scan control signal SCS and sequentially output the scan signals to scan lines SL1 through SLn.

The power supply unit 24 may generate a driving voltage ELVDD (see FIG. 6) and supply the driving voltage ELVDD to a power supply voltage line VL and may generate a common voltage ELVSS (see FIG. 6) and supply the common voltage ELVSS to the power supply voltage line VL. The power supply voltage line VL may include a driving voltage line and a common voltage line. The driving voltage ELVDD may be a high potential voltage for driving light emitting elements and light sensing elements, and the common voltage ELVSS may be a low potential voltage for driving the light emitting elements and the light sensing elements. For example, the driving voltage ELVDD may have a higher potential than the common voltage ELVSS.

The emission control driver 25 may generate emission control signals according to the emission control driving signal ECS and sequentially output the emission control signals to emission control lines EML. The emission control signals of the emission control driver 25 may have pulses of a first-level voltage VGL supplied from a first-level voltage line or pulses of a second-level voltage VGH supplied from a second-level voltage line. Although the emission control driver 25 is illustrated as being separate from the scan driver 23, embodiments are not limited thereto, and the emission control driver 25 may be included in the scan driver 23.

The readout circuit 40 may be connected to each light sensor PS through a readout line ROL and may receive a current flowing through each light sensor PS to sense a user's fingerprint input. The readout circuit 40 may generate fingerprint sensing data according to the magnitude of a current sensed by each light sensor PS and transmit the fingerprint sensing data to a processor. The processor may analyze the fingerprint sensing data and determine whether the fingerprint sensing data matches a user's fingerprint by comparing the fingerprint sensing data with a preset fingerprint. In case that the preset fingerprint and the fingerprint sensing data transmitted from the readout circuit 40 are the same, preset functions may be performed.

The display panel 10 may further include pixels PX, light sensors PS, scan lines SL1 through SLn connected to the pixels PX and the light sensors PS, data lines DL and emission control lines EML connected to the pixels PX, and readout lines ROL connected to the light sensors PS.

Each of the pixels PX may be connected to at least any one of the scan lines SL1 through SLn, any one of the data lines DL, at least one of the emission control lines EML, and the power supply voltage line VL.

Each of the light sensors PS may be connected to any one of the scan lines SL1 through SLn, any one of the readout lines ROL, and the power supply voltage line VL.

The scan lines SL1 through SLn may connect the scan driver 23 to the pixels PX and the light sensors PS. The scan lines SL1 through SLn may provide scan signals output from the scan driver 23 to the pixels PX and the light sensors PS.

The data lines DL may connect the data driver 22 to the pixels PX. The data lines DL may provide image data output from the data driver 22 to the pixels PX.

The emission control lines EML may connect the emission control driver 25 to the pixels PX. The emission control lines EML may provide emission control signals output from the emission control driver 25 to the pixels PX.

The readout lines ROL may connect the light sensors PS to the readout circuit 40. The readout lines ROL may provide a sensing current generated according to a photocurrent output from each of the light sensors PS to the readout circuit 40. Accordingly, the readout circuit 40 may sense a user's fingerprint.

Power supply voltage lines VL may connect the power supply unit 24 to the pixels PX and the light sensors PS. The power supply voltage lines VL may provide the driving voltage ELVDD or the common voltage ELVSS received from the power supply unit 24 to the pixels PX and the light sensors PS.

Figure 3:
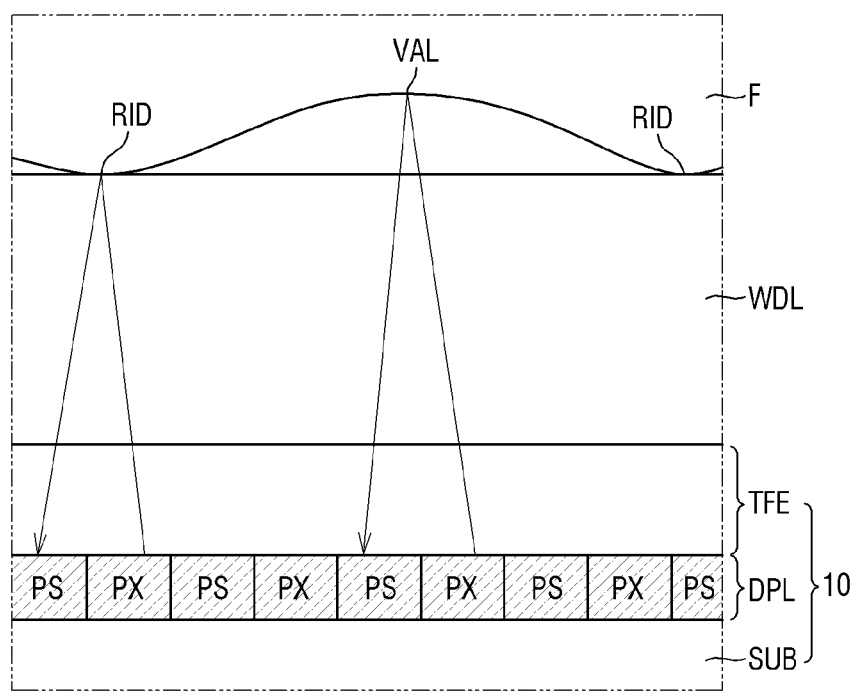
FIG. 3 is a schematic diagram illustrating fingerprint sensing of the display device according to an embodiment.

FIG. 3 is a schematic diagram illustrating fingerprint sensing of the display device 1 according to an embodiment.

Referring to FIG. 3, the display device 1 may further include a window WDL disposed on the display panel 10. The display panel 10 may include a substrate SUB, a display layer DPL disposed on the substrate SUB and including the pixels PX and the light sensors PS, and an encapsulation layer TFE disposed on the display layer DPL.

In case that a user's finger touches an upper surface of the window WDL of the display device 1, light output from the pixels PX of the display panel 10 may be reflected by ridges RID and valleys VAL between the ridges RID of the user's fingerprint F. For example, the ridges RID of the fingerprint F contact the upper surface of the window WDL, but the valleys VAL of the fingerprint F may not contact the window WDL. For example, the upper surface of the window WDL may contact air in the valleys VAL.

In case that the fingerprint F contacts the upper surface of the window WDL, light output from light emitting portions of the pixels PX may be reflected by the ridges RID and the valleys VAL of the fingerprint F. Here, since a refractive index of the fingerprint F and a refractive index of air are different, the amount of light reflected from the ridges RID of the fingerprint F and the amount of light reflected from the valleys VAL may be different. Accordingly, the ridges RID and the valleys VAL of the fingerprint F may be distinguished based on a difference in the amount of reflected light, e.g., the amount of light incident on the light sensors PS. Since the light sensors PS output electrical signals (i.e., photocurrents) according to the difference in the amount of light, a fingerprint pattern of the finger may be identified.

Figure 4:
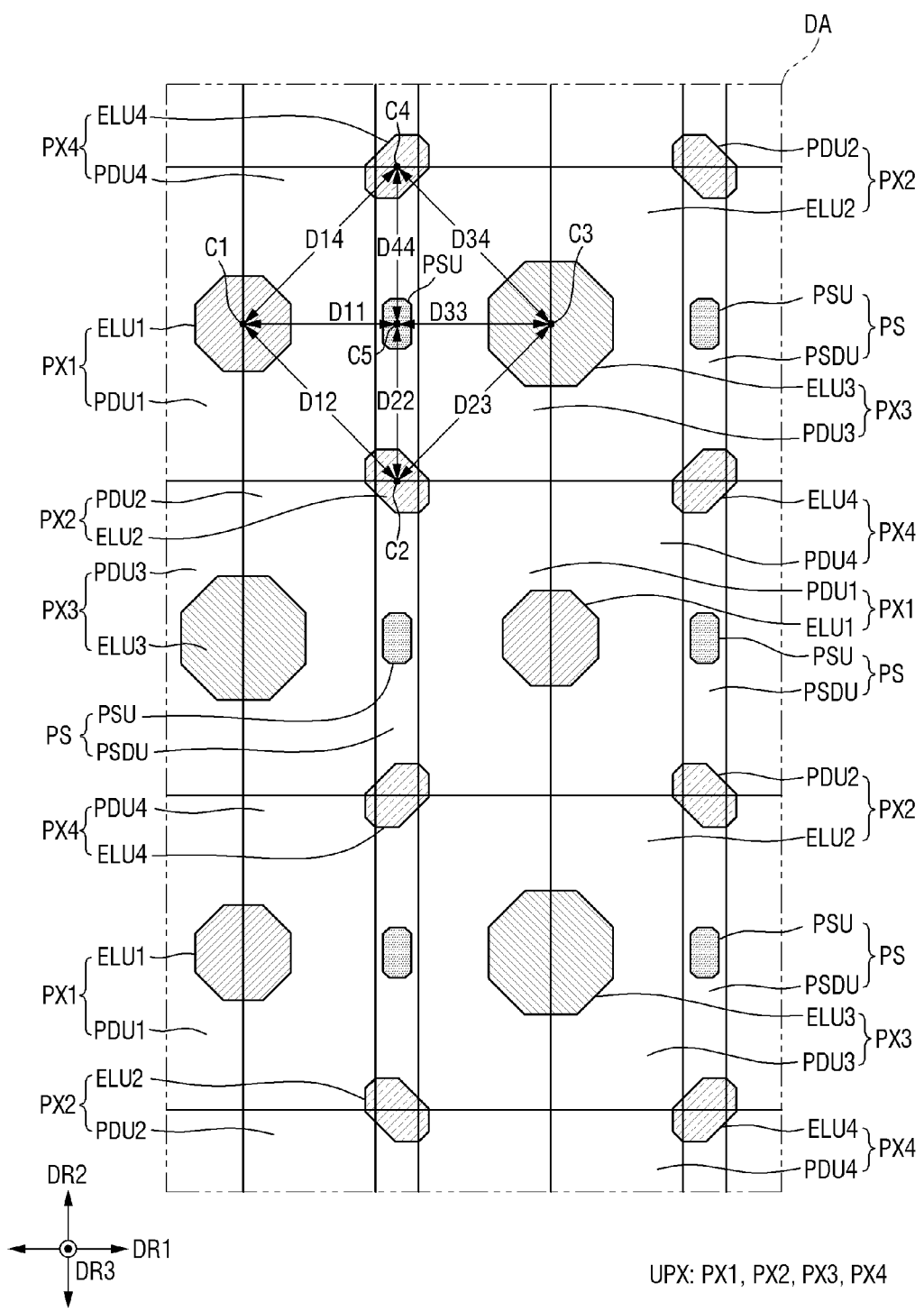
FIG. 4 is a schematic layout view illustrating pixels and light sensors in a display area of a display panel according to an embodiment.

FIG. 4 is a schematic layout view illustrating pixels PX and light sensors PS in a display area DA of a display panel 10 according to an embodiment.

Referring to FIG. 4, the display area DA may include first pixels PX1, second pixels PX2, third pixels PX3, and fourth pixels PX4. The pixels PX may be divided into the first pixels PX1, the second pixels PX2, the third pixels PX3, and the fourth pixels PX4.

Each unit pixel UPX may include a first pixel PX1, a second pixel PX2, a third pixel PX3, and a fourth pixel PX4. The first pixel PX1, the second pixel PX2, the third pixel PX3, and the fourth pixel PX4 may be defined as a unit pixel UPX. The unit pixel UPX may be defined as the smallest unit of pixels that displays white light.

The first pixel PX1 may include a first light emitting portion ELU1 emitting first light and a first pixel driver PDU1 for supplying a driving current to a light emitting element of the first light emitting portion ELU1. The first light may be light of a red wavelength band. For example, a main peak wavelength of the first light may be located at about 600 nm to about 750 nm.

The second pixel PX2 may include a second light emitting portion ELU2 emitting second light and a second pixel driver PDU2 for supplying a driving current to a light emitting element of the second light emitting portion ELU2. The second light may be light of a green wavelength band. For example, a main peak wavelength of the second light may be located at about 480 nm to about 560 nm.

The third pixel PX3 may include a third light emitting portion ELU3 emitting third light and a third pixel driver PDU3 for supplying a driving current to a light emitting element of the third light emitting portion ELU3. The third light may be light of a blue wavelength band. For example, a main peak wavelength of the third light may be located at about 370 nm to about 460 nm.

The fourth pixel PX4 may include a fourth light emitting portion ELU4 emitting the second light and a fourth pixel driver PDU4 for supplying a driving current to a light emitting element of the fourth light emitting portion ELU4.

The first pixel driver PDU1, the second pixel driver PDU2, the third pixel driver PDU3, and the fourth pixel driver PUD4 may be disposed along the first direction DR1 or the second direction DR2. For example, the first pixel driver PDU1 and the fourth pixel driver PDU4 may be adjacent to each other along the first direction DR1, and the second pixel driver PDU2 and the third pixel driver PDU3 may be adjacent to each other along the first direction DR1. The first pixel driver PDU1 and the third pixel driver PDU3 may be alternately disposed along the second direction DR2, and the second pixel driver PDU2 and the fourth pixel driver PDU4 may be alternately disposed along the second direction DR2.

Each of the first light emitting portion ELU1, the second light emitting portion ELU2, the third light emitting portion ELU3, and the fourth light emitting portion ELU4 may overlap at least two pixel drivers. For example, the first light emitting portion ELU1 may overlap the first pixel driver PDU1 and the fourth pixel driver PDU4, and the third light emitting portion ELU3 may overlap the second pixel driver PDU2 and the third pixel driver PDU3. Each of the second light emitting portion ELU2 and the fourth light emitting portion ELU4 may overlap the first through fourth pixel drivers PDU1 through PDU4 and two sensing drivers PSDU.

The first light emitting portion ELU1, the second light emitting portion ELU2, the third light emitting portion ELU3, and the fourth light emitting portion ELU4 may have an octagonal planar shape. However, embodiments are not limited thereto. The first light emitting portion ELU1, the second light emitting portion ELU2, the third light emitting portion ELU3, and the fourth light emitting portion ELU4 may have a quadrilateral planar shape such as a rhombus or a polygonal planar shape other than a quadrilateral and an octagon.

Each of the light sensors PS may include a light sensing portion PSU and a sensing driver PSDU. The light sensing portion PSU may be disposed between the first light emitting portion ELU1 and the third light emitting portion ELU3 adjacent to each other in the first direction DR1 and may be disposed between the second light emitting portion ELU2 and the fourth light emitting portion ELU4 adjacent to each other in the second direction DR2. The light sensing portion PSU may overlap the sensing driver PSDU.

Each of the light sensing portions PSU may have an octagonal planar shape. However, embodiments are not limited thereto. Each of the light sensing portions PSU may have a quadrilateral planar shape such as a rhombus or a polygonal planar shape other than a quadrilateral and an octagon.

Due to the placement positions and planar shapes of the first light emitting portion ELU1, the second light emitting portion ELU2, the third light emitting portion ELU3, and the fourth light emitting portion ELU4, a distance D12 between a center C1 of the first light emitting portion ELU1 and a center C2 of the second light emitting portion ELU2 adjacent to each other, a distance D23 between the center C2 of the second light emitting portion ELU2 and a center C3 of the third light emitting portion ELU3 adjacent to each other, a distance D14 between the center C1 of the first light emitting portion ELU1 and a center C4 of the fourth light emitting portion ELU4 adjacent to each other, and a distance D34 between the center C3 of the third light emitting portion ELU3 and the center C4 of the fourth light emitting portion ELU4 adjacent to each other may be substantially the same.

For example, due to the placement positions and planar shapes of the first light emitting portion ELU1, the second light emitting portion ELU2, the third light emitting portion ELU3, the fourth light emitting portion ELU4, and the light sensing portion PSU, a distance D11 between the center C1 of the first light emitting portion ELU1 and a center C5 of the light sensing portion PSU adjacent to each other, a distance D22 between the center C2 of the second light emitting portion ELU2 and the center C5 of the light sensing portion PSU adjacent to each other, a distance D33 between the center C3 of the third light emitting portion ELU3 and the center C5 of the light sensing portion PSU adjacent to each other, and a distance D44 between the center C4 of the fourth light emitting portion ELU4 and the center C5 of the light sensing portion PSU adjacent to each other may be substantially the same.

Figure 5:
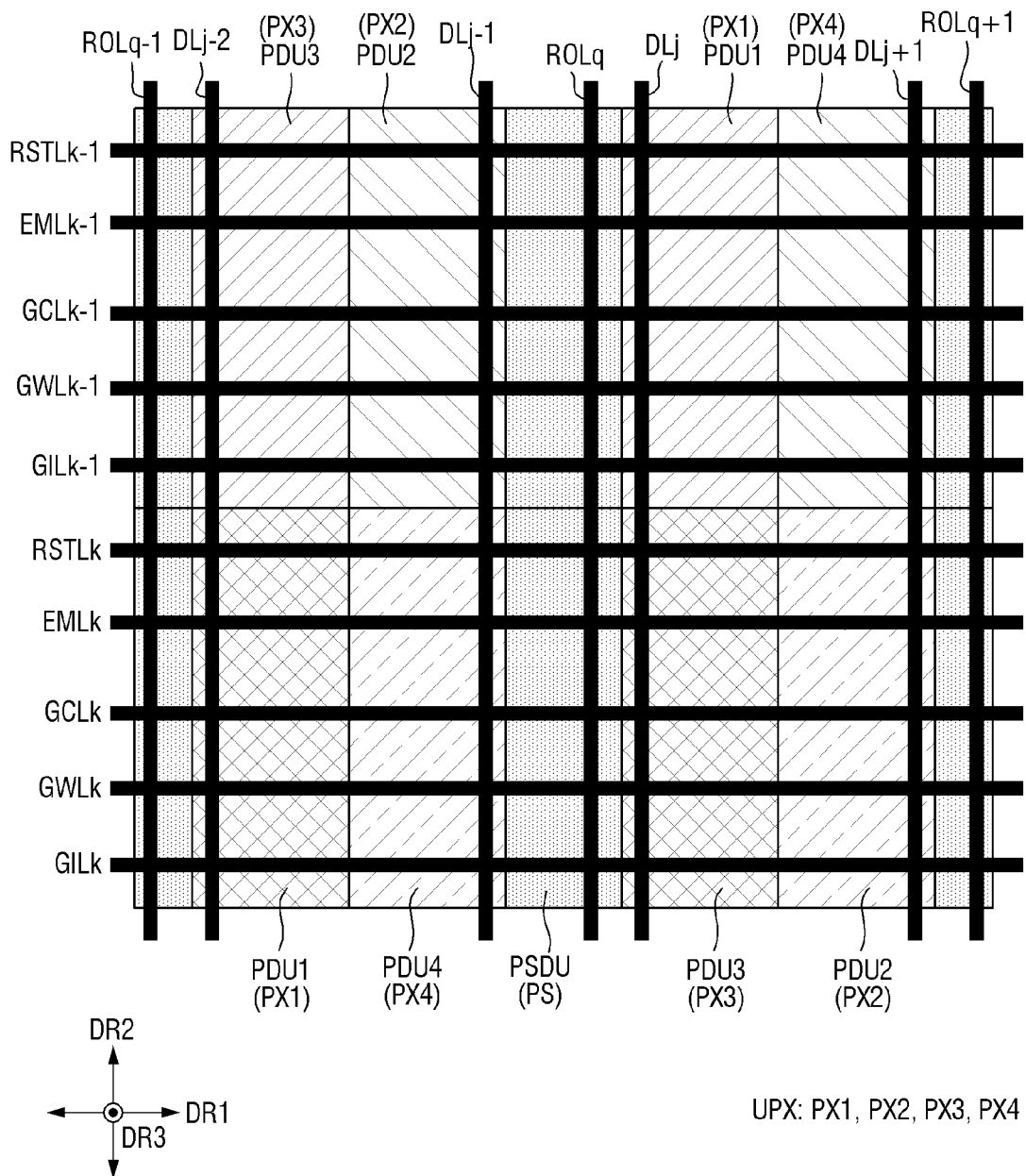
FIG. 5 illustrates pixel drivers, sensing drivers, scan write lines, scan initialization lines, scan control lines, emission control lines, reset control lines, data lines, and readout lines according to an embodiment.

FIG. 5 illustrates pixel drivers PDU, sensing drivers PSDU, scan write lines GWLk−1 and GWLk, scan initialization lines GILk−1 and GILk, scan control lines GCLk−1 and GCLk, emission control lines EMLk−1 and EMLk, reset control lines RSTLk−1 and RSTLk, data lines DLj−2 through DLj+1, and readout lines ROLq−1 through ROLq+1 according to an embodiment.

Referring to FIG. 5, a sensing driver PSDU may be disposed for every two pixel drivers among the first through fourth pixel drivers PDU1 through and PDU4. For example, a sensing driver PSDU may be disposed between the first pixel driver PDU1 and the second pixel driver PDU2. For example, the third pixel driver PDU3, the second pixel driver PDU2, the sensing driver PSDU, the first pixel driver PDU1, and the fourth pixel driver PDU4 may be sequentially disposed along the first direction DR1. For example, the sensing driver PSDU may be disposed on a side of the first pixel driver PDU1, and the fourth pixel driver PDU4 may be disposed on another side of the first pixel driver PDU1.

In another example, a sensing driver PSDU may be disposed between the third pixel driver PDU3 and the fourth pixel driver PDU4. For example, the first pixel driver PDU1, the fourth pixel driver PDU4, the sensing driver PSDU, the third pixel driver PDU3, and the second pixel driver PDU2 may be sequentially disposed along the first direction DR1. For example, the sensing driver PSDU may be disposed on a side of the third pixel driver PDU3, and the second pixel driver PDU2 may be disposed on another side of the third pixel driver PDU3.

The sensing drivers PSDU may be disposed in the second direction DR2. The first pixel drivers PDU1 and the third pixel drivers PDU3 may be alternately disposed in the second direction DR2. The second pixel drivers PDU2 and the fourth pixel drivers PDU4 may be alternately disposed in the second direction DR2.

The scan write lines GWLk−1 and GWLk, the scan initialization lines GILk−1 and GILk, the scan control lines GCLk−1 and GCLk, the emission control lines EMLk−1 and EMLk, and the reset control lines RSTLk−1 and RSTLk may extend along the first direction DR1. The data lines DLj−2 through DLj+1 and the readout lines ROLq−1 through ROLq+1 may extend along the second direction DR2.

Each of the sensing drivers PSDU may overlap any one of the scan write lines GWLk−1 and GWLk, any one of the scan initialization lines GILk−1 and GILk, any one of the scan control lines GCLk−1 and GCLk, any one of the emission control lines EMLk−1 and EMLk, any one of the reset control lines RSTLk−1 and RSTLk, and any one of the readout lines ROLq−1 through ROLq+1. Each of the first through fourth pixel drivers PDU1 through PDU4 may overlap any one of the scan write lines GWLk−1 and GWLk, any one of the scan initialization lines GILk−1 and GILk, any one of the scan control lines GCLk−1 and GCLk, any one of the emission control lines EMLk−1 and EMLk, any one of the reset control lines RSTLk−1 and RSTLk, and any one of the data lines DLj−2 through DLj+1.

However, the arrangement relationship of the pixel drivers PDU and the sensing drivers PSDU is not limited to the embodiment of FIG. 5. For example, the sensing drivers PSDU may be disposed to correspond one-to-one to the first through fourth pixel drivers PDU1 through PDU4. One sensing driver PSDU may be disposed on a side of each of the first through fourth pixel drivers PDU1 through PDU4.

Figure 6:
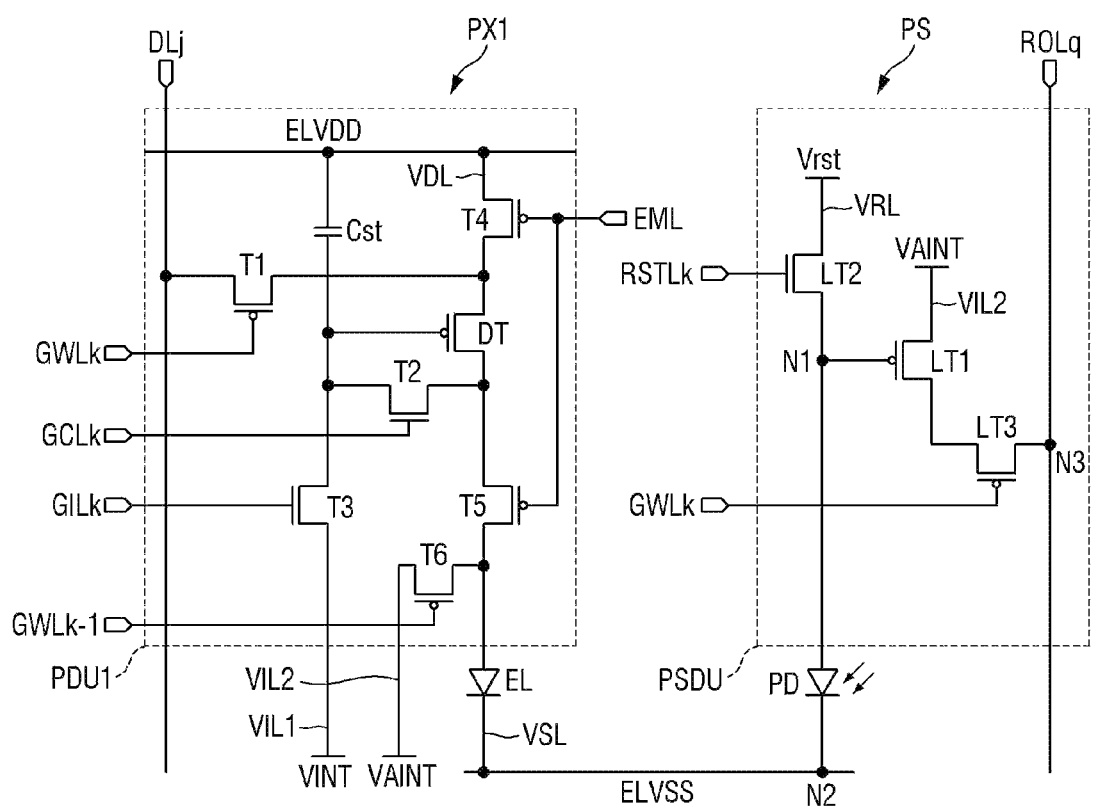
FIG. 6 is a schematic diagram of an equivalent circuit of a pixel and a light sensor according to an embodiment.

FIG. 6 is a schematic diagram of an equivalent circuit of a pixel PX and a light sensor PS according to an embodiment.

For case of description, FIG. 6 illustrates a schematic diagram of an equivalent circuit of a first pixel PX1 connected to a $k^{th}$ scan initialization line GILk, a $k^{th}$ scan write line GWLk, a $k^{th}$ scan control line GCLk, a $(k-1)^{th}$ scan write line GWLk−1 and a $j^{th}$ data line DLj and a light sensor PS connected to the $k^{th}$ scan write line GWLk, a $k^{th}$ reset control line RSTLk and a $q^{th}$ readout line ROLq.

The first pixel PX1 may include a light emitting element EL and a first pixel driver PDU1 controlling the amount of light emitted from the light emitting element EL. The light emitting element EL may include a first light emitting portion ELU1. The first pixel driver PDU1 may include a driving transistor DT, switch elements, and a first capacitor Cst. The switch elements include first through sixth transistors T1 through T6.

The driving transistor DT may include a gate electrode, a first electrode, and a second electrode. The driving transistor DT controls a drain-source current Isd (hereinafter, referred to as a "driving current") flowing between the first electrode and the second electrode according to a data voltage applied to the gate electrode. The driving current Isd flowing through a channel layer of the driving transistor DT may be proportional to the square of a difference between a voltage Vsg between the first electrode and the gate electrode of the driving transistor DT and a threshold voltage as shown in Equation 1.

$$Isd = k' \times (Vsg - Vth)^2 \qquad \text{Equation 1}$$

Where Isd is a driving current and a source-drain current flowing through the channel layer of the driving transistor DT, k' is a proportional coefficient determined by the structure and physical characteristics of the driving transistor DT, Vsg is a voltage between the first electrode and the gate electrode of the driving transistor DT, and Vth is a threshold voltage of the driving transistor DT.

The light emitting element EL emits light according to the driving current Isd. As the driving current Isd increases, the amount of light emitted from the light emitting element EL may increase.

Figure 12:
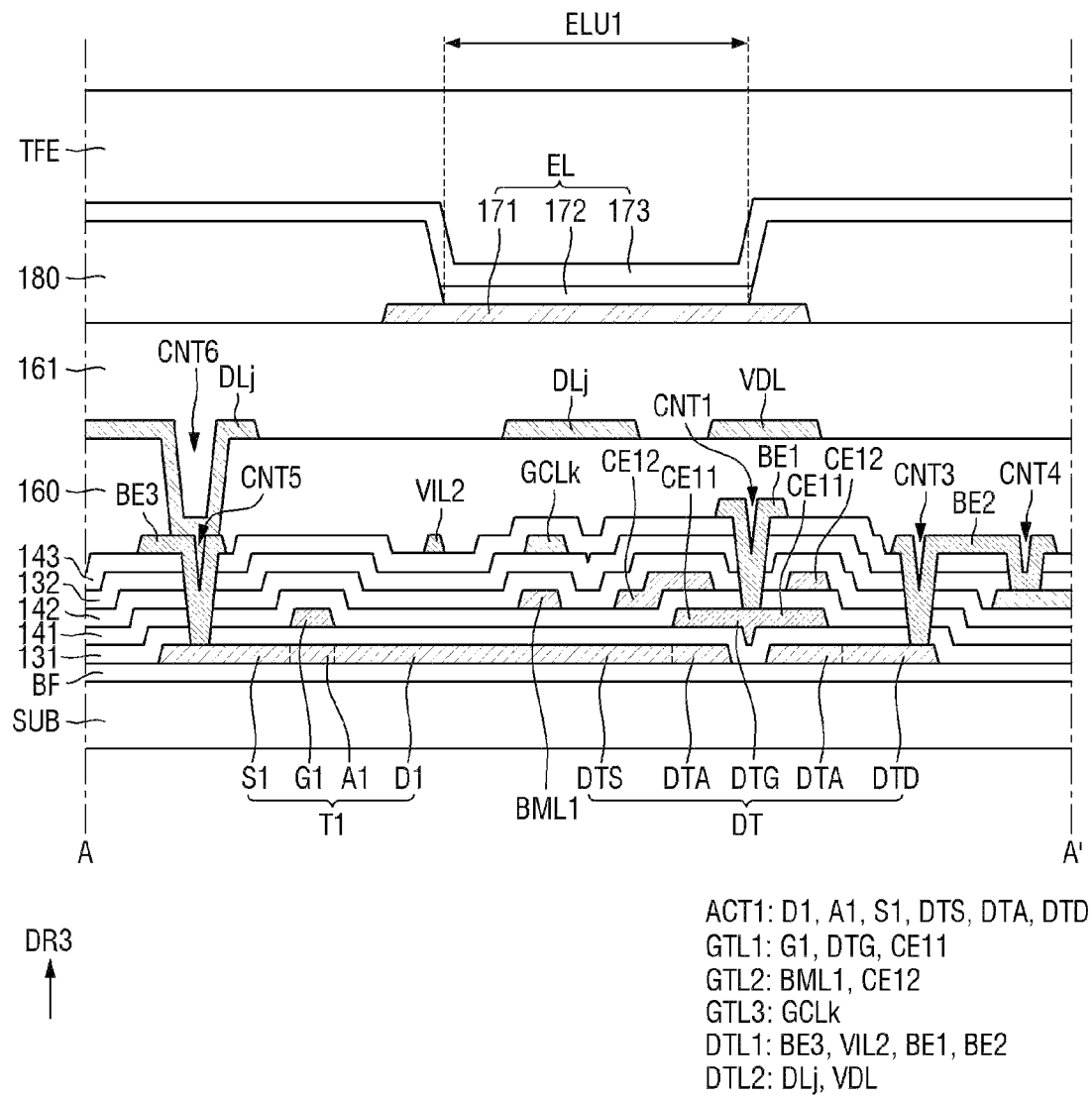
FIG. 12 is an example of a schematic cross-sectional view taken along line A-A' of FIGS. 8 and 9.

The light emitting element EL may be an organic light emitting diode including an organic light emitting layer disposed between an anode and a cathode. In another example, the light emitting element EL may be a quantum dot light emitting element including a quantum dot light emitting layer disposed between an anode and a cathode. In another example, the light emitting element EL may be an inorganic light emitting element including an inorganic semiconductor disposed between an anode and a cathode. In case that the light emitting element EL is an inorganic light emitting element, the light emitting element EL may include a micro light emitting diode or a nano light emitting diode. In FIG. 12, the anode of the light emitting element EL corresponds to a pixel electrode 171, and the cathode corresponds to a common electrode 173.

The anode of the light emitting element EL may be connected to a second electrode of the fifth transistor T5 and a first electrode of the sixth transistor T6, and the cathode of the light emitting element EL may be connected to a common voltage line VSL to which the common voltage ELVSS is applied.

The first transistor T1 may be turned on by a $k^{th}$ scan write signal of the $k^{th}$ scan write line GWLk to connect (e.g., electrically connect) the first electrode of the driving transistor DT to the $j^{th}$ data line DLj. Accordingly, a data voltage of the $j^{th}$ data line DLj may be applied to the first electrode of the driving transistor DT. The first transistor T1 may have a gate electrode connected to the $k^{th}$ scan write line GWLk, a first electrode connected to the $j^{th}$ data line DLj, and a second electrode connected to the first electrode of the driving transistor DT.

The second transistor T2 may be turned on by a $k^{th}$ scan control signal of the $k^{th}$ scan control line GCLk to connect (e.g., electrically connect) the gate electrode and the second electrode of the driving transistor DT. In case that the gate electrode and the second electrode of the driving transistor DT are connected, the driving transistor DT may be driven as a diode. The second transistor T2 may have a gate electrode connected to the $k^{th}$ scan control line GCLk, a first electrode connected to the gate electrode of the driving transistor DT, and a second electrode connected to the second electrode of the driving transistor DT.

The third transistor T3 may be turned on by a $k^{th}$ scan initialization signal of the $k^{th}$ scan initialization line GILk to connect (e.g., electrically connect) the gate electrode of the driving transistor DT to a first initialization voltage line VIL1. Accordingly, a first initialization voltage of the first initialization voltage line VIL1 may be applied to the gate electrode of the driving transistor DT. The third transistor T3 may have a gate electrode connected to the $k^{th}$ scan initialization line GILk, a first electrode connected to the first initialization voltage line VIL1, and a second electrode connected to the gate electrode of the driving transistor DT.

The fourth transistor T4 may be turned on by a $k^{th}$ emission control signal of a $k^{th}$ emission control line EMLk to connect (e.g., electrically connect) the first electrode of the driving transistor DT to a driving voltage line VDL to which the driving voltage ELVDD is applied. The fourth transistor T4 may have a gate electrode connected to the $k^{th}$ emission control line EMLk, a first electrode connected to the driving voltage line VDL, and a second electrode connected to the first electrode of the driving transistor DT.

The fifth transistor T5 may be turned on by the $k^{th}$ emission control signal of the $k^{th}$ emission control line EMLk to connect (e.g., electrically connect) the second electrode of the driving transistor DT to the anode of the light emitting element EL. The fifth transistor T5 may have a gate electrode connected to the $k^{th}$ emission control line EMLk, a first electrode connected to the second electrode of the driving transistor DT, and a second electrode connected to the anode of the light emitting element EL.

In case that both the fourth transistor T4 and the fifth transistor T5 are turned on, the driving current Isd of the driving transistor DT according to the voltage of the gate electrode of the driving transistor DT may flow to the light emitting element EL.

The sixth transistor T6 may be turned on by a $(k-1)^{th}$ scan write signal of the $(k-1)^{th}$ scan write line GWLk-1 to connect (e.g., electrically connect) the anode of the light emitting element EL to a second initialization voltage line VIL2. A second initialization voltage VAINT of the second initialization voltage line VIL2 may be applied to the anode of the light emitting element EL. The sixth transistor T6 may have a gate electrode connected to the $(k-1)^{th}$ scan write line GWLk-1, the first electrode connected to the anode of the light emitting element EL, and a second electrode connected to the second initialization voltage line VIL2.

The first capacitor Cst may be formed between the gate electrode of the driving transistor DT and the driving voltage line VDL. A first capacitor electrode of the first capacitor Cst may be connected to the gate electrode of the driving transistor DT, and a second capacitor electrode of the first capacitor Cst may be connected to the driving voltage line VDL.

In case that the first electrode of each of the driving transistor DT and the first through sixth transistors T1 through T6 is a source electrode, the second electrode may be a drain electrode. In another example, in case that the first electrode of each of the driving transistor DT and the first through sixth transistors T1 through T6 is a drain electrode, the second electrode may be a source electrode.

An active layer of each of the driving transistor DT and the first through sixth transistors T1 through T6 may be made of any one of polysilicon, amorphous silicon, and an oxide semiconductor. For example, the active layer of each of the driving transistor DT, the first transistor T1, and the fourth through sixth transistors T4 through T6 may be made of polysilicon. The active layer of each of the second transistor T2 and the third transistor T3 may be made of an oxide semiconductor. For example, the driving transistor DT, the first transistor T1, and the fourth through sixth transistors T4 through T6 may be formed as P-type metal oxide semiconductor field effect transistors (MOSFETs), and the second transistor T2 and the third transistor T3 may be formed as N-type MOSFETs.

Each light sensor PS may include a light sensing element PD and a sensing driver PSDU for controlling a sensing current according to a photocurrent of the light sensing element PD. The sensing driver PSDU may include sensing transistors and various signal lines for controlling a sensing current generated by the light sensing element PD. The sensing transistors may include first through third sensing transistors LT1 through LT3.

Figure 15:
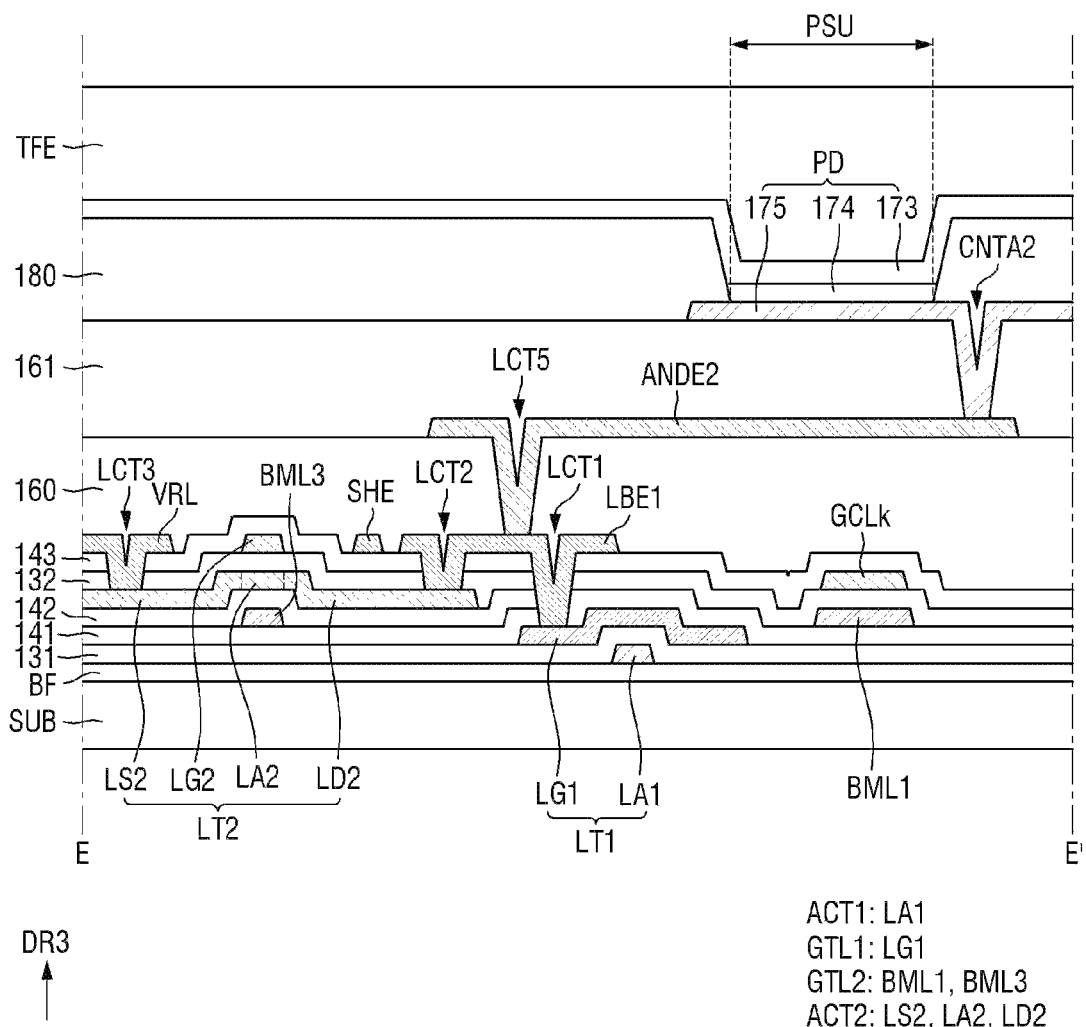
FIG. 15 is an example of a schematic cross-sectional view taken along line E-E' of FIGS. 8 and 9.

Each light sensing element PD may be a photodiode including a sensing anode, a sensing cathode, and a photoelectric conversion layer disposed between the sensing anode and the sensing cathode. Each light sensing element PD may convert light incident from the outside into an electrical signal. The light sensing element PD may be an inorganic photodiode or phototransistor made of an inorganic material of a pn type or a pin type. In another example, the light sensing element PD may be an organic photodiode including an electron donor material that generates donor ions and an electron acceptor material that generates acceptor ions. In FIG. 15, the sensing anode of the light sensing element PD corresponds to a first electrode 175, and the sensing cathode of the light sensing element PD corresponds to the common electrode 173.

The light sensing element PD may generate photocharges in case that it is exposed to external light, and the generated photocharges may be accumulated in the sensing anode of the light sensing element PD. For example, a voltage of a first node N1 electrically connected to the sensing anode may increase. In case that the light sensing element PD and the $q^{th}$ readout line ROLq are connected according to the turn-on state of the first and third sensing transistors LT1 and LT3, a sensing voltage may be accumulated in a third node N3 between the $q^{th}$ readout line ROLq and the third sensing transistor LT3 in proportion to the voltage of the first node N1 in which electric charges are accumulated.

The first sensing transistor LT1 may be turned on by the voltage of the first node N1 applied to a gate electrode to connect (e.g., electrically connect) the second initialization voltage line VIL2 and a second electrode of the third sensing transistor LT3. The first sensing transistor LT1 may have the gate electrode connected to the first node N1, a first electrode connected to the second initialization voltage line VIL2, and a second electrode connected to a first electrode of the third sensing transistor LT3. The first sensing transistor LT1 may be a source follower amplifier that generates a source-drain current in proportion to the amount of charge of the first node N1 input to the gate electrode. Although the first electrode of the first sensing transistor LT1 is illustrated as being connected to the second initialization voltage line VIL2, embodiments are not limited thereto, and the first electrode of the first sensing transistor LT1 may be connected (e.g., electrically connected) to the driving voltage line VDL or the first initialization voltage line VIL1.

The second sensing transistor LT2 may be turned on by a $k^{th}$ reset control signal of the $k^{th}$ reset control line RSTLk to connect (e.g., electrically connect) the first node N1 to a reset voltage line VRL for applying a reset voltage Vrst. The second sensing transistor LT2 may have a gate electrode connected to the $k^{th}$ reset control line RSTLk, a first electrode connected to the reset voltage line VRL, and a second electrode connected to the first node N1.

The third sensing transistor LT3 may be turned on by the $k^{th}$ scan write signal of the $k^{th}$ scan write line GWLk to connect (e.g., electrically connect) the second electrode of the first sensing transistor LT1 and the $q^{th}$ readout line ROLq. The third sensing transistor LT3 may have a gate electrode connected to the $k^{th}$ scan write line GWLk, the first electrode connected to the second electrode of the first sensing transistor LT1, and the second electrode connected to the third node N3 and the $q^{th}$ readout line ROLq.

An active layer of each of the first through third sensing transistors LT1 through LT3 may be made of any one of polysilicon, amorphous silicon, and an oxide semiconductor. For example, the active layers of the first sensing transistor LT1 and the third sensing transistor LT3 may be made of polysilicon. The active layer of the second sensing transistor LT2 may be made of an oxide semiconductor. For example, the first sensing transistor LT1 and the third sensing transistor LT3 may be formed as P-type MOSFETs, and the second sensing transistor LT2 may be formed as an N-type MOSFET.

Schematic diagrams of equivalent circuits of a second pixel driver PDU2 of a second pixel PX2, a third pixel driver PDU3 of a third pixel PX3, and a fourth pixel driver PDU4 of a fourth pixel PX4 may be substantially the same as the schematic diagram of an equivalent circuit the first pixel driver PDU1 of the first pixel PX1 described above with reference to FIG. 6. Therefore, the schematic diagrams of the equivalent circuits of the second pixel driver PDU2 of the second pixel PX2, the third pixel driver PDU3 of the third pixel PX3, and the fourth pixel driver PDU4 of the fourth pixel PX4 will not be described for descriptive convenience.

Figure 7A:
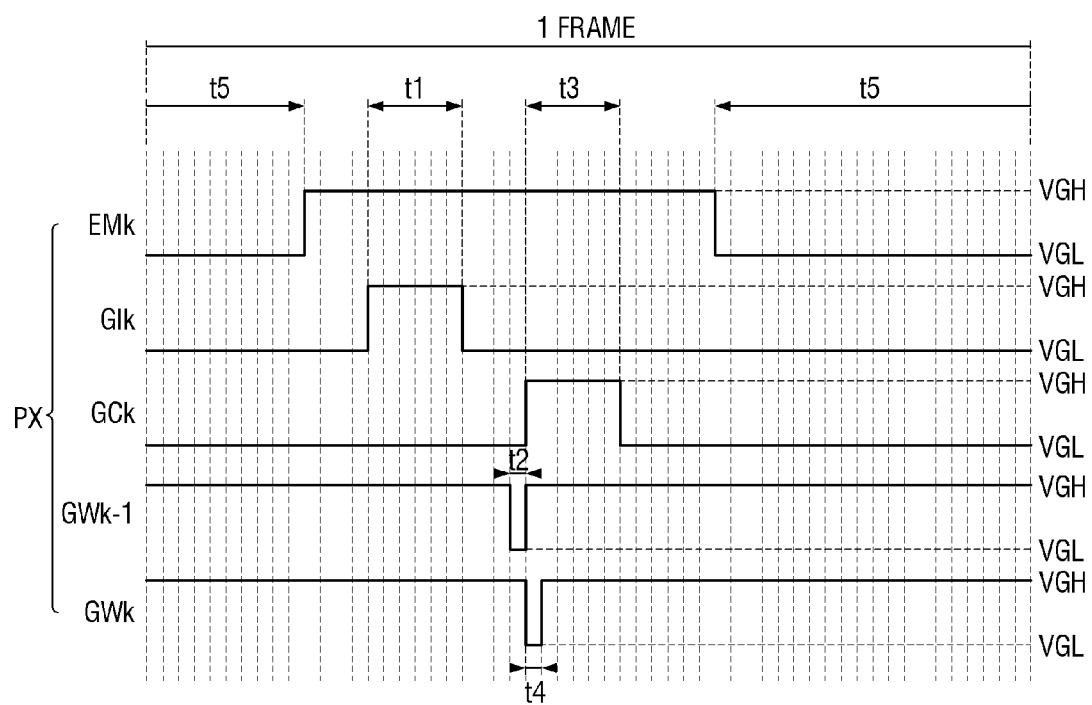
FIGS. 7A and 7B are a waveform diagram of a $k^{th}$ scan initialization signal, a $k^{th}$ scan control signal, a $(k-1)^{th}$ scan write signal, a $k^{th}$ scan write signal, a $k^{th}$ emission control signal, and a $k^{th}$ reset control signal transmitted to a pixel and a light sensor according to an embodiment.
Figure 7B:
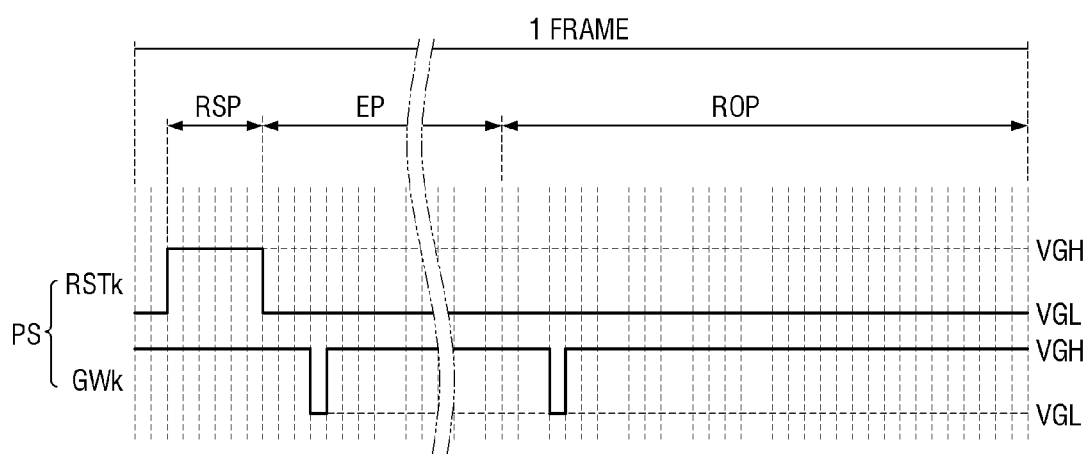

FIGS. 7A and 7B are a waveform diagram of a $k^{th}$ scan initialization signal Glk, a $k^{th}$ scan control signal GCk, a $(k-1)^{th}$ scan write signal GWk-1, a $k^{th}$ scan write signal GWk, a $k^{th}$ emission control signal EMk, and a $k^{th}$ reset control signal RSTk transmitted to a pixel PX and a light sensor PS according to an embodiment. FIG. 7A shows a signal waveform of a first pixel PX1, and FIG. 7B shows a signal waveform of a light sensor PS.

Referring to FIGS. 7A and 7B in conjunction with FIG. 6, the $k^{th}$ emission control signal EMk may be a signal transmitted to the $k^{th}$ emission control line EMLk and a signal for controlling turn-on and turn-off of the fourth transistor T4 and the fifth transistor T5. The $k^{th}$ scan initialization signal Glk may be a signal transmitted to the $k^{th}$ scan initialization line GILk and a signal for controlling turn-on and turn-off of the third transistor T3. The $k^{th}$ scan control signal GCk may be a signal transmitted to the $k^{th}$ scan control line GCLk and a signal for controlling turn-on and turn-off of the second transistor T2. The $(k-1)^{th}$ scan write signal GWk-1 may be a signal transmitted to the $(k-1)^{th}$ scan write line GWLk-1 and a signal for controlling turn-on and turn-off of the sixth transistor T6. The $k^{th}$ scan write signal GWk may be a signal transmitted to the $k^{th}$ scan write line GWLk and a signal for controlling turn-on and turn-off of the first transistor T1 and the third sensing transistor LT3. The $k^{th}$ reset control signal RSTk may be a signal transmitted to the $k^{th}$ reset control line RSTLk and a signal for controlling turn-on and turn-off of the second sensing transistor LT2.

In FIG. 7A, the $k^{th}$ emission control signal EMk, the $k^{th}$ scan initialization signal Glk, the $k^{th}$ scan control signal GCk, the $(k-1)^{th}$ scan write signal GWk-1, and the $k^{th}$ scan write signal GWk may have a signal repeated every one frame period. According to the operation of the first pixel PX1, one frame period may include a first period t1 in which the voltage of the gate electrode of the driving transistor DT is initialized to the first initialization voltage VINT, a second period t2 in which the voltage of the anode of the light emitting element EL is initialized to the second initialization voltage VAINT, a third period t3 in which a data voltage is supplied to the first electrode of the driving transistor DT and a threshold voltage of the driving transistor DT is sampled, a fourth period t4 in which a data voltage is supplied to the first electrode of the driving transistor DT, and a fifth period t5 in which the light emitting element EL emits light.

The $k^{th}$ scan initialization signal Glk may have a second-level voltage VGH during the first period t1 and may have a first-level voltage VGL during the other periods. The $(k-1)^{th}$ scan write signal GWk-1 may have the first-level voltage VGL during the second period t2 and may have the second-level voltage VGH during the other periods. The $k^{th}$ scan control signal GCk may have the second-level voltage VGH during the third period t3 and may have the first-level voltage VGL during the other periods. The $k^{th}$ scan write signal GWk may have the first-level voltage VGL during the fourth period t4 and may have the second-level voltage VGH during the other periods. The $k^{th}$ emission control signal EMk may have the second-level voltage VGH during the first through fourth periods t1 through t4 and may have the first-level voltage VGL during the fifth period t5. The first-level voltage VGL may be a gate low voltage (or a lower voltage), and the second-level voltage VGH may be a gate high voltage (or a higher voltage).

Since the first transistor T1, the fourth through sixth transistors T4 through T6, and the first and third sensing transistors LT1 and LT3 are formed as P-type MOSFETs, they may be turned on in case that a signal of the first-level voltage VGL is transmitted to their gate electrode and may be turned off in case that a signal of the second-level voltage VGH is transmitted to their gate electrode. For example, since the second transistor T2, the third transistor T3, and the second sensing transistor LT2 are formed as N-type MOSFETs, they may be turned on in case that a signal of the second-level voltage VGH is transmitted to their gate electrode and may be turned off in case that a signal of the first-level voltage VGL is transmitted to their gate electrode.

The operation of the first pixel PX1 during the first through fifth periods t1 through t5 will now be described in detail.

During the first period t1, the $k^{th}$ scan initialization signal Glk having the second-level voltage VGH may be supplied to the $k^{th}$ scan initialization line GILk. Accordingly, the third transistor T3 may be turned on by the $k^{th}$ scan initialization signal Glk having the second-level voltage VGH. Due to the turn-on state of the third transistor T3, the gate electrode of the driving transistor DT may be initialized to the first initialization voltage VINT1 of the first initialization voltage line VIL1.

Then, during the second period t2, the $(k-1)^{th}$ scan write signal GWk-1 having the first-level voltage VGL may be supplied to the $(k-1)^{th}$ scan write line GWLk-1. Accordingly, the sixth transistor T6 may be turned on by the $(k-1)^{th}$ scan write signal GWk-1 having the first-level voltage VGL. Due to the turn-on state of the sixth transistor T6, the anode of the light emitting element EL may be initialized to the second initialization voltage VINT2 of the second initialization voltage line VIL2.

Then, during the third period t3, the $k^{th}$ scan control signal GCk having the second-level voltage VGH may be supplied to the $k^{th}$ scan control line GCLk. Accordingly, the second transistor T2 may be turned on by the $k^{th}$ scan control line GCLk having the second-level voltage VGH. Due to the turn-on state of the second transistor T2, the gate electrode and the second electrode of the driving transistor DT may be connected (e.g., electrically connected) to each other, and the driving transistor DT may be driven as a diode.

Then, during the fourth period t4, the $k^{th}$ scan write signal GWk having the first-level voltage VGL may be supplied to the $k^{th}$ scan write line GWLk, and the $k^{th}$ scan control signal GCk having the second-level voltage VGH may be supplied to the $k^{th}$ scan control line GCLk. Accordingly, the first transistor T1 may be turned on by the $k^{th}$ scan write signal GWkline having the first-level voltage VGL, and the second transistor T2 may be turned on by the $k^{th}$ scan control signal GCk having the second-level voltage VGH. Due to the turn-on state of the first transistor T1, a data voltage of the $j^{th}$ data line DLj may be supplied to the first electrode of the driving transistor DT.

For example, since a voltage difference (Vsg=Vdata−VINT1) between the first electrode and the gate electrode of the driving transistor DT is smaller than the threshold voltage of the driving transistor DT, the driving transistor DT may form a current path until the voltage difference between the first electrode and the gate electrode reaches the threshold voltage. For this reason, during the third period t3, the voltage of the gate electrode of the driving transistor DT may rise to a voltage (Vdata-Vth) obtained by subtracting the threshold voltage Vth of the driving transistor DT from a data voltage Vdata.

Then, during the fifth period t5, the $k^{th}$ emission control signal EMk having the first-level voltage VGL may be supplied to the $k^{th}$ emission control line EMLk. Accordingly, the fourth transistor T4 and the fifth transistor T5 may be turned on by the $k^{th}$ emission control signal EMk having the first-level voltage VGL. Due to the turn-on state of the fourth transistor T4, the first electrode of the driving transistor DT may be connected to the driving voltage line VDL. Due to the turn-on state of the fifth transistor T5, the second electrode of the driving transistor DT may be connected (e.g., electrically connected) to the anode of the light emitting element EL.

In case that the fourth transistor T4 and the fifth transistor T5 are turned on, the driving current Isd flowing according to the voltage of the gate electrode of the driving transistor DT may be supplied to the light emitting element EL. The driving current Isd may be defined as Equation 2.

$$Isd = k' \times (VDD - (Vdata - Vth) - Vth)^2 \qquad \text{Equation 2}$$

In Equation 2, Vth is a threshold voltage of the driving transistor DT, VDD is a driving voltage of the driving voltage line VDL, and Vdata is a data voltage. A gate voltage of the driving transistor DT is (Vdata-Vth), and a voltage of the first electrode is VDD. Equation 2 is rearranged into Equation 3.

$$Isd = k' \times (VDD - Vdata)^2 \qquad \text{Equation 3}$$

Ultimately, the driving current Isd may not depend on the threshold voltage Vth of the driving transistor DT as shown in Equation 3. For example, the threshold voltage Vth of the driving transistor DT may be compensated, and the light emitting element EL may emit light according to the driving current Isd controlled by the driving voltage VDD and the data voltage Vdata.

The operation of the light sensor PS will now be described in detail with reference to FIG. 7B.

The $k^{th}$ reset control signal RSTk and the $k^{th}$ scan write signal GWk may have a signal repeated every one frame period. One frame period in which the light sensor PS operates may proceed independently of one frame period in which the first pixel PX1 operates, but embodiments are not limited thereto.

One frame period of the light sensor PS may include a reset period RSP (in which the sensing anode of the light sensing element PD is reset to the reset voltage Vrst), a light exposure period EP (in which the light sensing element PD is exposed to external light, photocharges are generated according to the intensity of the external light, and accordingly, the voltage of the sensing anode of the light sensing element PD and the voltage of the first node N1 rise), and a fingerprint reading period ROP (in which the second sensing transistor LT2 is turned on to read a fingerprint according to the magnitude of a sensing current flowing through the $q^{th}$ readout line ROLq).

The $k^{th}$ reset control signal RSTk may have the second-level voltage VGH during the reset period RSP and may have the first-level voltage VGL during the light exposure period EP and the fingerprint reading period ROP. The $k^{th}$ scan write signal GWk may have the first-level voltage VGL during the reset period RSP and may have the second-level voltage VGH and the first-level voltage VGL during each of the light exposure period EP and the fingerprint reading period ROP. For example, a processor may recognize (or detect) the second-level voltage VGH of the $k^{th}$ scan write signal GWk generated after the light exposure period EP as a valid turn-on signal.

During the reset period RSP, the $k^{th}$ reset control signal RSTk having the second-level voltage VGH may be supplied to the $k^{th}$ reset control line RSTLk. Accordingly, the second sensing transistor LT2 may be turned on, and the first node N1 and the sensing anode of the light sensing element PD may be connected to the reset voltage line VRL. Since the common voltage ELVSS corresponding to a voltage higher than the reset voltage Vrst is applied to the sensing cathode of the light sensing element PD and a second node N2, the light sensing element PD may be kept reverse-biased. For example, the voltage level of the first node N1 may be about −6.5 V, and the voltage level of the second node N2 may be about −2.5 V.

For example, during the light exposure period EP, the light sensing element PD may be exposed to external light, and photocharges may be generated according to the intensity of the external light. Accordingly, the voltage of the sensing anode of the light sensing element PD and the voltage of the first node N1 may rise. In case that a user's touch occurs, the light sensing element PD may generate photocharges corresponding to light reflected by ridges RID (see FIG. 3) or valleys VAL (see FIG. 3) between the ridges RID of a fingerprint, and a reverse current may be generated in proportion to the amount of the generated photocharges. For example, a photocurrent Iph flowing from the second node N2 to the first node N1 may be generated. Accordingly, the voltage of the first node N1 may increase. Since the voltage of the first node N1 increases as the amount of charge accumulated in the first node N1 increases, the light exposure period EP may be set sufficiently long.

During the fingerprint reading period ROP, the third sensing transistor LT3 may be turned on to read the fingerprint according to the magnitude of the sensing current flowing through the $q^{th}$ readout line ROLq. During the fingerprint reading period ROP, the $k^{th}$ scan write signal GWk having the first-level voltage VGL may be supplied to the $k^{th}$ scan write line GWLk. Accordingly, the third sensing transistor LT3 may be turned on, and a sensing current of the first sensing transistor LT1 may be output to the $q^{th}$ readout line ROLq through the third sensing transistor LT3. The sensing current may be a source-drain current generated in proportion to the amount of charge of the first node N1 input to the gate electrode of the first sensing transistor LT1. The readout circuit 40 (see FIG. 2) may sense a sensing voltage charged in the $q^{th}$ readout line ROLq and the third node N3 by the sensing current and may read the ridges RID or valleys VAL of the fingerprint.

In the display device 1 according to an embodiment, the first sensing transistor LT1 may be turned on in case that the voltage Vsg between the first electrode and the gate electrode of the first sensing transistor LT1 reach the threshold voltage Vth during the light exposure period EP. Accordingly, the sensing current may be changed in proportion to the amount of charge of the first node N1 input to the gate electrode of the first sensing transistor LT1.

For example, since the first sensing transistor LT1 remains turned off before the voltage of the first node N1 reaches the threshold voltage Vth of the first sensing transistor LT1, the gate electrode of the first sensing transistor LT1 may be a floating electrode to which an external voltage is not applied. For example, the voltage of the gate electrode of the first sensing transistor LT1 may be changed by parasitic capacitance formed between the gate electrode of the first sensing transistor LT1 and a signal line adjacent to the gate electrode of the first sensing transistor LT1. For example, in case that a signal change occurs in a signal line adjacent to the gate electrode of the first sensing transistor LT1, the voltage of the gate electrode of the first sensing transistor LT1 may change. For example, a leakage current may flow through the first sensing transistor LT1. Since the leakage current of the first sensing transistor LT1 causes a noise signal irrelevant to the sensing current, the accuracy of the fingerprint reading operation of the display device 1 may be reduced or degraded.

The display device 1 according to an embodiment may include a shielding electrode SHE (see FIG. 8) disposed between the gate electrode of the first sensing transistor LT1 and a signal line adjacent to the gate electrode of the first sensing transistor LT1 or overlapping the signal line. Accordingly, a parasitic capacitor between the gate electrode of the first sensing transistor LT1 and the signal line adjacent to the gate electrode of the first sensing transistor LT1 may be prevented or minimized. For example, since the leakage current of the first sensing transistor LT1 is prevented, a decrease or degradation in the accuracy of the fingerprint reading operation may be prevented. The display device 1 according to an embodiment will be described in detail below.

The operations of a second pixel PX2, a third pixel PX3, and a fourth pixel PX4 may be substantially the same as the operation of the first pixel PX1 described above with reference to FIGS. 6 and 7. Therefore, the operation of the second pixel PX2, the third pixel PX3, and the fourth pixel PX4 will not be described for descriptive convenience.

Figure 8:
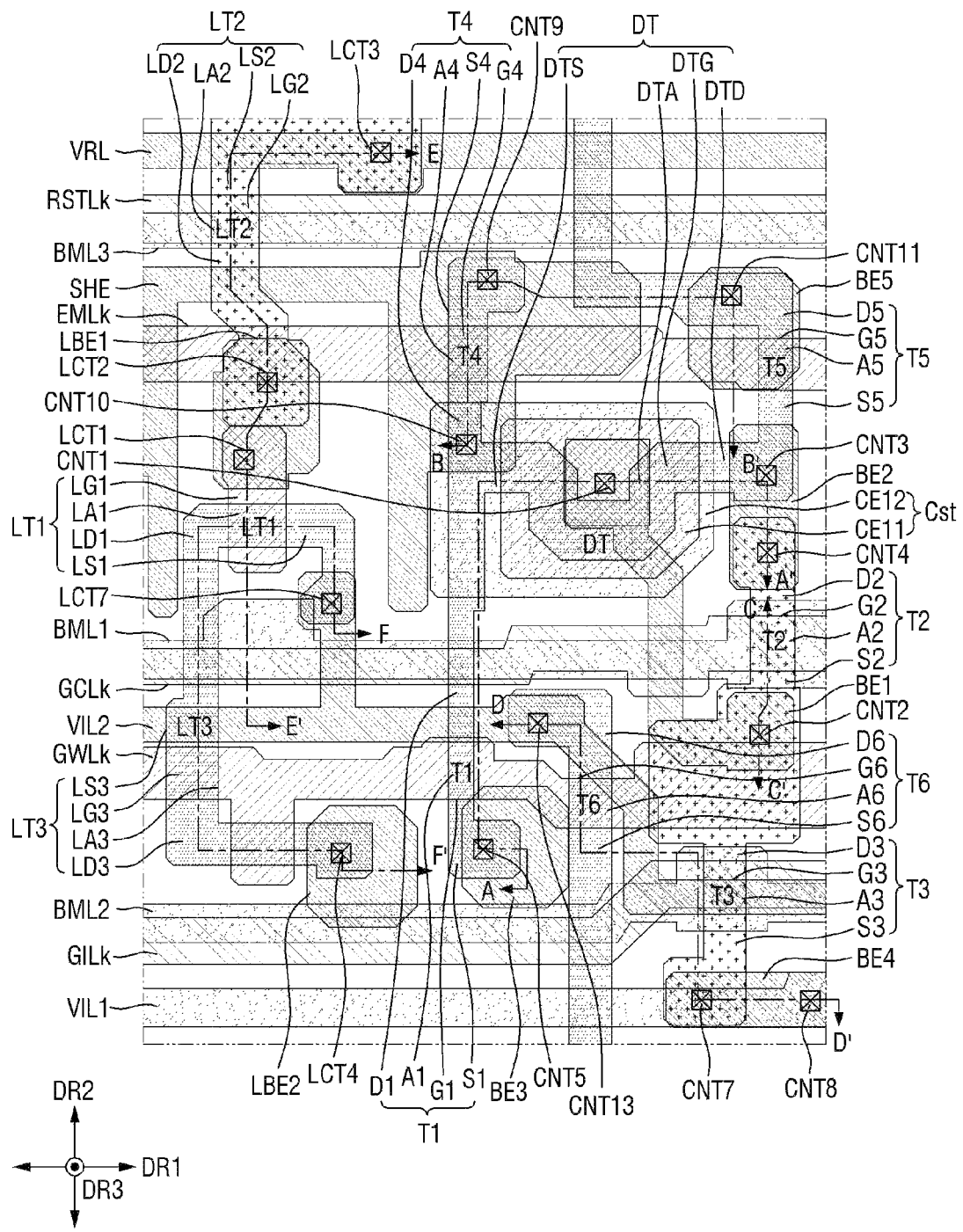
FIG. 8 is a schematic layout view illustrating a first active layer, a first gate metal layer, a second gate metal layer, a second active layer, a third gate metal layer and a first data layer of a first pixel driver and a sensing driver according to an embodiment.
Figure 9:
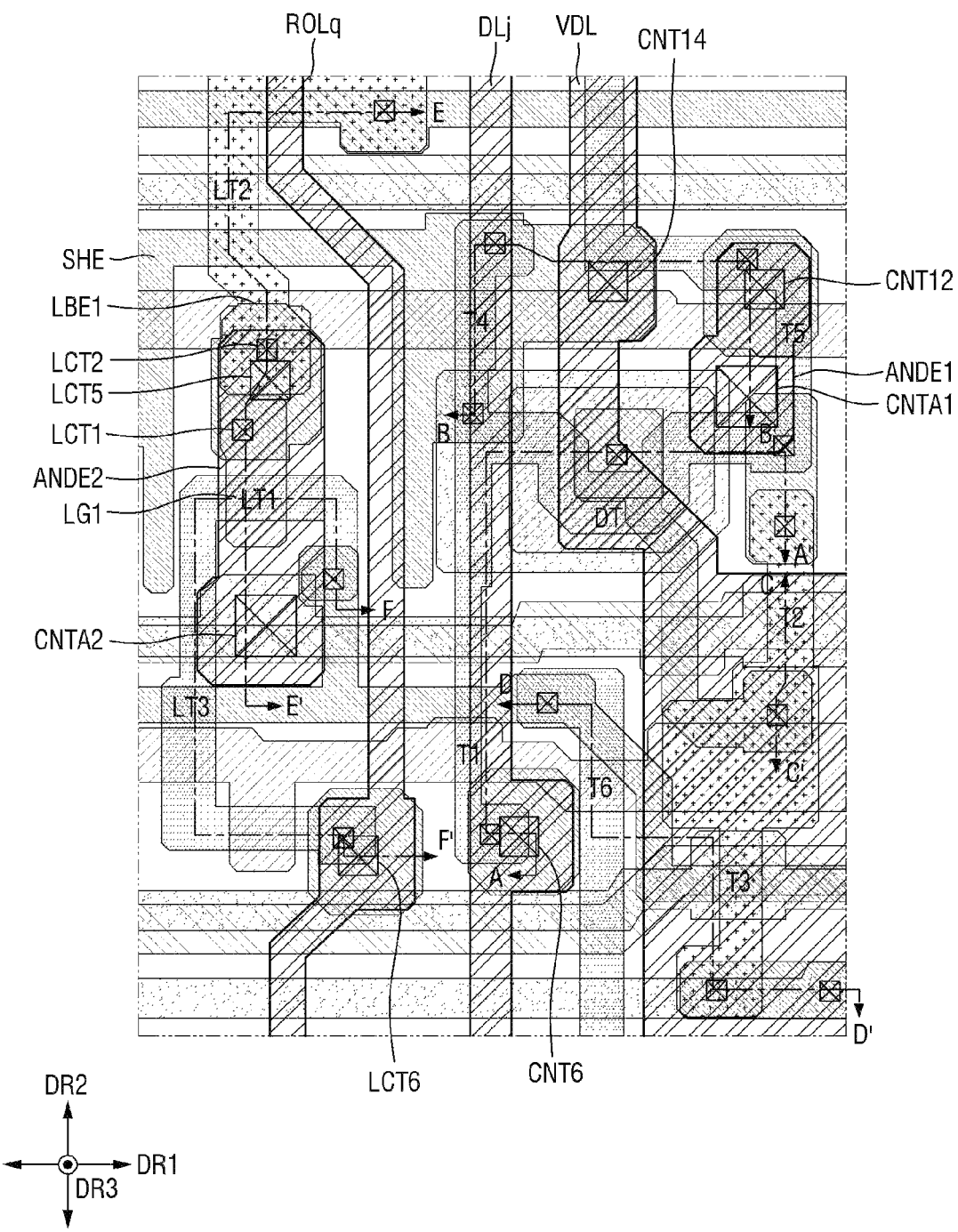
FIG. 9 is a schematic layout view illustrating the first active layer, the first gate metal layer, the second gate metal layer, the second active layer, the third gate metal layer, the first data layer and a second data layer of the first pixel driver and the sensing driver according to an embodiment.

FIG. 8 is a schematic layout view illustrating a first active layer, a first gate metal layer, a second gate metal layer, a second active layer, a third gate metal layer and a first data layer of a first pixel driver PDU1 and a sensing driver PSDU according to an embodiment. FIG. 9 is a schematic layout view illustrating the first active layer, the first gate metal layer, the second gate metal layer, the second active layer, the third gate metal layer, the first data layer and a second data layer of the first pixel driver PDU1 and the sensing driver PSDU according to an embodiment.

Referring to FIGS. 8 and 9, the first pixel driver PDU1 may include a driving transistor DT, first through sixth transistors T1 through T6, a first capacitor Cst, connection electrodes BE1 through BE5, and a first anode connection electrode ANDE1. The sensing driver PSDU may include first through third sensing transistors LT1 through LT3, sensing connection electrodes LBE1 through LBE3, and a second anode connection electrode ANDE2. A shielding electrode SHE may be further disposed in the first pixel driver PDU1 and the sensing driver PSDU.

A $k^{th}$ reset control line RSTLk, a $k^{th}$ emission control line EMLk, a $k^{th}$ scan write line GWLk, a $k^{th}$ scan control line GCLk, and a $k^{th}$ scan initialization line GILk may extend in the first direction DR1. A $j^{th}$ data line DLj may extend in the second direction DR2. A driving voltage line VDL may extend in the second direction DR2. A $q^{th}$ readout line ROLq may extend in the second direction DR2.

The arrangement relationship of the first pixel driver PDU1 will be described.

The driving transistor DT may include a channel layer DTA, a gate electrode DTG, a first electrode DTS, and a second electrode DTD. The channel layer DTA of the driving transistor DT may overlap the gate electrode DTG of the driving transistor DT. The gate electrode DTG of the driving transistor DT may be disposed on the channel layer DTA of the driving transistor DT.

The gate electrode DTG of the driving transistor DT may be connected (e.g., electrically connected) to a first connection electrode BE1 through a first contact hole CNT1. The first connection electrode BE1 may be connected (e.g., electrically connected) to a second electrode D2 of the second transistor T2 through a second contact hole CNT2. The first connection electrode BE1 may cross the $k^{th}$ scan control line GCLk.

The first electrode DTS of the driving transistor DT may be connected (e.g., electrically connected) to a first electrode S1 of the first transistor T1 and a second electrode D4 of the fourth transistor T4.

The second electrode DTD of the driving transistor DT may be connected (e.g., electrically connected) to a second connection electrode BE2 through a third contact hole CNT3. The second connection electrode BE2 may be connected (e.g., electrically connected) to the second electrode D2 of the second transistor T2 through a fourth contact hole CNT4.

For example, a region of the gate electrode DTG of the driving transistor DT which overlaps a second capacitor electrode CE12 may correspond to a first capacitor electrode CE11 of the first capacitor Cst.

The first transistor T1 may be connected (e.g., electrically connected) to a channel layer A1, a gate electrode G1, the first electrode S1, and a second electrode D1. The channel layer A1 of the first transistor T1 may overlap the gate electrode G1 of the first transistor T1. The gate electrode G1 of the first transistor T1 may be disposed on the channel layer A1 of the first transistor T1. The gate electrode G1 of the first transistor T1 may be integral with the $k^{th}$ scan write line GWLk. The gate electrode G1 of the first transistor T1 may be a portion of the $k^{th}$ scan write line GWLk.

The first electrode S1 of the first transistor T1 may be connected to a third connection electrode BE3 through a fifth contact hole CNT5. The third connection electrode BE3 may be connected (e.g., electrically connected) to the $j^{th}$ data line DLj through a sixth contact hole CNT6. The second electrode D1 of the first transistor T1 may be connected (e.g., electrically connected) to the first electrode DTS of the driving transistor DT and the second electrode D4 of the fourth transistor T4. The second electrode D1 of the first transistor T1 may extend in the second direction DR2 and thus overlap the $k^{th}$ scan control line GCLk, a first light blocking layer BML1, a second initialization voltage line VIL2, and the shielding electrode SHE.

The second transistor T2 may be connected (e.g., electrically connected) to a channel layer A2, a gate electrode G2, a first electrode S2, and the second electrode D2. The channel layer A2 of the second transistor T2 may overlap the gate electrode G2 of the second transistor T2. The gate electrode G2 of the second transistor T2 may be disposed on the channel layer A2 of the second transistor T2. The gate electrode G2 of the second transistor T2 may be integral with the $k^{th}$ scan control line GCLk. The gate electrode G2 of the second transistor T2 may be a portion of the $k^{th}$ scan control line GCLk.

The first electrode S2 of the second transistor T2 may be connected (e.g., electrically connected) to a second electrode D3 of the third transistor T3. For example, the second electrode D2 of the second transistor T2 may be connected (e.g., electrically connected) to the second connection electrode BE2 through the fourth contact hole CNT4. The second electrode D2 of the second transistor T2 may be connected (e.g., electrically connected) to the first connection electrode BE1 through the second contact hole CNT2.

The third transistor T3 may be connected (e.g., electrically connected) to a channel layer A3, a gate electrode G3, a first electrode S3, and the second electrode D3. The channel layer A3 of the third transistor T3 may overlap the gate electrode G3 of the third transistor T3. The gate electrode G3 of the third transistor T3 may be disposed on the channel layer A3 of the third transistor T3. The gate electrode G3 of the third transistor T3 may be integral with the $k^{th}$ scan initialization line GILk. The gate electrode G3 of the third transistor T3 may be a portion of the $k^{th}$ scan initialization line GILk.

The first electrode S3 of the third transistor T3 may be connected (e.g., electrically connected) to a fourth connection electrode BE4 through a seventh contact hole CNT7. The fourth connection electrode BE4 may be connected (e.g., electrically connected) to a first initialization voltage line VIL1 through an eighth contact hole CNT8. The second electrode D3 of the third transistor T3 may be connected (e.g., electrically connected) to the second electrode D2 of the second transistor T2.

The fourth transistor T4 may be connected (e.g., electrically connected) to a channel layer A4, a gate electrode G4, a first electrode S4, and the second electrode D4. The channel layer A4 of the fourth transistor T4 may overlap the gate electrode G4 of the fourth transistor T4. The gate electrode G4 of the fourth transistor T4 may be disposed on the channel layer A4 of the fourth transistor T4. The gate electrode G4 of the fourth transistor T4 may be integral with the $k^{th}$ emission control line EMLk. The gate electrode G4 of the fourth transistor T4 may be a portion of the $k^{th}$ emission control line EMLk.

The first electrode S4 of the fourth transistor T4 may be connected (e.g., electrically connected) to the shielding electrode SHE through a ninth contact hole CNT9. The shielding electrode SHE may be connected (e.g., electrically connected) to the driving voltage line VDL through a fourteenth contact hole CNT14. The second electrode D4 of the fourth transistor T4 may be connected (e.g., electrically connected) to the first electrode DTS of the driving transistor DT and the first electrode S1 of the first transistor T1.

The fifth transistor T5 may be connected (e.g., electrically connected) to a channel layer A5, a gate electrode G5, a first electrode S5, and a second electrode D5. The channel layer A5 of the fifth transistor T5 may overlap the gate electrode G5 of the fifth transistor T5. The gate electrode G5 of the fifth transistor T5 may be disposed on the channel layer A5 of the fifth transistor T5. The gate electrode G5 of the fifth transistor T5 may be integral with the $k^{th}$ emission control line EMLk. The gate electrode G5 of the fifth transistor T5 may be a portion of the $k^{th}$ emission control line EMLk.

The first electrode S5 of the fifth transistor T5 may be connected (e.g., electrically connected) to the second connection electrode BE2 through the third contact hole CNT3. The second electrode D5 of the fifth transistor T5 may be connected (e.g., electrically connected) to a fifth connection electrode BE5 through an eleventh contact hole CNT11. The fifth connection electrode BE5 may be connected (e.g., electrically connected) to the first anode connection electrode ANDE1 through a twelfth contact hole CNT12. A first electrode of a light emitting element EL may be connected (e.g., electrically connected) to the first anode connection electrode ANDE1 through a first anode contact hole CNTA1.

The sixth transistor T6 may be connected (e.g., electrically connected) to a channel layer A6, a gate electrode G6, a first electrode S6, and a second electrode D6. The channel layer A6 of the sixth transistor T6 may overlap the gate electrode G6 of the sixth transistor T6. The gate electrode G6 of the sixth transistor T6 may be disposed on the channel layer A6 of the sixth transistor T6. The gate electrode G6 of the sixth transistor T6 may be integral with a $(k-1)^{th}$ scan write line. The gate electrode G6 of the sixth transistor T6 may be a portion of the $(k-1)^{th}$ scan write line.

The first electrode S6 of the sixth transistor T6 may be connected (e.g., electrically connected) to the second initialization voltage line VIL2 through a thirteenth contact hole CNT13. The first electrode S6 of the sixth transistor T6 may overlap the $k^{th}$ scan initialization line GILk. The second electrode D6 of the sixth transistor T6 may be connected (e.g., electrically connected) to the second initialization voltage line VIL2 through the thirteenth contact hole CNT13.

The first capacitor Cst may include the first capacitor electrode CE11 and the second capacitor electrode CE12. The first capacitor electrode CE11 may be a portion of the gate electrode DTG of the driving transistor DT and may correspond to a region of the gate electrode DTG of the driving transistor DT which overlaps the second capacitor electrode CE12 of the first capacitor Cst. The second capacitor electrode CE12 may overlap the first capacitor electrode CE11 of the first capacitor Cst. The second capacitor electrode CE12 may be connected (e.g., electrically connected) to the shielding electrode SHE through a tenth contact hole CNT10.

For example, the arrangement relationship of the sensing driver PSDU will be described.

The first sensing transistor LT1 may be connected (e.g., electrically connected) to a channel layer LA1, a gate electrode LG1, a first electrode LS1, and a second electrode LD1. The channel layer LA1 of the first sensing transistor LT1 may overlap the gate electrode LG1 of the first sensing transistor LT1. The gate electrode LG1 of the first sensing transistor LT1 may be disposed on the channel layer LA1 of the first sensing transistor LT1.

The gate electrode LG1 of the first sensing transistor LT1 may be connected (e.g., electrically connected) to a first sensing connection electrode LBE1 through a first sensing contact hole LCT1. The first sensing connection electrode LBE1 may be connected (e.g., electrically connected) to a first electrode LS2 of the second sensing transistor LT2 through a second sensing contact hole LCT2. The first sensing connection electrode LBE1 may be connected to the second anode connection electrode ANDE2 through a fifth sensing contact hole LCT5. A first electrode of a light sensing element PD may be connected (e.g., electrically connected) to the second anode connection electrode ANDE2 through a second anode contact hole CNTA2. The gate electrode LG1 of the first sensing transistor LT1, the first sensing connection electrode LBE1, and the second anode connection electrode ANDE2 may sequentially overlap in the thickness direction of a substrate.

The gate electrode LG1 of the first sensing transistor LT1 may be adjacent to the $j^{th}$ data line DLj. The shielding electrode SHE may be disposed outside (or around) a side of the gate electrode LG1 of the first sensing transistor LT1, e.g., in plan view. At least a portion of the shielding electrode SHE may be disposed between the gate electrode LG1 of the first sensing transistor LT1 and the $j^{th}$ data line DLj. The shielding electrode SHE may be connected (e.g., electrically connected) to the driving voltage line VDL through the fourteenth contact hole CNT14 and may be connected (e.g., electrically connected) to the first electrode S4 of the fourth transistor T4 through the ninth contact hole CNT9. The shielding electrode SHE may be connected (e.g., electrically connected) to the second capacitor electrode CE12 through the tenth contact hole CNT10.

Since the shielding electrode SHE is connected (e.g., electrically connected) to the driving voltage line VDL, a driving voltage ELVDD of a certain level may be applied to the shielding electrode SHE. The shielding electrode SHE may be disposed outside (or around) a side of the gate electrode LG1 of the first sensing transistor LT1 (e.g., in plan view) to minimize the formation of a parasitic capacitor between the $j^{th}$ data line DLj and the gate electrode LG1. This will be described in more detail with reference to FIGS. 10 and 11.

The first electrode LS1 of the first sensing transistor LT1 may be connected (e.g., electrically connected) to the second initialization voltage line VIL2 through a seventh sensing contact hole LCT7. The first electrode LS1 of the first sensing transistor LT1 may extend in the second direction DR2.

The second electrode LD1 of the first sensing transistor LT1 may be connected (e.g., electrically connected) to a first electrode LS3 of the third sensing transistor LT3.

The second sensing transistor LT2 may be connected (e.g., electrically connected) to a channel layer LA2, a gate electrode LG2, the first electrode LS2, and a second electrode LD2. The channel layer LA2 of the second sensing transistor LT2 may overlap the gate electrode LG2 of the second sensing transistor LT2. The gate electrode LG2 of the second sensing transistor LT2 may be disposed on the channel layer LA2 of the second sensing transistor LT2. The gate electrode LG2 of the second sensing transistor LT2 may be integral with the $k^{th}$ reset control line RSTLk. The gate electrode LG2 of the second sensing transistor LT2 may be a portion of the $k^{th}$ reset control line RSTLk.

The first electrode LS2 of the second sensing transistor LT2 may be connected (e.g., electrically connected) to a reset voltage line VRL through a third sensing contact hole LCT3. The second electrode LD2 of the second sensing transistor LT2 may be connected (e.g., electrically connected) to the first sensing connection electrode LBE1 through the second sensing contact hole LCT2. The second electrode LD2 of the second sensing transistor LT2 may overlap a portion of the shielding electrode SHE disposed in the first direction DR1.

The third sensing transistor LT3 may be connected (e.g., electrically connected) to a channel layer LA3, a gate electrode LG3, the first electrode LS3, and a second electrode LD3. The channel layer LA3 of the third sensing transistor LT3 may overlap the gate electrode LG3 of the third sensing transistor LT3. The gate electrode LG3 of the third sensing transistor LT3 may be disposed on the channel layer LA3 of the third sensing transistor LT3. The gate electrode LG3 of the third sensing transistor LT3 may be integral with the $k^{th}$ scan write line GWLk. The gate electrode LG3 of the third sensing transistor LT3 may be a portion of the $k^{th}$ scan write line GWLk. The third sensing transistor LT3 may overlap the $k^{th}$ scan write line GWLk twice to form a dual gate.

The first electrode LS3 of the third sensing transistor LT3 may be connected (e.g., electrically connected) to the second electrode LD1 of the first sensing transistor LT1. The second electrode LD3 of the third sensing transistor LT3 may be connected (e.g., electrically connected) to a second sensing connection electrode LBE2 through a fourth sensing contact hole LCT4. The second sensing connection electrode LBE2 may be connected (e.g., electrically connected) to the $q^{th}$ readout line ROLq through a sixth sensing contact hole LCT6.

A second pixel driver PDU2, a third pixel driver PDU3, and a fourth pixel driver PDU4 are substantially the same as the first pixel driver PDU1 described with reference to FIGS. 8 and 9 and thus will not be described for descriptive convenience.

Figure 10:
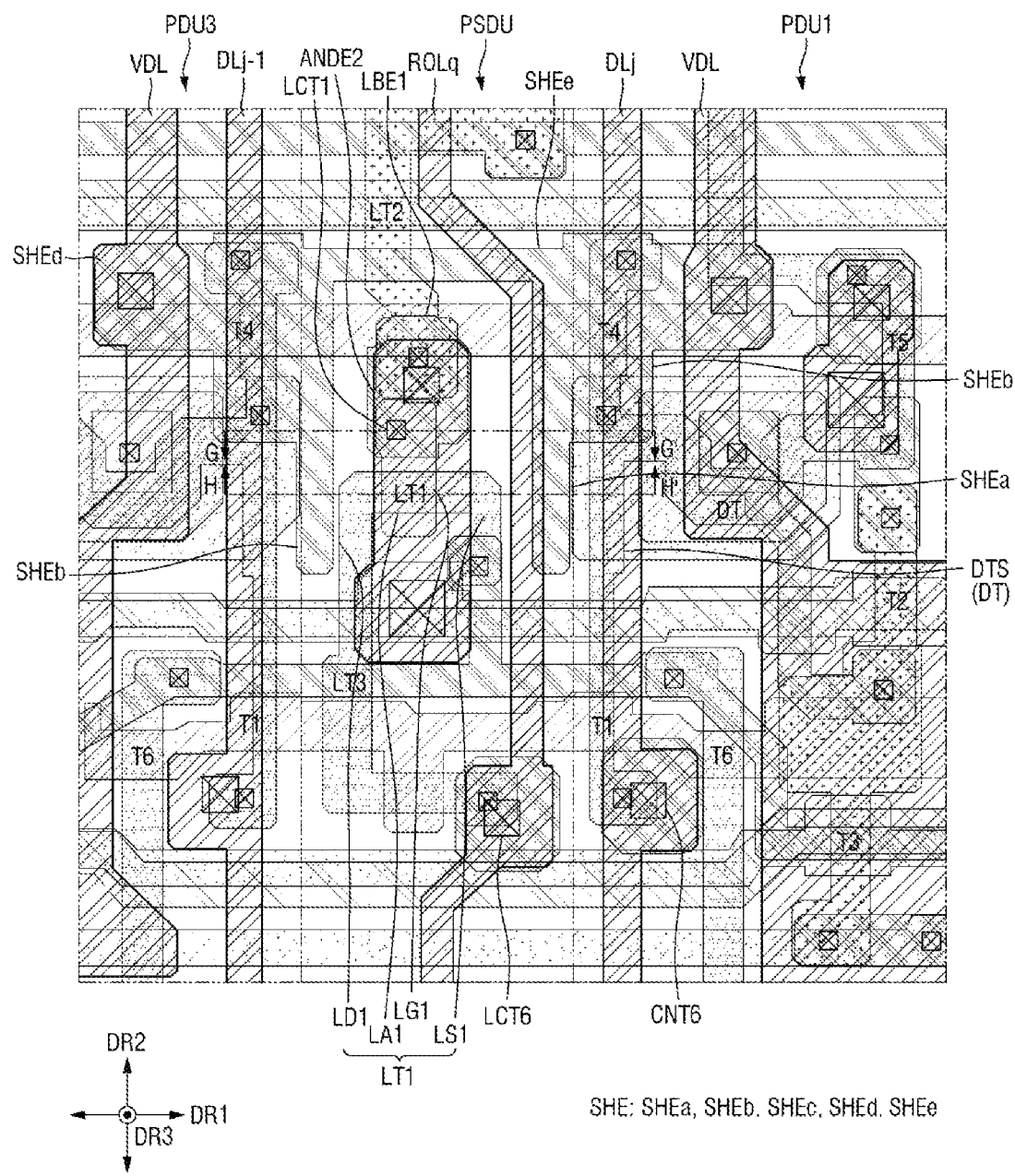
FIG. 10 is a schematic layout view illustrating a first pixel driver, a sensing driver, and a third pixel driver adjacent to the first pixel driver and the sensing driver according to an embodiment.
Figure 11:
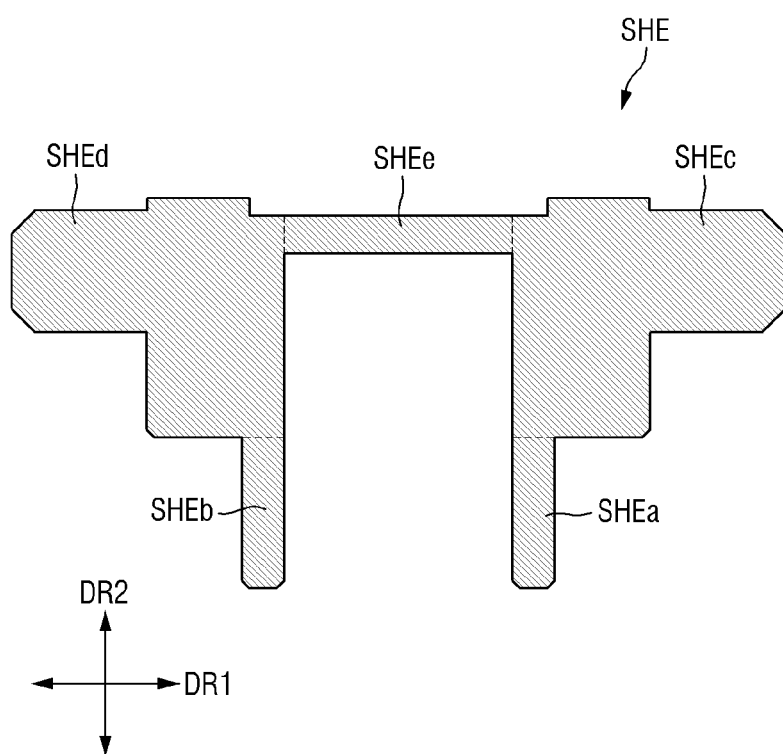
FIG. 11 is a schematic enlarged layout view of a shielding electrode of FIG. 10.

FIG. 10 is a schematic layout view illustrating a first pixel driver PDU1, a sensing driver PSDU, and a third pixel driver PDU3 adjacent to the first pixel driver PDU1 and the sensing driver PSDU according to an embodiment. FIG. 11 is a schematic enlarged layout view of a shielding electrode SHE of FIG. 10.

The arrangement relationship between the shielding electrode SHE, the first pixel driver PDU1, the sensing driver PSDU, and the third pixel driver PDU3 adjacent to the first pixel driver PDU1 and the sensing driver PSDU will be described with reference to FIGS. 10 and 11. The third pixel driver PDU3 may further include a $(j-1)^{th}$ data line DLj−1 and a driving voltage line VDL extending in the second direction DR2. A $q^{th}$ readout line ROLq may be disposed between a gate electrode LG1 of a first sensing transistor LT1 and a $j^{th}$ data line DLj and may not be disposed between the gate electrode LG1 of the first sensing transistor LT1 and the $(j-1)^{th}$ data line DLj−1.

The shielding electrode SHE may include a first shielding portion SHEa, a second shielding portion SHEb, a third shielding portion SHEc, a fourth shielding portion SHEd, and a fifth shielding portion SHEe connected (e.g., electrically connected) to each other. The first shielding portion SHEa may extend in the second direction DR2, and the second shielding portion SHEb may extend in the second direction DR2 and may be spaced apart from the first shielding portion SHEa. The third shielding portion SHEc may be connected to the first shielding portion SHEa, and the fourth shielding portion SHEd may be connected (e.g., electrically connected) to the second shielding portion SHEb. The fifth shielding portion SHEe may extend in the first direction DR1 and may connect the third shielding portion SHEc and the fourth shielding portion SHEd.

The area (or size) of the first shielding portion SHEa and the area (or size) of the second shielding portion SHEb may be substantially the same as each other. The area (or size) of the third shielding portion SHEc and the area (or size) of the fourth shielding portion SHEd may be substantially the same as each other. A width of the first shielding portion SHEa in the first direction DR1 and a width of the second shielding portion SHEb in the first direction DR1 may be substantially the same as each other. A width of the third shielding portion SHEc in the first direction DR1 and a width of the fourth shielding portion SHEd in the first direction DR1 may be substantially the same as each other. The width of the first shielding portion SHEa or the second shielding portion SHEb in the first direction DR1 may be smaller than the width of the third shielding portion SHEc or the fourth shielding portion SHEd in the first direction DR1. A length of the fifth shielding portion SHEe in the first direction DR1 may be greater than the width of the first shielding portion SHEa or the second shielding portion SHEb in the first direction DR1.

The first shielding portion SHEa, the second shielding portion SHEb, the third shielding portion SHEc, the fourth shielding portion SHEd, and the fifth shielding portion SHEe may be disposed outside (or around) a side (e.g., a right side) of the gate electrode LG1 of the first sensing transistor LT1, e.g., in plan view. For example, the first shielding portion SHEa and the third shielding portion SHEc may be disposed outside (or around) a side of the gate electrode LG1 of the first sensing transistor LT1 in the first direction DR1, e.g., in plan view. The second shielding portion SHEb and the fourth shielding portion SHEd may be disposed outside (or around) another side (e.g., a left side) of the gate electrode LG1 of the first sensing transistor LT1 in the first direction DR1, e.g., in plan view. The fifth shielding portion SHEe may be disposed outside (or around) a side of the gate electrode LG1 of the first sensing transistor LT1 in the second direction DR2, e.g., in plan view. The first shielding portion SHEa, the second shielding portion SHEb, the third shielding portion SHEc, the fourth shielding portion SHEd, and the fifth shielding portion SHEe may surround three sides of the gate electrode LG1 of the first sensing transistor LT1. Accordingly, the gate electrode LG1 of the first sensing transistor LT1 may be protected from voltage changes of adjacent signal lines.

A length of the shielding electrode SHE in the second direction DR2 may be greater than a length of the gate electrode LG1 of the first sensing transistor LT1 in the second direction DR2. For example, the sum of lengths of the first shielding portion SHEa and the third shielding portion SHEc in the second direction DR2 may be greater than the length of the gate electrode LG1 of the first sensing transistor LT1 in the second direction DR2. The sum of lengths of the second shielding portion SHEb and the fourth shielding portion SHEd in the second direction DR2 may be greater than the length of the gate electrode LG1 of the first sensing transistor LT1 in the second direction DR2.

A length of the shielding electrode SHE in the first direction DR1 may be greater than a length of the gate electrode LG1 of the first sensing transistor LT1 in the first direction DR1. For example, the length of the fifth shielding portion SHEe in the first direction DR1 may be greater than the length of the gate electrode LG1 of the first sensing transistor LT1 in the first direction DR1.

The shielding electrode SHE may be disposed between the gate electrode LG1 of the first sensing transistor LT1 and a signal line or may overlap the signal line. In an embodiment, the signal line may be the $j^{th}$ data line DLj or the $(j-1)^{th}$ data line DLj−1.

For example, the first shielding portion SHEa may be disposed between the gate electrode LG1 of the first sensing transistor LT1 and the $j^{th}$ data line DLj, the second shielding portion SHEb may be disposed between the gate electrode LG1 of the first sensing transistor LT1 and the $(j-1)^{th}$ data line DLj−1, the third shielding portion SHEc may overlap the $j^{th}$ data line DLj, and the fourth shielding portion SHEd may overlap the $(j-1)^{th}$ data line DLj−1. The fifth shielding portion SHEe may overlap a channel layer LA2 of a second sensing transistor LT2.

A portion of each of the first shielding portion SHEa, the third shielding portion SHEc, and the fifth shielding portion SHEe may overlap the $q^{th}$ readout line ROLq.

The shielding electrode SHE may shield a voltage change of a first sensing connection electrode LBE1 connected (e.g., electrically connected) to the gate electrode LG1 and may shield a voltage change of a second anode connection electrode ANDE2 connected (e.g., electrically connected) to the first sensing connection electrode LBE1. For example, the shielding electrode SHE may be disposed outside (or around) a side of the first sensing connection electrode LBE1 or may be disposed outside (or around) a side of the second anode connection electrode ANDE2. The shielding electrode SHE may be disposed between the first sensing connection electrode LBE1 and a signal line or may overlap the signal line. The shielding electrode SHE may be disposed between the second anode connection electrode ANDE2 and a signal line or may overlap the signal line. In an embodiment, the signal line may be the $j^{th}$ data line DLj or the $(j-1)^{th}$ data line DLj−1.

The display device 1 according to an embodiment may include the shielding electrode SHE disposed between the gate electrode LG1 of the first sensing transistor LT1 and a signal line adjacent to the gate electrode LG1 of the first sensing transistor LT1 or overlapping the signal line. Since a voltage (e.g., the driving voltage ELVDD) is applied to the shielding electrode SHE, a parasitic capacitor formed between the gate electrode LG1 of the first sensing transistor LT1 and the signal line adjacent to the gate electrode LG1 of the first sensing transistor LT1 may be prevented or minimized. Accordingly, the voltage change of the gate electrode LG1 of the first sensing transistor LT1, which is caused by a change in a signal transmitted through the signal line, may be prevented or minimized. For example, since the voltage of the gate electrode LG1 is maintained constant during the light exposure period EP in which the first sensing transistor LT1 is turned off, a leakage current of the first sensing transistor LT1 may be prevented, and the generation of a noise signal that reduces the accuracy of the fingerprint reading operation may be prevented.

In the description, the shielding electrode SHE may be disposed between the $j^{th}$ data line DLj and the $(j-1)^{th}$ data line DLj−1 adjacent to the gate electrode LG1 of the first sensing transistor LT1 to shield, prevent, or minimize data voltage changes. However, embodiments are not limited thereto, and the shielding electrode SHE may be disposed at various positions to shield areas between various signal lines in which voltage changes exist and the gate electrode LG1. For example, the shielding electrode SHE may shield an area between a $k^{th}$ scan control line GCLk and the gate electrode LG1 or an area between a $k^{th}$ emission control line EMLk and the gate electrode LG1. For example, at least a portion of the shielding electrode SHE, which extends in the first direction DR1, may be disposed between the $k^{th}$ scan control line GCLk and the gate electrode LG1 or may be disposed between the $k^{th}$ emission control line EMLk and the gate electrode LG1.

Figure 13:
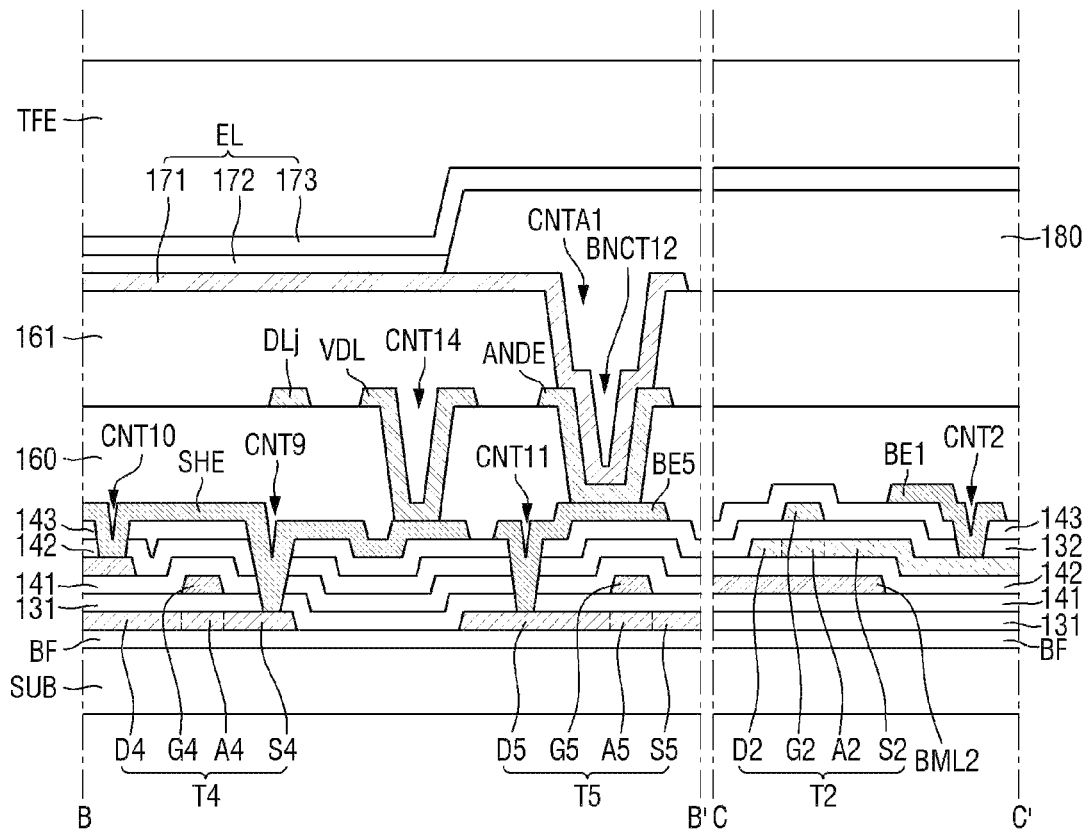
FIG. 13 is an example of a schematic cross-sectional view taken along lines B-B' and C-C' of FIGS. 8 and 9.
Figure 14:
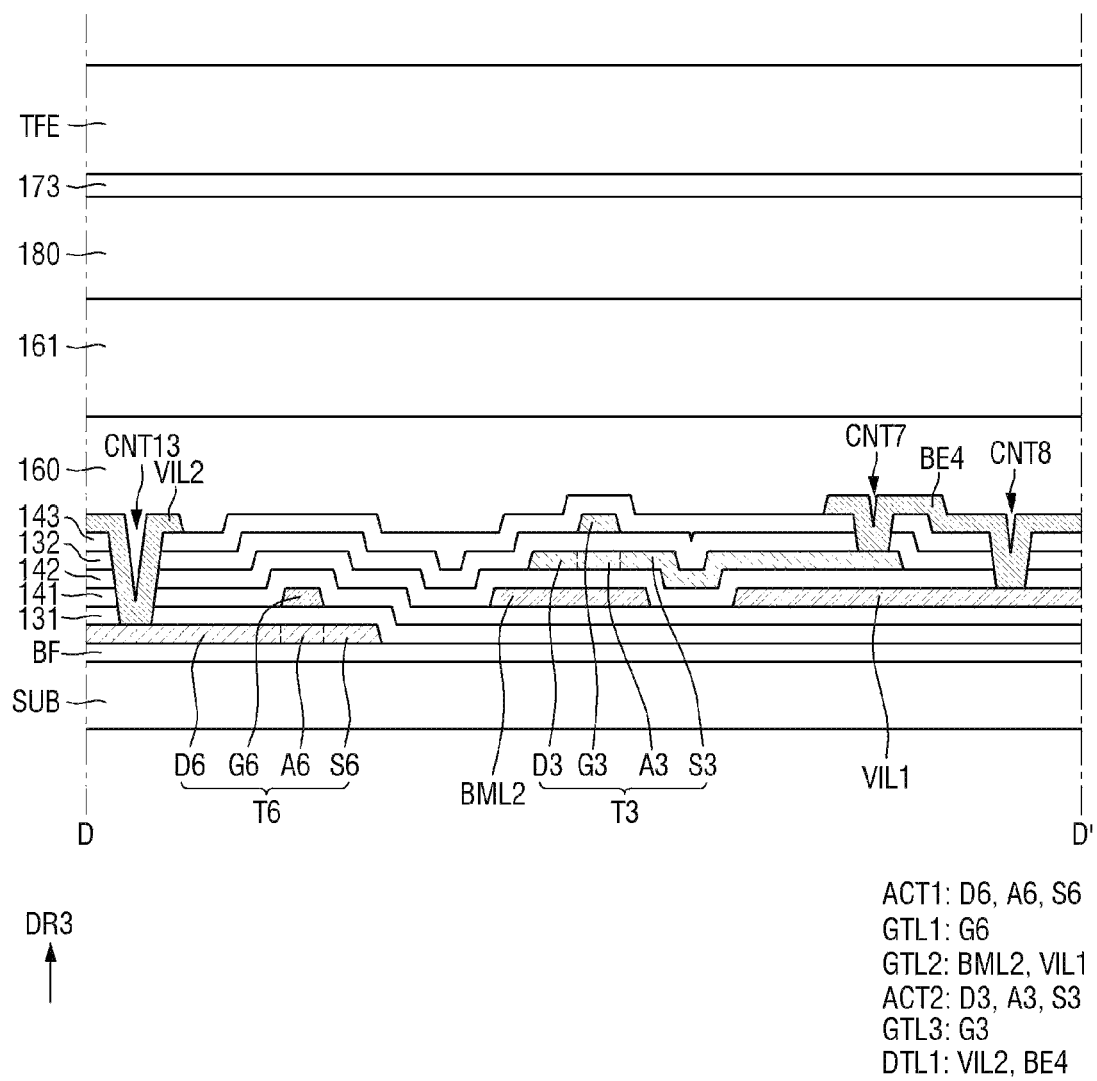
FIG. 14 is an example of a schematic cross-sectional view taken along line D-D' of FIGS. 8 and 9.
Figure 16:
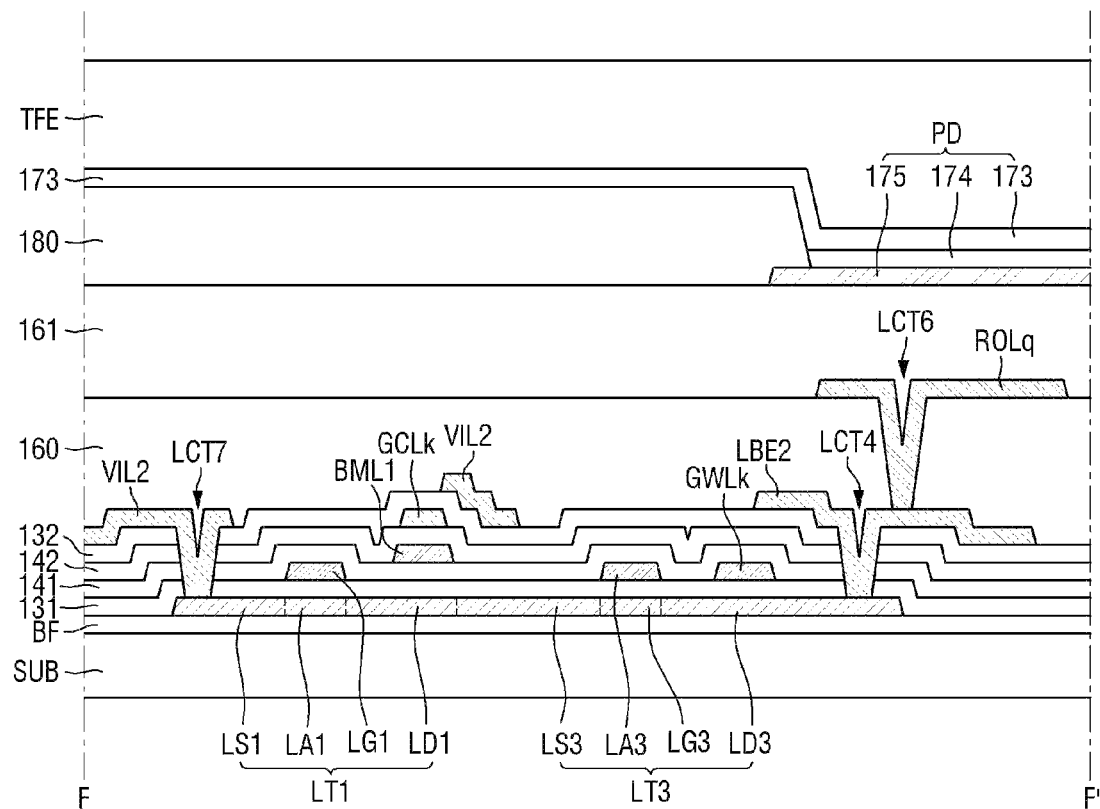
FIG. 16 is an example of a schematic cross-sectional view taken along line F-F' of FIGS. 8 and 9.
Figure 17:
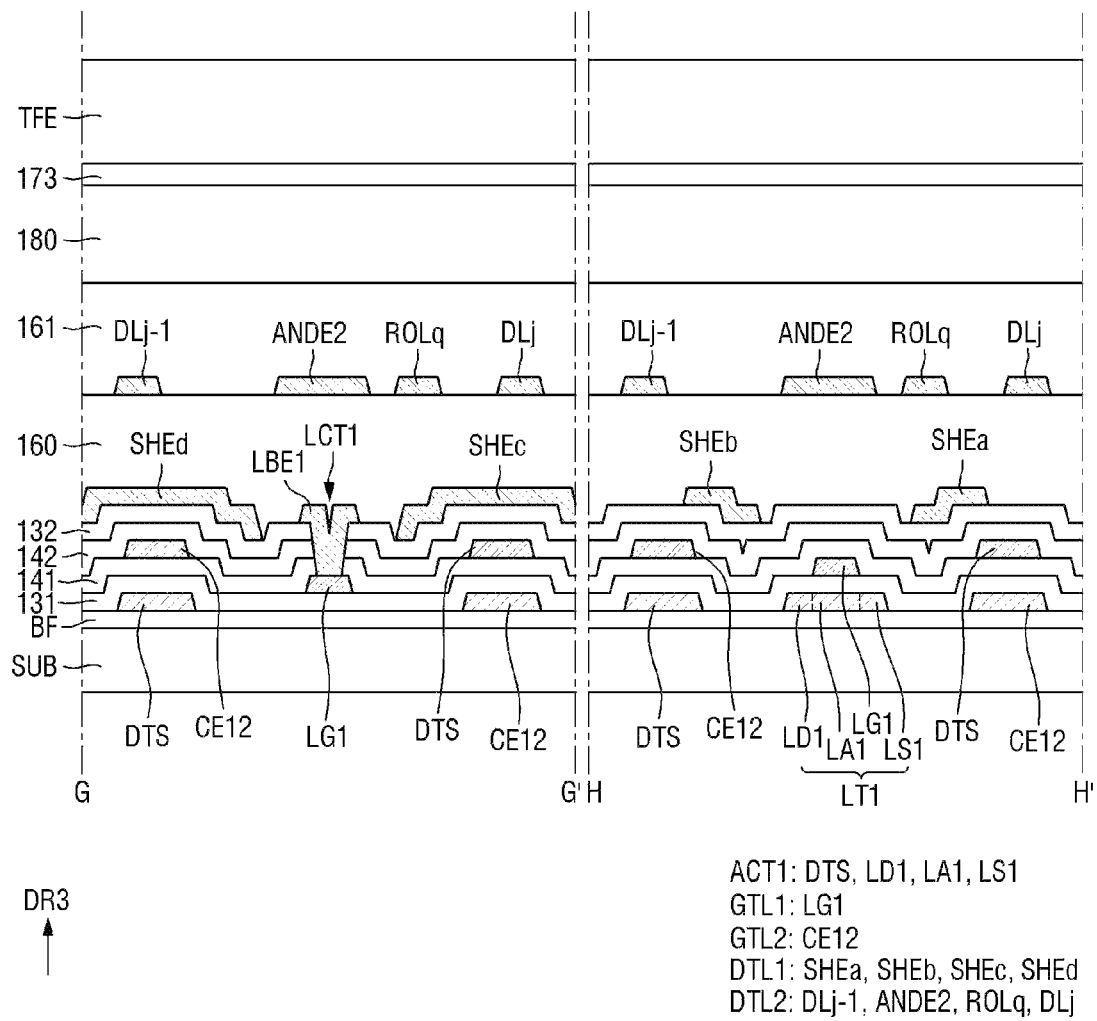
FIG. 17 is an example of a schematic cross-sectional view taken along lines G-G' and H-H' of FIG. 10.

FIG. 12 is an example of a schematic cross-sectional view taken along line A-A' of FIGS. 8 and 9. FIG. 13 is an example of a schematic cross-sectional view taken along lines B-B' and C-C' of FIGS. 8 and 9. FIG. 14 is an example of a schematic cross-sectional view taken along line D-D' of FIGS. 8 and 9. FIG. 15 is an example of a schematic cross-sectional view taken along line E-E' of FIGS. 8 and 9. FIG. 16 is an example of a schematic cross-sectional view taken along line F-F' of FIGS. 8 and 9. FIG. 17 is an example of a schematic cross-sectional view taken along lines G-G' and H-H' of FIG. 10.

Referring to FIGS. 12 through 17, a thin-film transistor layer, a light emitting element layer, and an encapsulation layer TFE may be sequentially formed on a substrate SUB.

The thin-film transistor layer may be a layer in which the driving transistor DT, the first through sixth transistors T1 through T6 and the first capacitor Cst of each of the pixel drivers PDU1 through PDU4 and the first through third sensing transistors LT1 through LT3 of the sensing driver PSDU1 are formed. The thin-film transistor layer may include a first active layer ACT1, a second active layer ACT2, a first gate metal layer GTL1, a second gate metal layer GTL2, a third gate metal layer GTL3, a first data metal layer DTL1, a second data metal layer DTL2, a buffer layer BF, a first gate insulating layer 131, a first interlayer insulating layer 141, a second interlayer insulating layer 142, a second gate insulating layer 132, a third interlayer insulating layer 143, a first organic layer 160, and a second organic layer 161.

The buffer layer BF may be disposed on a surface of the substrate SUB. The buffer layer BF may be formed on the surface of the substrate SUB to protect thin-film transistors and an organic light emitting layer 172 of the light emitting element layer from moisture introduced through the substrate SUB which is vulnerable to moisture penetration. The buffer layer BF may be formed as inorganic layers stacked alternately. For example, the buffer layer BF may be a multilayer in which one or more inorganic layers selected from a silicon nitride layer, a silicon oxynitride layer, a silicon oxide layer, a titanium oxide layer, and an aluminum oxide layer are alternately stacked. In another example, the buffer layer BF may be omitted.

The first active layer ACT1 may be disposed on the buffer layer BF. The first active layer ACT1 may include a silicon semiconductor such as polycrystalline silicon, monocrystalline silicon, low-temperature polycrystalline silicon, or amorphous silicon.

The first active layer ACT1 may include the channel layer DTA, the first electrode DTS, and the second electrode DTD of the driving transistor DT. The channel layer DTA of the driving transistor DT may be a region overlapping the gate electrode DTG of the driving transistor DT in the third direction DR3 which is the thickness direction of the substrate SUB. The first electrode DTS of the driving transistor DT may be disposed on a side of the channel layer DTA, and the second electrode DTD may be disposed on another side of the channel layer DTA. The first electrode DTS and the second electrode DTD of the driving transistor DT may be regions not overlapping the gate electrode DTG in the third direction DR3. The first electrode DTS and the second electrode DTD of the driving transistor DT may be regions formed to have conductivity by doping a silicon semiconductor with ions or impurities.

For example, the first active layer ACT1 may further include the channel layers A1 and A4 through A6, the first electrodes S1 and S4 through S6, and the second electrodes D1 and D4 through D6 of the first and fourth through sixth transistors T1 and T4 through T6. Each of the channel layers A1 and A4 through A6 of the first and fourth through sixth transistors T1 and T4 through T6 may overlap a corresponding gate electrode among the gate electrodes G1 and G4 through G6 in the third direction DR3. The first electrodes S1 and S4 through S6 and the second electrodes D1 and D4 through D6 of the first and fourth through sixth transistors T1 and T4 through T6 may be regions formed to have conductivity by doping a silicon semiconductor with ions or impurities.

The first gate insulating layer 131 may be disposed on the first active layer ACT1. The first gate insulating layer 131 may be made of an inorganic layer, for example, a silicon nitride layer, a silicon oxynitride layer, a silicon oxide layer, a titanium oxide layer, or an aluminum oxide layer.

The first gate metal layer GTL1 may be disposed on the first gate insulating layer 131. The first gate metal layer GTL1 may include the gate electrode DTG of the driving transistor DT. For example, the first gate metal layer GTL1 may include the gate electrodes G1 and G4 through G6 of the first and fourth through sixth transistors T1 and T4 through T6 and the gate electrodes LG1 and LG3 of the first and third sensing transistors LT1 and LT3. For example, the first gate metal layer GTL1 may further include the first capacitor electrode CE11, the $k^{th}$ scan write line GWLk, and the $k^{th}$ emission control line EMLk. The first gate metal layer GTL1 may be a single layer or a multilayer made of any one or more selected from molybdenum (Mo), aluminum (Al), chromium (Cr), gold (Au), titanium (Ti), nickel (Ni), neodymium (Nd), copper (Cu), and alloys thereof.

The first interlayer insulating layer 141 may be disposed on the first gate metal layer GTL1. The first interlayer insulating layer 141 may be made of an inorganic layer, for example, a silicon nitride layer, a silicon oxynitride layer, a silicon oxide layer, a titanium oxide layer, or an aluminum oxide layer.

The second gate metal layer GTL2 may be disposed on the first interlayer insulating layer 141. The second gate metal layer GTL2 may include the second capacitor electrode CE12, first through third light blocking layers BML1 through BML3, and the first initialization voltage line VIL1. The first through third light blocking layers BML1 through BML3 may prevent light incident from under the display panel 10 from entering the second active layer ACT2 disposed on the light blocking layers BML1 through BML3. The second gate metal layer GTL2 and the first gate metal layer GTL1 may include the same material described above.

The second interlayer insulating layer 142 may be disposed on the second gate metal layer GTL2. The second interlayer insulating layer 142 and the first interlayer insulating layer 141 may include the same material described above.

The second active layer ACT2 may be disposed on the second interlayer insulating layer 142. The second active layer ACT2 may include an oxide semiconductor such as IGZO (indium (In), gallium (Ga), zinc (Zn) and oxygen (O)), IGZTO (indium (In), gallium (Ga), zinc (Zn), tin (Sn) and oxygen (O)), or IGTO (indium (In), gallium (Ga), tin (Sn) and oxygen (O)).

The second active layer ACT2 may include the channel layers A2 and A3, the first electrodes S2 and S3, and the second electrodes D2 and D3 of the second and third transistors T2 and T3. The channel layers A2 and A3 of the second and third transistors T2 and T3 may overlap the gate electrodes G2 and G3 in the third direction DR3, respectively. For example, the second active layer ACT2 may include the channel layer LA2, the first electrode LS2, and the second electrode LD2 of the second sensing transistor LT2. The channel layer LA2 of the second sensing transistor LT2 may overlap the gate electrode LG2 in the third direction DR3.

The first electrodes S2 and S3 and the second electrodes D2 and D3 of the second and third transistors T2 and T3 and the first electrode LS2 and the second electrode LD2 of the second sensing transistor LT2 may be regions formed to have conductivity by doping an oxide semiconductor with ions or impurities.

The second gate insulating layer 132 may be disposed on the second active layer ACT2. The second gate insulating layer 132 and the first gate insulating layer 131 may include the same material described above.

The third gate metal layer GTL3 may be disposed on the second gate insulating layer 132. The third gate metal layer GTL3 may include the gate electrodes G2 and G3 of the second and third transistors T2 and T3, the gate electrodes LG2 and LG3 of the second and third sensing transistors LT2 and LT3, the $k^{th}$ scan initialization line GILk, the $k^{th}$ scan control line GCLk, and the $k^{th}$ reset control line RSTLk. The third gate metal layer GTL3 and the first gate metal layer GTL1 may include the same material described above.

The third interlayer insulating layer 143 may be disposed on the third gate metal layer GTL3. The third interlayer insulating layer 143 and the first interlayer insulating layer 141 may include the same material described above.

The first data metal layer DTL1 may be formed on the third interlayer insulating layer 143. The first data metal layer DTL1 may include the second initialization voltage line VIL2, the reset voltage line VRL, the first through fifth connection electrodes BE1 through BE5, the first and second sensing connection electrodes LBE1 and LBE2, and the shielding electrode SHE. The first data metal layer DTL1 may be a single layer or a multilayer made of any one or more selected from molybdenum (Mo), aluminum (Al), chromium (Cr), gold (Au), titanium (Ti), nickel (Ni), neodymium (Nd), copper (Cu), and alloys thereof.

The first organic layer 160 may be formed on the first data metal layer DTL1 to flatten steps (or to compensate the step differences) formed by the first active layer ACT1, the second active layer ACT2, the first gate metal layer GTL1, the second gate metal layer GTL2, the third gate metal layer GTL3, and the first data metal layer DTL1. The first organic layer 160 may be made of an organic layer such as acryl resin, epoxy resin, phenolic resin, polyamide resin, or polyimide resin.

The second data metal layer DTL2 may be formed on the first organic layer 160. The second data metal layer DTL2 may include the first anode connection electrode ANDE1, the second anode connection electrode ANDE2, the driving voltage line VDL, the $j^{th}$ data line DLj, and the $q^{th}$ readout line ROLq. The second data metal layer DTL2 may be a single layer or a multilayer made of any one or more selected from molybdenum (Mo), aluminum (Al), chromium (Cr), gold (Au), titanium (Ti), nickel (Ni), neodymium (Nd), copper (Cu), and alloys thereof.

The second organic layer 161 may be formed on the second data metal layer DTL2 to flatten steps (or to compensate the step differences). The second organic layer 161 may be made of an organic layer such as acryl resin, epoxy resin, phenolic resin, polyamide resin, or polyimide resin.

The first contact hole CNT1 may be a hole penetrating the first interlayer insulating layer 141, the second interlayer insulating layer 142, the second gate insulating layer 132, and the third interlayer insulating layer 143 to expose the gate electrode DTG of the driving transistor DT. The second contact hole CNT2 may be a hole penetrating the second gate insulating layer 132 and the third interlayer insulating layer 143 to expose the second electrode D2 of the second transistor T2. The first connection electrode BE1 may be connected (e.g., electrically connected) to the gate electrode DTG of the driving transistor DT through the first contact hole CNT1 and may be connected (e.g., electrically connected) to the second electrode D2 of the second transistor T2 through the second contact hole CNT2.

The third contact hole CNT3 may be a hole penetrating the first gate insulating layer 131, the first interlayer insulating layer 141, the second interlayer insulating layer 142, the second gate insulating layer 132, and the third interlayer insulating layer 143 to expose the second electrode DTD of the driving transistor DT. The fourth contact hole CNT4 may be a hole penetrating the second gate insulating layer 132 and the third interlayer insulating layer 143 to expose the second electrode D2 of the second transistor T2. The second connection electrode BE2 may be connected (e.g., electrically connected) to the second electrode DTD of the driving transistor DT through the third contact hole CNT3 and may be connected (e.g., electrically connected) to the second electrode D2 of the second transistor T2 through the fourth contact hole CNT4.

The fifth contact hole CNT5 may be a hole penetrating the first gate insulating layer 131, the first interlayer insulating layer 141, the second interlayer insulating layer 142, the second gate insulating layer 132, and the third interlayer insulating layer 143 to expose the first electrode S1 of the first transistor T1. The sixth contact hole CNT6 may be a hole penetrating the first organic layer 160 to expose the third connection electrode BE3. The third connection electrode BE3 may be connected (e.g., electrically connected) to the first electrode S1 of the first transistor T1 through the fifth contact hole CNT5, and the $j^{th}$ data line DLj may be connected (e.g., electrically connected) to the third connection electrode BE3 through the sixth contact hole CNT6.

The seventh contact hole CNT7 may be a hole penetrating the second gate insulating layer 132 and the third interlayer insulating layer 143 to expose the first electrode S3 of the third transistor T3. The eighth contact hole CNT8 may be a hole penetrating the second interlayer insulating layer 142, the second gate insulating layer 132, and the third interlayer insulating layer 143 to expose the first initialization voltage line VIL1. The fourth connection electrode BE4 may be connected (e.g., electrically connected) to the first electrode S3 of the third transistor T3 through the seventh contact hole CNT7 and may be connected (e.g., electrically connected) to the first initialization voltage line VIL1 through the eighth contact hole CNT8.

The ninth contact hole CNT9 may be a hole penetrating the first gate insulating layer 131, the first interlayer insulating layer 141, the second interlayer insulating layer 142, the second gate insulating layer 132, and the third interlayer insulating layer 143 to expose the first electrode S4 of the fourth transistor T4. The fourteenth contact hole CNT14 may be a hole penetrating the first organic layer 160 to expose the shielding electrode SHE. The shielding electrode SHE may be connected (e.g., electrically connected) to the first electrode S4 of the fourth transistor T4 through the ninth contact hole CNT9, and the driving voltage line VDL may be connected (e.g., electrically connected) to the shielding electrode SHE through the fourteenth contact hole CNT14. For example, the shielding electrode SHE may connect (e.g., electrically connect) the first electrode S4 of the fourth transistor T4 and the driving voltage line VDL.

The eleventh contact hole CNT11 may be a hole penetrating the first gate insulating layer 131, the first interlayer insulating layer 141, the second interlayer insulating layer 142, the second gate insulating layer 132, and the third interlayer insulating layer 143 to expose the second electrode D5 of the fifth transistor T5. The twelfth contact hole CNT12 may be a hole penetrating the first organic layer 160 to expose the fifth connection electrode BE5. The fifth connection electrode BE5 may be connected (e.g., electrically connected) to the second electrode D5 of the fifth transistor T5 through the eleventh contact hole CNT11, and the first anode connection electrode ANDE1 may be connected (e.g., electrically connected) to the fifth connection electrode BE5 through the twelfth contact hole CNT12.

The thirteenth contact hole CNT13 may be a hole penetrating the first gate insulating layer 131, the first interlayer insulating layer 141, the second interlayer insulating layer 142, the second gate insulating layer 132, and the third interlayer insulating layer 143 to expose the second electrode D6 of the sixth transistor T6. The second initialization voltage line VIL2 may be connected (e.g., electrically connected) to the second electrode D6 of the sixth transistor T6 through the thirteenth contact hole CNT13.

The tenth contact hole CNT10 may be a hole penetrating the second interlayer insulating layer 142, the second gate insulating layer 132, and the third interlayer insulating layer 143 to expose the second capacitor electrode CE12. The shielding electrode SHE may be connected (e.g., electrically connected) to the second capacitor electrode CE12 through the tenth contact hole CNT10.

The first sensing contact hole LCT1 may be a hole penetrating the first interlayer insulating layer 141, the second interlayer insulating layer 142, the second gate insulating layer 132, and the third interlayer insulating layer 143 to expose the gate electrode LG1 of the first sensing transistor LT1. The second sensing contact hole LCT2 may be a hole penetrating the second gate insulating layer 132 and the third interlayer insulating layer 143 to expose the second electrode LD2 of the second sensing transistor LT2. The first sensing connection electrode LBE1 may be connected (e.g., electrically connected) to the gate electrode LG1 of the first sensing transistor LT1 through the first sensing contact hole LCT1 and may be connected (e.g., electrically connected) to the second electrode LD2 of the second sensing transistor LT2 through the second sensing contact hole LCT2.

The third sensing contact hole LCT3 may be a hole penetrating the second gate insulating layer 132 and the third interlayer insulating layer 143 to expose the first electrode LS2 of the second sensing transistor LT2. The reset voltage line VRL may be connected (e.g., electrically connected) to the first electrode LS2 of the second sensing transistor LT2 through the third sensing contact hole LCT3.

The fourth sensing contact hole LCT4 may be a hole penetrating the first gate insulating layer 131, the first interlayer insulating layer 141, the second interlayer insulating layer 142, the second gate insulating layer 132, and the third interlayer insulating layer 143 to expose the second electrode LD3 of the third sensing transistor LT3. The second sensing connection electrode LBE2 may be connected (e.g., electrically connected) to the second electrode LD3 of the third sensing transistor LT3 through the fourth sensing contact hole LCT4.

The fifth sensing contact hole LCT5 may be a hole penetrating the first organic layer 160 to expose the first sensing connection electrode LBE1. The second anode connection electrode ANDE2 may be connected (e.g., electrically connected) to the first sensing connection electrode LBE1 through the fifth sensing contact hole LCT5.

The sixth sensing contact hole LCT6 may be a hole penetrating the first organic layer 160 to expose the second sensing connection electrode LBE2. The $q^{th}$ readout line ROLq may be connected (e.g., electrically connected) to the second sensing connection electrode LBE2 through the sixth sensing contact hole LCT6.

The seventh sensing contact hole LCT7 may be a hole penetrating the first gate insulating layer 131, the first interlayer insulating layer 141, the second interlayer insulating layer 142, the second gate insulating layer 132, and the third interlayer insulating layer 143 to expose the first electrode LS1 of the first sensing transistor LT1. The second initialization voltage line VIL2 may be connected (e.g., electrically connected) to the first electrode LS1 of the first sensing transistor LT1 through the seventh sensing contact hole LCT7.

The light emitting element layer may be formed on the thin-film transistor layer. The light emitting element layer may include light emitting elements EL, light sensing elements PD, and a bank 180. The light emitting element layer may be disposed on the second organic layer 161.

Each of the light emitting elements EL may include a pixel electrode 171, an organic light emitting layer 172, and a common electrode 173. Each of the light sensing elements PD may include a first electrode 175, a photoelectric conversion layer 174, and the common electrode 173. The light emitting elements EL and the light sensing elements PD may share the common electrode 173.

The respective pixel electrodes 171 of the light emitting elements EL and the respective first electrodes 175 of the light sensing elements PD may be formed on the second organic layer 161. The pixel electrode 171 of each of the light emitting elements EL may be connected (e.g., electrically connected) to the first anode connection electrode ANDE1 through the first anode contact hole CNTA1 penetrating the first organic layer 160. The first electrode 175 of each of the light sensing elements PD may be connected (e.g., electrically connected) to the second anode connection electrode ANDE2 through the second anode contact hole CNTA2 penetrating the second organic layer 161.

The pixel electrode 171 of each of the light emitting elements EL may have a single-layer structure of molybdenum (Mo), titanium (Ti), copper (Cu) or aluminum (Al) or a stacked layer structure, for example, a multilayer structure of ITO/Mg, ITO/MgF, ITO/Ag, or ITO/Ag/ITO including indium-tin-oxide (ITO), indium-zinc-oxide (IZO), zinc oxide (ZnO) or indium oxide ($In_2O_3$) and silver (Ag), magnesium (Mg), aluminum (Al), platinum (Pt), lead (Pb), gold (Au) or nickel (Ni). However, embodiments are not limited thereto.

The first electrode 175 of each of the light sensing elements PD may have a single-layer structure of molybdenum (Mo), titanium (Ti), copper (Cu) or aluminum (Al) or a multilayer structure of ITO/Mg, ITO/MgF, ITO/Ag or ITO/Ag/ITO. However, embodiments are not limited thereto.

The bank 180 may be formed on the second organic layer 161 to define the light emitting portions ELU1 through ELU4 of the pixels PX1 through PX4 and the light sensing portions PSU of the light sensors PS. The bank 180 may separate (or define) the light emitting portions ELU1 through ELU4 and the light sensing portions PSU. Each of the light emitting portions ELU1 through ELU4 may be an area in which the pixel electrode 171, the organic light emitting layer 172, and the common electrode 173 are sequentially stacked so that holes from the pixel electrode 171 and electrons from the common electrode 173 are recombined in the organic light emitting layer 172 to emit light. Each of the light sensing portions PSU may be an area in which the first electrode 175, the photoelectric conversion layer 174, and the common electrode 173 are sequentially stacked to convert light incident from the outside into an electrical signal.

The bank 180 may cover edges of the pixel electrode 171 of each of the light emitting elements EL and the first electrode 175 of each of the light sensing elements PD. The bank 180 may be made of an organic layer such as acryl resin, epoxy resin, phenolic resin, polyamide resin, or polyimide resin.

The organic light emitting layer 172 may be formed on the pixel electrode 171 of each of the light emitting elements EL. The organic light emitting layer 172 may include an organic material to emit light of a color. For example, the organic light emitting layer 172 may include a hole transporting layer, an organic material layer, and an electron transporting layer. The organic light emitting layer 172 of the first light emitting portion ELU1 may emit first light, and the organic light emitting layer 172 of the second light emitting portion ELU2 may emit second light. The organic light emitting layer 172 of the third light emitting portion ELU3 may emit third light, and the organic light emitting layer 172 of the fourth light emitting portion ELU4 may emit the second light.

The photoelectric conversion layer 174 may be formed on the first electrode 175 of each of the light sensing elements PD. The photoelectric conversion layer 174 may generate photocharges in proportion to incident light. The incident light may be light transmitted to the photoelectric conversion layer 174 after being emitted from the organic light emitting layer 172 and reflected or may be light provided from the outside regardless of the organic light emitting layer 172. Charges generated and accumulated in the photoelectric conversion layer 174 may be converted into electrical signals required for a light sensing operation.

The photoelectric conversion layer 174 may include an electron donor material and an electron acceptor material. The electron donor material may generate donor ions in response to light, and the electron acceptor material may generate acceptor ions in response to light. In case that the photoelectric conversion layer 174 is made of an organic material, the electron donor material may include a compound such as sub-phthalocyanine (SubPc) or di-butyl-phosphate (DBP). However, embodiments are not limited thereto. The electron acceptor material may include a compound such as fullerene, a fullerene derivative, or perylene diimide. However, embodiments are not limited thereto.

In another example, in case that the photoelectric conversion layer 174 is made of an inorganic material, the light sensing element PD may be a pn-type or pin-type phototransistor. For example, the photoelectric conversion layer 174 may have a structure in which an N-type semiconductor layer, an I-type semiconductor layer, and a P-type semiconductor layer are sequentially stacked.

The common electrode 173 may be disposed on the organic light emitting layer 172, the photoelectric conversion layer 174, and the bank 180. The common electrode 173 may cover the organic light emitting layer 172 and the photoelectric conversion layer 174. The common electrode 173 may be formed in common to overlap the light emitting portions ELU1 through ELU4 and the light sensing portions PSU. The common electrode 173 may include a conductive material having a low work function, such as Li, Ca, LiF/Ca, LiF/Al, Al, Mg, Ag, Pt, Pd, Ni, Au Nd, Ir, Cr, BaF, Ba, or a compound or mixture thereof (e.g., a mixture of Ag and Mg). In another example, the common electrode 173 may include a transparent metal oxide such as indium-tin-oxide (ITO), indium-zinc-oxide (IZO), or zinc oxide (ZnO).

The encapsulation layer TFE may be formed on the light emitting element layer. The encapsulation layer TFE may include at least one inorganic layer to prevent penetration of oxygen or moisture into the light emitting element layer. For example, the encapsulation layer TFE may include at least one organic layer to protect the light emitting element layer from foreign substances such as dust.

Referring to FIG. 17, according to an embodiment, the first shielding portion SHEa of the shielding electrode SHE may be disposed between the $j^{th}$ data line DLj and the gate electrode LG1 of the first sensing transistor LT1, e.g., in plan view or in a diagonal direction between a horizontal direction (e.g., the first or second direction DR1 or DR2) and a vertical direction (e.g., the third direction DR3). Accordingly, the first shielding portion SHEa may prevent the formation of parasitic capacitance between the $j^{th}$ data line DLj and the gate electrode LG1 of the first sensing transistor LT1.

The second shielding portion SHEb of the shielding electrode SHE may be disposed between the $(j-1)^{th}$ data line DLj-1 and the gate electrode LG1 of the first sensing transistor LT1, e.g., in plan view or in a diagonal direction between a horizontal direction (e.g., the first or second direction DR1 or DR2) and a vertical direction (e.g., the third direction DR3). Accordingly, the second shielding portion SHEb may prevent the formation of parasitic capacitance between the $(j-1)^{th}$ data line DLj-1 and the gate electrode LG1 of the first sensing transistor LT1.

The third shielding portion SHEc of the shielding electrode SHE may be disposed between the $j^{th}$ data line DLj and the first sensing connection electrode LBE1 and may partially overlap the $j^{th}$ data line DLj, e.g., in plan view or in a diagonal direction between a horizontal direction (e.g., the first or second direction DR1 or DR2) and a vertical direction (e.g., the third direction DR3). Accordingly, the third shielding portion SHEc may prevent the formation of parasitic capacitance between the $j^{th}$ data line DLj and the first sensing connection electrode LBE1.

The fourth shielding portion SHEd of the shielding electrode SHE may be disposed between the $(j-1)^{th}$ data line DLj-1 and the first sensing connection electrode LBE1 and may partially overlap the $(j-1)^{th}$ data line DLj-1, e.g., in plan view or in a diagonal direction between a horizontal direction (e.g., the first or second direction DR1 or DR2) and a vertical direction (e.g., the third direction DR3). Accordingly, the fourth shielding portion SHEd may prevent the formation of parasitic capacitance between the $(j-1)^{th}$ data line DLj-1 and the first sensing connection electrode LBE1.

The $q^{th}$ readout line ROLq may be disposed outside (or around) a right side of each of the gate electrode LG1 of the first sensing transistor LT1, the first sensing connection electrode LBE1, and the second anode connection electrode ANDE2, e.g., in plan view. The $q^{th}$ readout line ROLq may be a direct current (DC) line to which a sensing signal is not transmitted during a period other than the fingerprint reading period ROP (see FIGS. 7A and 7B). For example, the $q^{th}$ readout line ROLq may be disposed between the gate electrode LG1 of the first sensing transistor LT1 and the $j^{th}$ data line DLj, between the first sensing connection electrode LBE1 and the $j^{th}$ data line DLj, and between the second anode connection electrode ANDE2 and the $j^{th}$ data line DLj to prevent the formation of parasitic capacitance between them.

Accordingly, the voltage change of the gate electrode LG1 of the first sensing transistor LT1, which is caused by the change in data signals transmitted through the data lines DLj and DLj-1 adjacent to the gate electrode LG1 of the first sensing transistor LT1, may be prevented or minimized. Therefore, since the voltage of the gate electrode LG1 is maintained constant during the light exposure period EP, a leakage current of the first sensing transistor LT1 may be prevented or minimized, and the noise signal that causes the degradation of the accuracy of the fingerprint reading operation may be prevented or minimized.

A display device 1 according to an embodiment will now be described with reference to FIGS. 18 through 20.

Figure 18:
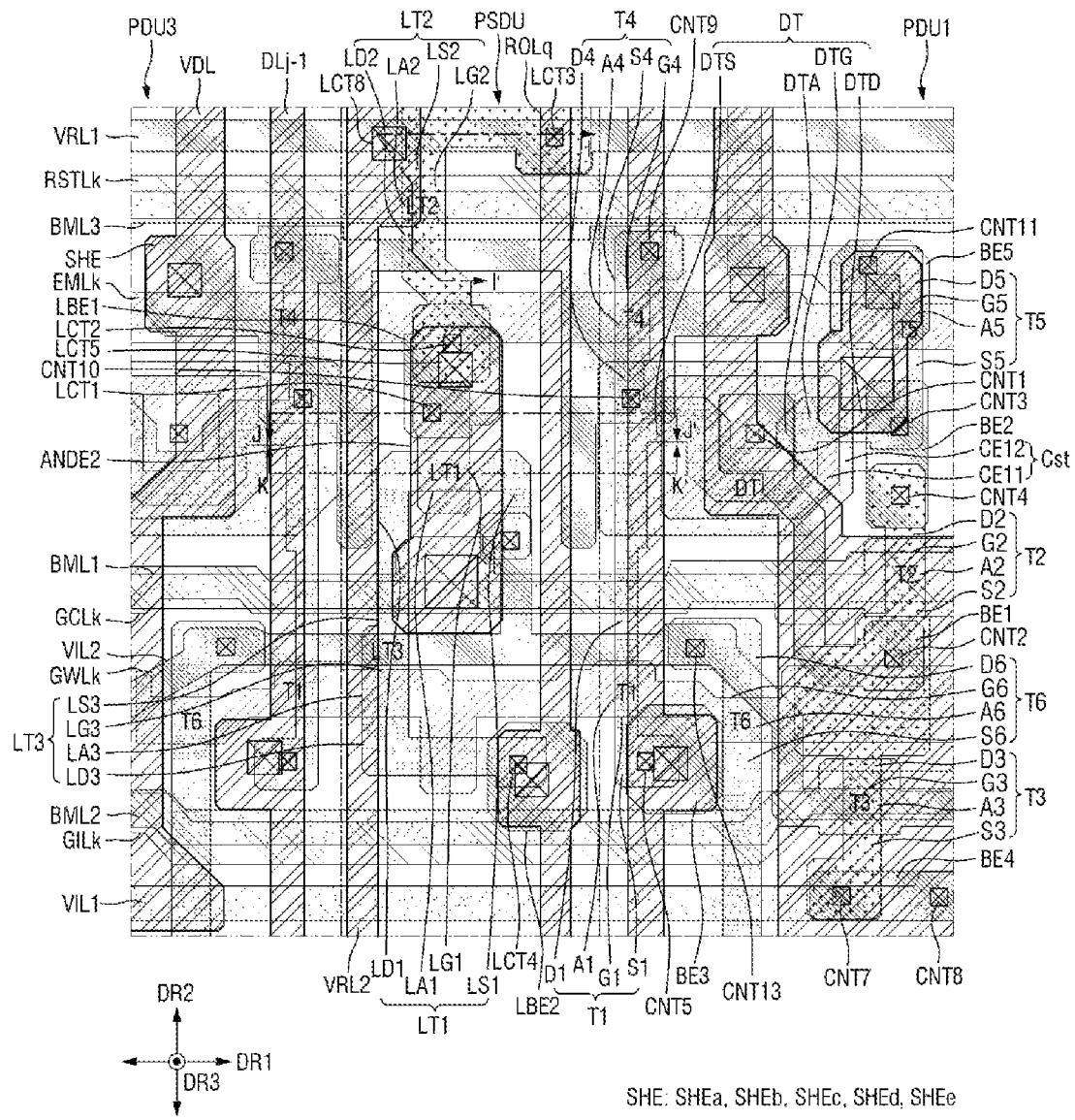
FIG. 18 is a schematic layout view illustrating a first active layer, a first gate metal layer, a second gate metal layer, a second active layer, a third gate metal layer, a first data layer and a second data layer of a first pixel driver, a sensing driver, and a third pixel driver adjacent to the first pixel driver and the sensing driver according to an embodiment.

FIG. 18 is a schematic layout view illustrating a first active layer, a first gate metal layer, a second gate metal layer, a second active layer, a third gate metal layer, a first data layer and a second data layer of a first pixel driver PDU1, a sensing driver PSDU, and a third pixel driver PDU3 adjacent to the first pixel driver PDU1 and the sensing driver PSDU according to an embodiment. FIG. 19 is an example of a schematic cross-sectional view taken along line I-I' of FIG. 18. FIG. 20 is an example of a schematic cross-sectional view taken along lines J-J' and K-K' of FIG. 18.

The display device 1 of FIG. 18 is different from the embodiments described above in that a reset voltage line further includes a second sub-reset voltage line VRL2 extending in the second direction DR2 in addition to a first sub-reset voltage line VRL1 extending in the first direction DR1.

Referring to FIG. 18, the first sub-reset voltage line VRL1 may be disposed at substantially the same position as the reset voltage line of the embodiment of FIGS. 8 through 10. The first sub-reset voltage line VRL1 may be disposed in a first data metal layer DTL1.

The second sub-reset voltage line VRL2 may extend in the second direction DR2 and may be disposed outside (or around) a left side of a gate electrode LG1 of a first sensing transistor LT1, e.g., in plan view. The second sub-reset voltage line VRL2 may be disposed between a $(j-1)^{th}$ data line DLj-1 of the third pixel driver PDU3 and the gate electrode LG1 of the first sensing transistor LT1, e.g., in plan view or in a diagonal direction between a horizontal direction (e.g., the first or second direction DR1 or DR2) and a vertical direction (e.g., the third direction DR3). The second sub-reset voltage line VRL2 may overlap the first sub-reset voltage line VRL1, a $k^{th}$ reset control line RSTLk, a shielding electrode SHE, a $k^{th}$ emission control line EMLk, a $k^{th}$ scan control line GCLk, a second initialization voltage line VIL2, a $k^{th}$ scan initialization line GILk, and a first initialization voltage line VIL1.

For example, a $q^{th}$ readout line ROLq may extend in the second direction DR2 and may be disposed outside (or around) a right side of the gate electrode LG1 of the first sensing transistor LT1, e.g., in plan view.

Figure 19:
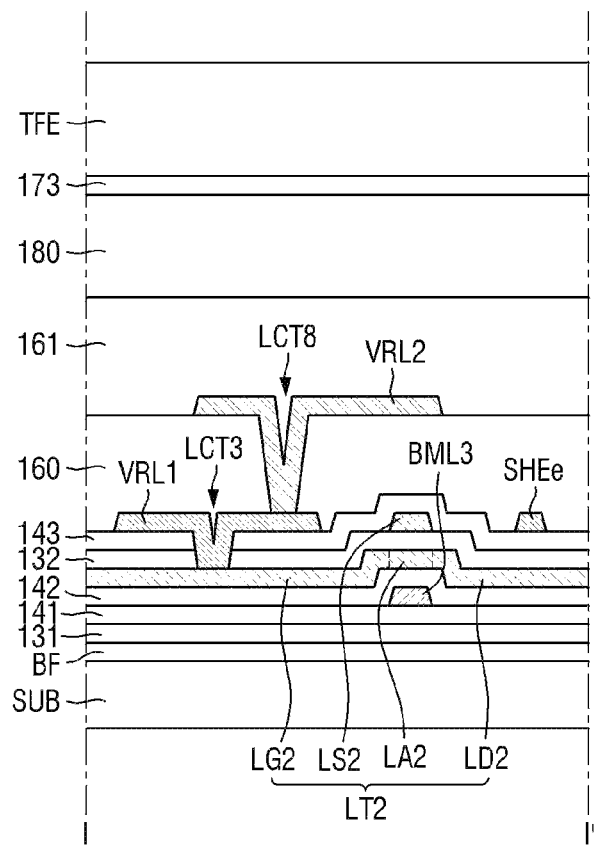
FIG. 19 is an example of a schematic cross-sectional view taken along line I-I' of FIG. 18.

Referring to FIG. 19, the second sub-reset voltage line VRL2 may be disposed in a second data metal layer DTL2 and may partially overlap a channel layer LA2 of a second sensing transistor LT2. The second sub-reset voltage line VRL2 may be connected (e.g., electrically connected) to the first sub-reset voltage line VRL1 through an eighth sensing contact hole LCT8. The eighth sensing contact hole LCT8 may be a hole penetrating a first organic layer 160 to expose the first sub-reset voltage line VRL1.

Figure 20:
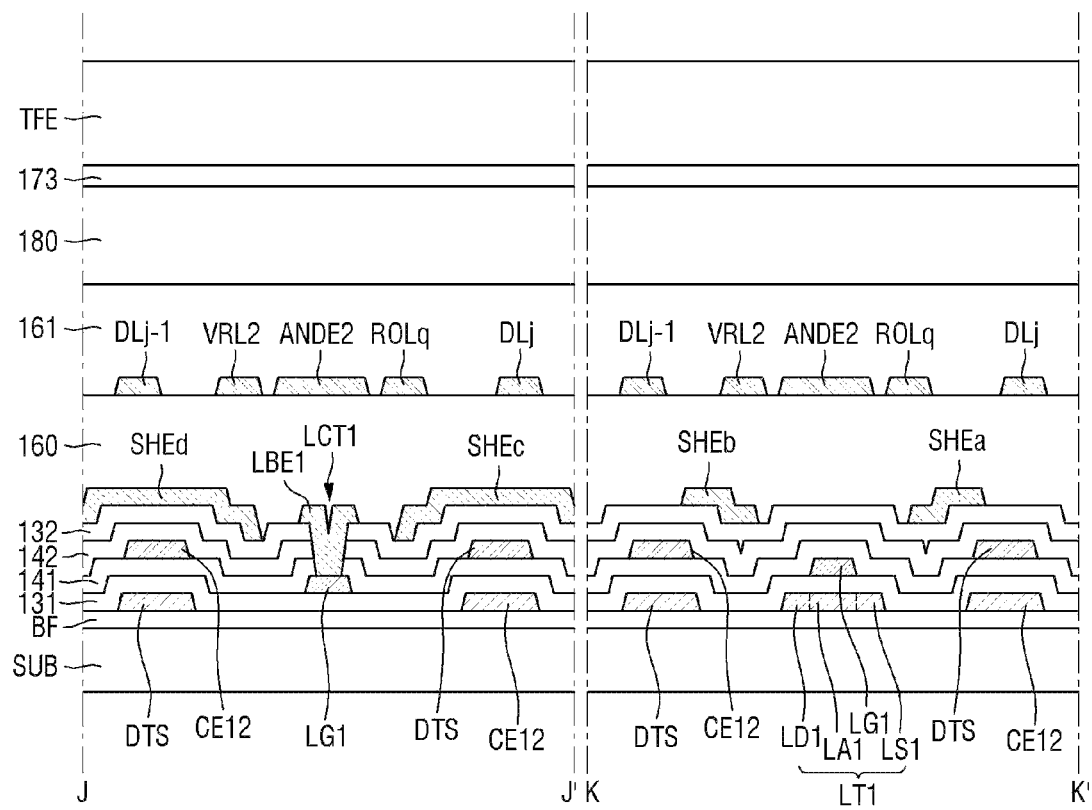
FIG. 20 is an example of a schematic cross-sectional view taken along lines J-J' and K-K' of FIG. 18.

Referring to FIG. 20, in the display device 1 according to an embodiment, the second sub-reset voltage line VRL2 disposed between the $(j-1)^{th}$ data line DLj-1 and the gate electrode LG1 of the first sensing transistor LT1 may prevent the formation of parasitic capacitance between the $(j-1)^{th}$ data line DLj-1 and the gate electrode LG1 of the first sensing transistor LT1.

The second data metal layer DTL2 may include the $(j-1)^{th}$ data line DLj-1, the second sub-reset voltage line VRL2, a second anode connection electrode ANDE2, the $q^{th}$ readout line ROLq, and a $j^{th}$ data line DLj sequentially disposed along a horizontal direction. The second sub-reset voltage line VRL2, a second shielding portion SHEb, and a fourth shielding portion SHEd may prevent the formation of parasitic capacitance between the $(j-1)^{th}$ data line DLj-1 and the gate electrode LG1 of the first sensing transistor LT1 (or a first sensing connection electrode LBE1). The $q^{th}$ readout line ROLq, a first shielding portion SHEa, and a third shielding portion SHEc may prevent the formation of parasitic capacitance between the $j^{th}$ data line DLj and the gate electrode LG1 of the first sensing transistor LT1 (or the first sensing connection electrode LBE1). The gate electrode LG1 of the first sensing transistor LT1 (or the first sensing connection electrode LBE1) may be disposed between the second sub-reset voltage line VRL2 and the $q^{th}$ readout line ROLq and may be protected from its surrounding voltages.

Accordingly, the voltage change of the gate electrode LG1 of the first sensing transistor LT1, which is caused by the change in data signals transmitted through the data lines DLj and DLj-1 adjacent to the gate electrode LG1 of the first sensing transistor LT1, may be prevented or minimized. Therefore, since the voltage of the gate electrode LG1 is maintained constant during a light exposure period EP, a leakage current of the first sensing transistor LT1 may be prevented, and the noise signal that causes the degradation of the accuracy of the fingerprint reading operation may be prevented or minimized.

Figure 22:
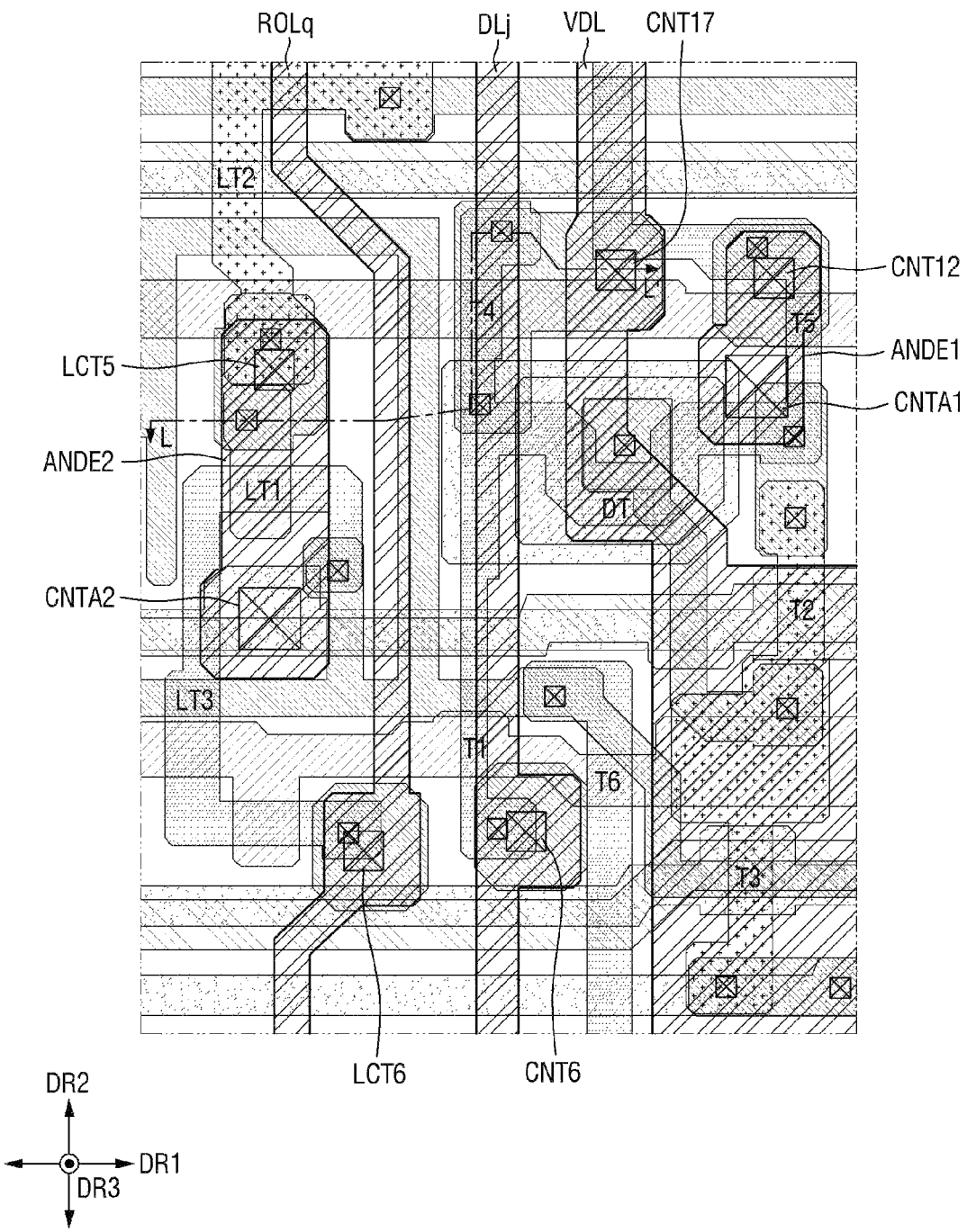
FIG. 22 is a schematic layout view further illustrating a second data layer in FIG. 21.
Figure 23:
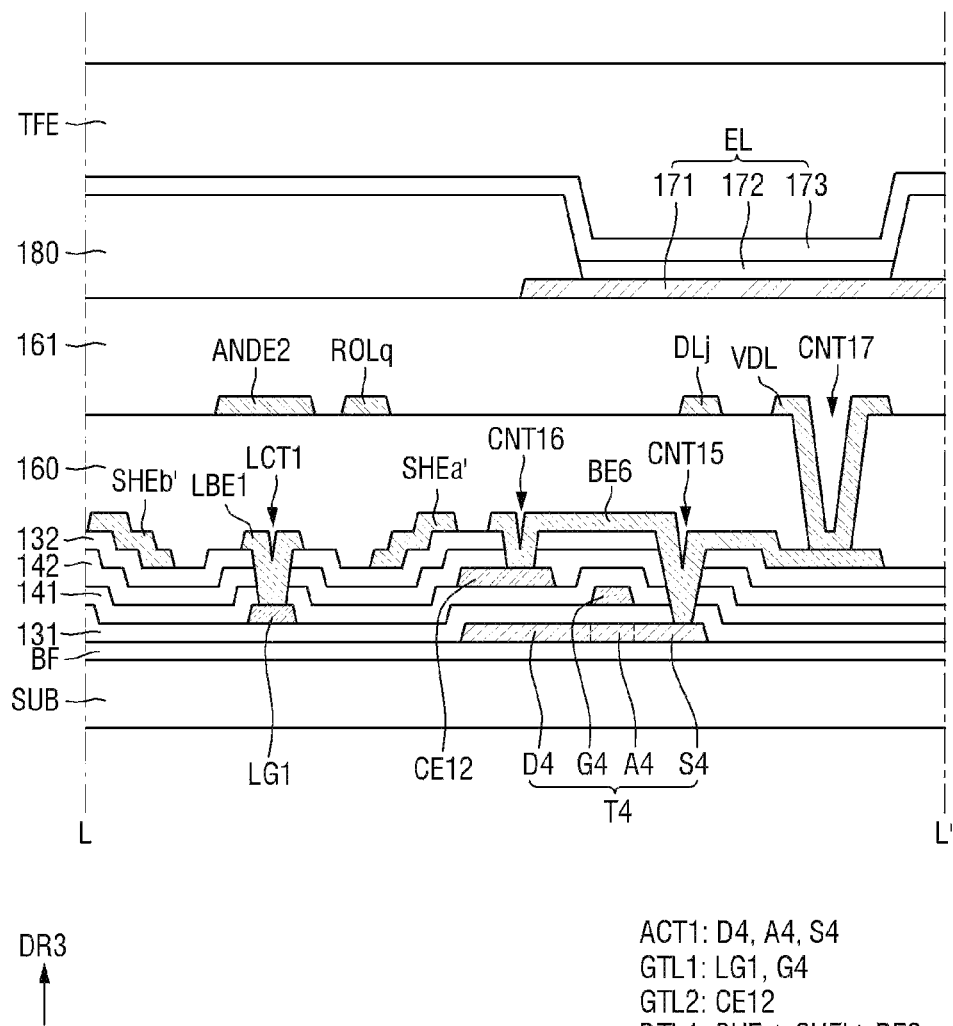
FIG. 23 is an example of a schematic cross-sectional view taken along line L-L' of FIGS. 21 and 22.

A display device 1 according to an embodiment will now be described with reference to FIGS. 21 through 23.

Figure 21:
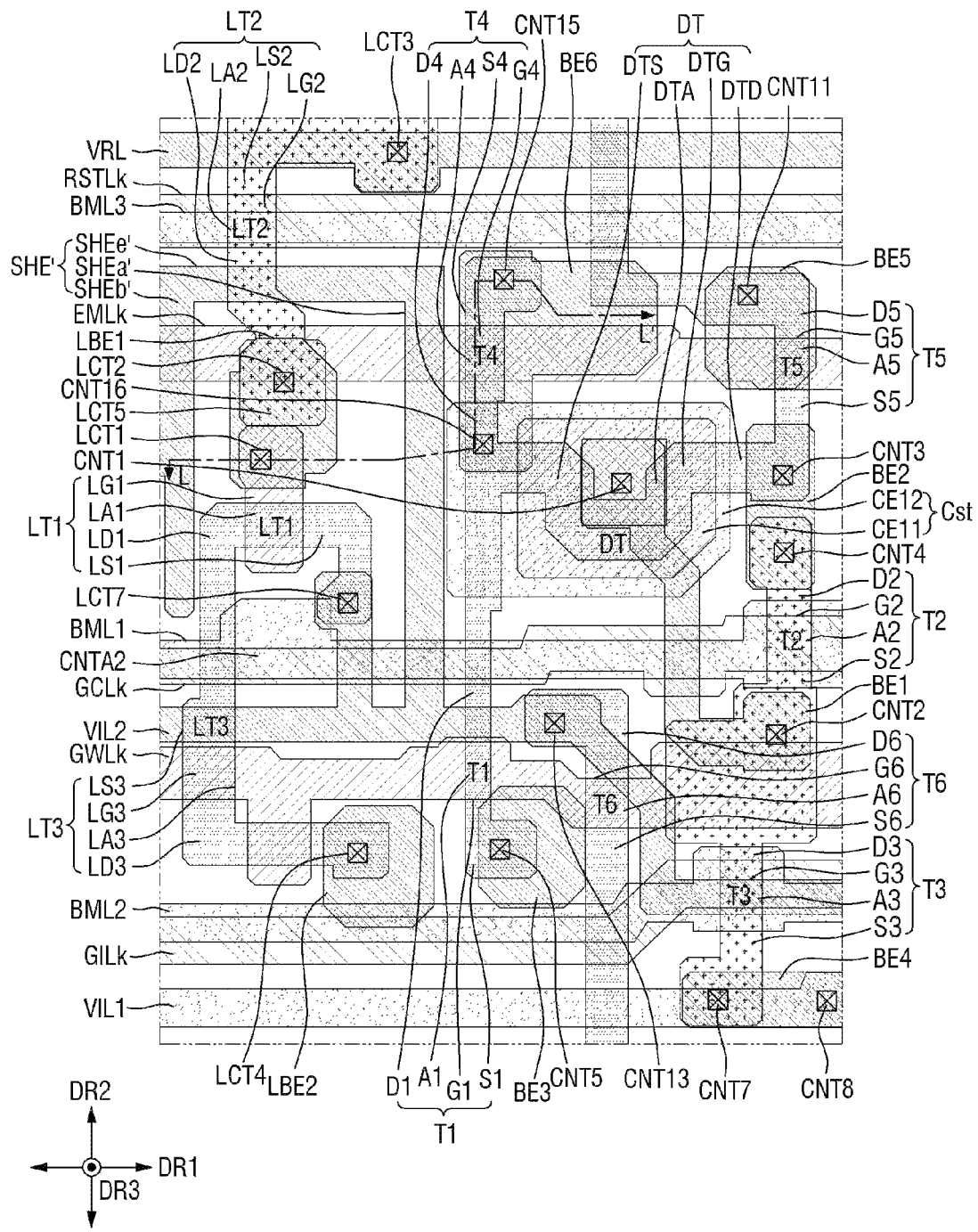
FIG. 21 is a schematic layout view illustrating a first active layer, a first gate metal layer, a second gate metal layer, a second active layer, a third gate metal layer and a first data layer of a first pixel driver and a sensing driver according to an embodiment.

FIG. 21 is a schematic layout view illustrating a first active layer, a first gate metal layer, a second gate metal layer, a second active layer, a third gate metal layer and a first data layer of a first pixel driver and a sensing driver according to an embodiment. FIG. 22 is a schematic layout view further illustrating a second data layer in FIG. 21. FIG. 23 is an example of a schematic cross-sectional view taken along line L-L' of FIGS. 21 and 22.

The display device 1 of FIG. 21 is different from the embodiment of FIGS. 8 through 17 in that a shielding electrode SHE' includes a first shielding portion SHEa' and a second shielding portion SHEb' extending in the second direction DR2 and a third shielding portion SHEe' connecting them. The shielding electrode SHE' may be connected (e.g., electrically connected) to a second initialization voltage line VIL2 through the first shielding portion SHEa' to receive a second initialization voltage VAINT.

The first shielding portion SHEa' may extend in the second direction DR2 and may be disposed outside (or around) a right side of a gate electrode LG1 of a first sensing transistor LT1, e.g., in plan view. The first shielding portion SHEa' may be disposed between the gate electrode LG1 of the first sensing transistor LT1 and a j$^{th}$ data line DLj, e.g., in plan view or in a diagonal direction between a horizontal direction (e.g., the first or second direction DR1 or DR2) and a vertical direction (e.g., the third direction DR3).

The second shielding portion SHEb' may be spaced apart from the first shielding portion SHEa' and may extend in the second direction DR2. The second shielding portion SHEb' may be disposed outside (or around) a left side of the gate electrode LG1 of the first sensing transistor LT1, e.g., in plan view. The second shielding portion SHEb' may be disposed between the gate electrode LG1 of the first sensing transistor LT1 and a (j−1)$^{th}$ data line DLj−1, e.g., in plan view or in a diagonal direction between a horizontal direction (e.g., the first or second direction DR1 or DR2) and a vertical direction (e.g., the third direction DR3).

The third shielding portion SHEe' may extend in the first direction DR1 and may connect the first shielding portion SHEa' and the second shielding portion SHEb'. The third shielding portion SHEe' may be disposed outside (or around) the right side of the gate electrode LG1 of the first sensing transistor LT1, e.g., in plan view. The third shielding portion SHEc' may overlap a channel layer LA2 of a second sensing transistor LT2.

The first shielding portion SHEa', the second shielding portion SHEb', and the third shielding portion SHEe' may surround at least three sides of the gate electrode LG1 of the first sensing transistor LT1, e.g., in plan view. The first shielding portion SHEa', the second shielding portion SHEb', and the third shielding portion SHEe' may surround three sides of a first sensing connection electrode LBE1. A length of the first shielding portion SHEa' or the second shielding portion SHEb' in the second direction DR2 may be greater than a length of the gate electrode LG1 in the second direction DR2. The length of the first shielding portion SHEa' or the second shielding portion SHEb' in the second direction DR2 may be greater than a length of the first sensing connection electrode LBE1 in the second direction DR2.

The display device 1 according to an embodiment may further include a sixth connection electrode BE6. The sixth connection electrode BE6 may be included in a first data metal layer DTL1. The sixth connection electrode BE6 may connect (e.g., electrically connect) a first electrode S4 of a fourth transistor T4 and a second capacitor electrode CE12 to a driving voltage line VDL.

A fifteenth contact hole CNT15 may be a hole penetrating a first gate insulating layer 131, a first interlayer insulating layer 141, a second interlayer insulating layer 142, a second gate insulating layer 132, and a third interlayer insulating layer 143 to expose the first electrode S4 of the fourth transistor T4. A sixteenth contact hole CNT16 may be a hole penetrating the second interlayer insulating layer 142, the second gate insulating layer 132, and the third interlayer insulating layer 143 to expose the second capacitor electrode CE12. The sixth connection electrode BE6 may be connected (e.g., electrically connected) to the first electrode S4 of the fourth transistor T4 through the fifteenth contact hole CNT15 and may be connected (e.g., electrically connected) to the second capacitor electrode CE12 through the sixteenth contact hole CNT16. The driving voltage line VDL may connect a seventeenth contact hole CNT17 to the sixth connection electrode BE6.

According to an embodiment, the shielding electrode SHE' may prevent the formation of parasitic capacitance between the gate electrode LG1 of the first sensing transistor LT1 and the data lines DLj and DLj−1 adjacent to the gate electrode LG1 of the first sensing transistor LT1. Accordingly, the voltage change of the gate electrode LG1 of the first sensing transistor LT1, which is caused by the change in data signals transmitted through the data lines DLj and DLj−1, may be prevented or minimized. Therefore, since the voltage of the gate electrode LG1 is maintained constant during a light exposure period EP, a leakage current of the first sensing transistor LT1 may be prevented or minimized, and the noise signal that causes the degradation of the accuracy of the fingerprint reading operation may be prevented or minimized.

A display device 1 according to an embodiment will now be described with reference to FIGS. 24 through 27.

Figure 24:
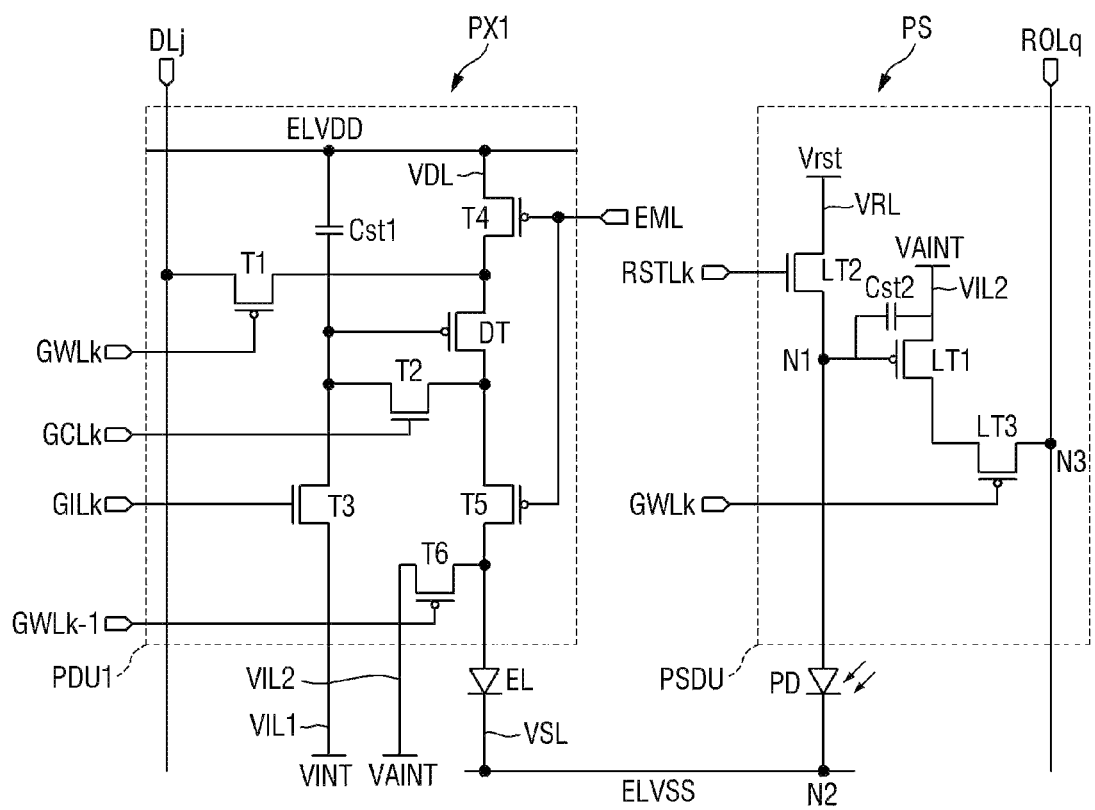
FIG. 24 is a schematic diagram of an equivalent circuit of a first pixel and a light sensor according to an embodiment.
Figure 25:
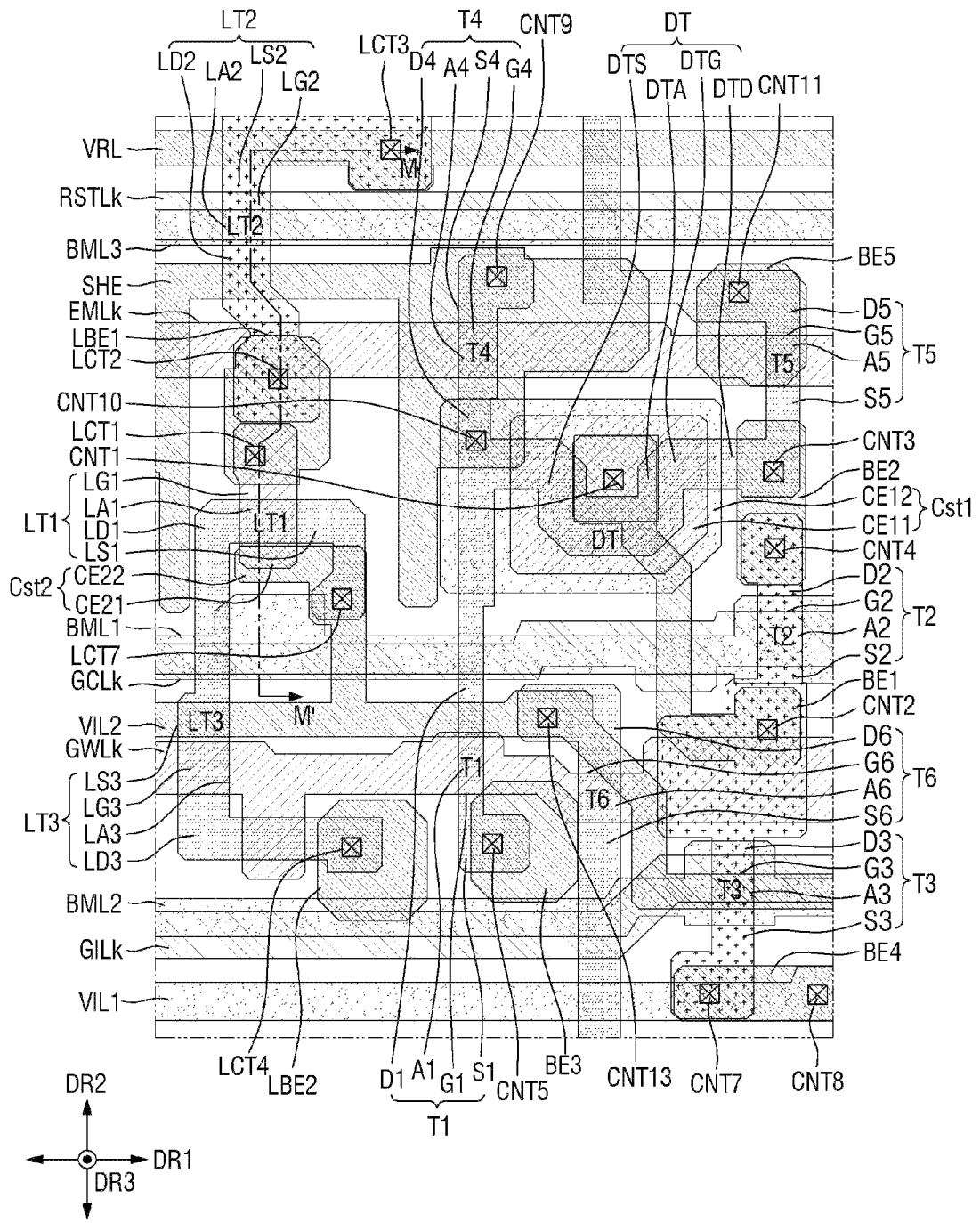
FIG. 25 is a schematic layout view illustrating a first active layer, a first gate metal layer, a second gate metal layer, a second active layer, a third gate metal layer and a first data layer of a first pixel driver and a sensing driver according to FIG. 24.
Figure 26:
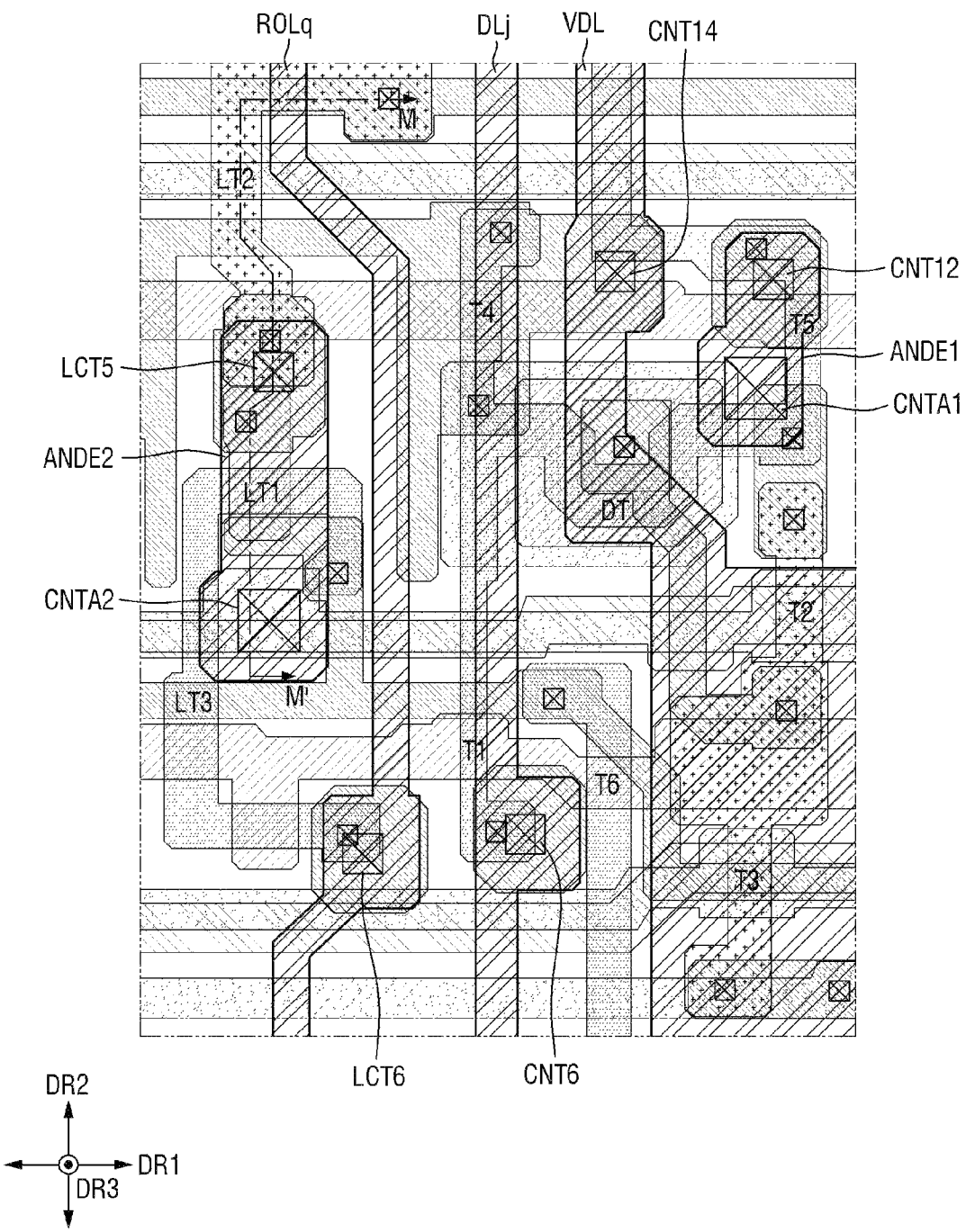
FIG. 26 is a schematic layout view further illustrating a second data layer in FIG. 25.
Figure 27:
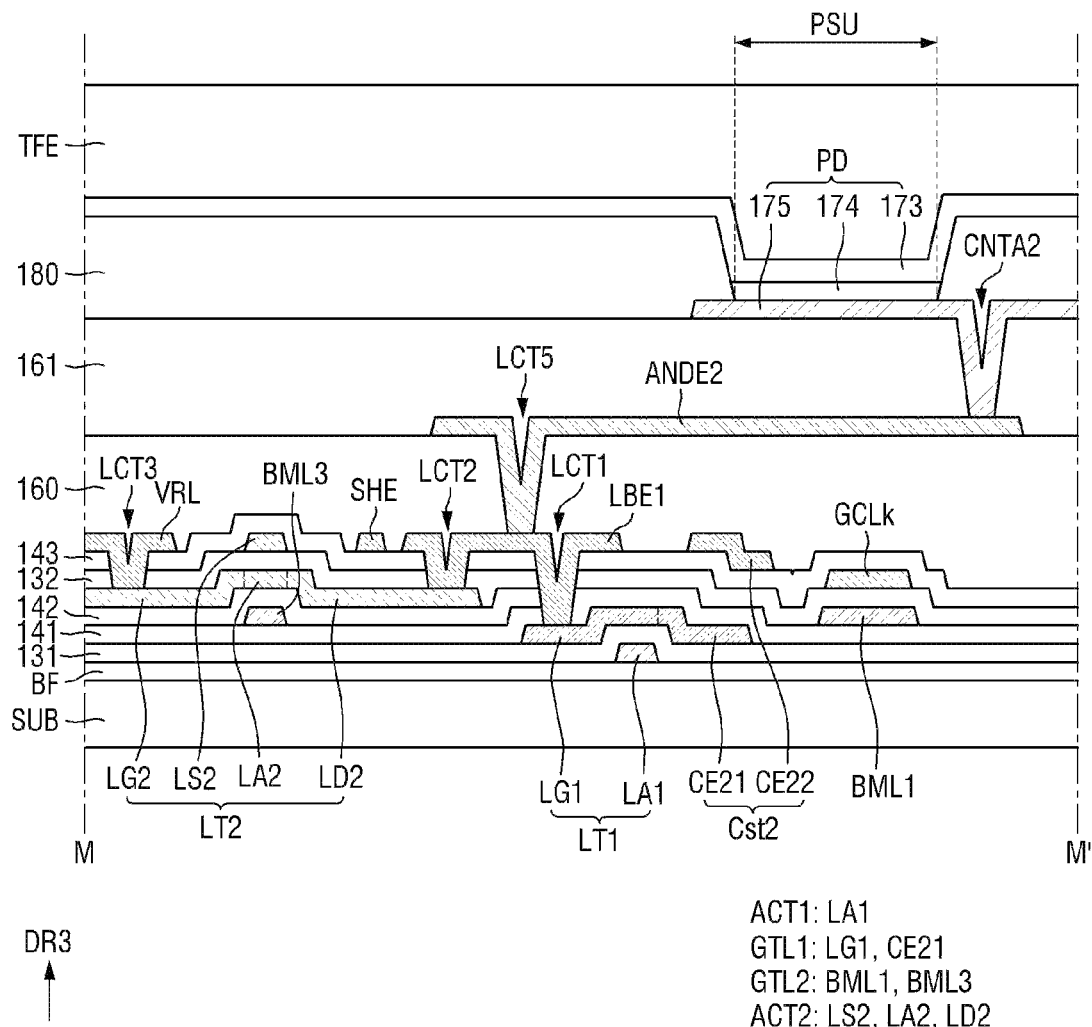
FIG. 27 is an example of a schematic cross-sectional view taken along line M-M' of FIGS. 25 and 26.

FIG. 24 is a schematic diagram of an equivalent circuit of a first pixel PX1 and a light sensor PS according to an embodiment. FIG. 25 is a schematic layout view illustrating a first active layer, a first gate metal layer, a second gate metal layer, a second active layer, a third gate metal layer and a first data layer of a first pixel driver and a sensing driver of FIG. 24. FIG. 26 is a schematic layout view further illustrating a second data layer in FIG. 25. FIG. 27 is an example of a schematic cross-sectional view taken along line M-M' of FIGS. 25 and 26. The display device 1 of FIG. 24 is different from the embodiment of FIGS. 8 through 17 in that it further includes a second capacitor Cst2 of the light sensor PS in addition to a first capacitor Cst1 of the first pixel PX1. The first capacitor Cst1 may be substantially the same as the first capacitors Cst of the embodiments described above.

The second capacitor Cst2 may be formed between a second initialization voltage line VIL2 and a gate electrode LG1 of a first sensing transistor LT1. The second capacitor Cst2 may include a first capacitor electrode CE21 and a second capacitor electrode CE22. The first capacitor electrode CE21 of the second capacitor Cst2 may be connected (e.g., electrically connected) to the gate electrode LG1 of the first sensing transistor LT1, and the second capacitor electrode CE22 of the second capacitor Cst2 may be connected (e.g., electrically connected) to the second initialization voltage line VIL2.

The first capacitor electrode CE21 may be a portion of the gate electrode LG1 of the first sensing transistor LT1 and may correspond to a region of the gate electrode LG1 of the first sensing transistor LT1 which overlaps the second capacitor CE22 of the second capacitor Cst2. The second capacitor electrode CE22 may overlap the first capacitor electrode CE21 of the second capacitor Cst2. The second capacitor electrode CE22 may be a portion of the second initialization voltage line VIL2 and may correspond to a region of the second initialization voltage line VIL2 which overlaps the first capacitor electrode CE21 of the second capacitor Cst2.

According to an embodiment, the second capacitor Cst2 formed by the first capacitor electrode CE21 and the second capacitor electrode CE22 may prevent the voltage of the gate electrode LG1 of the first sensing transistor LT1 from being changed by a voltage change of an adjacent signal line.

Therefore, since the voltage of the gate electrode LG1 of the first sensing transistor LT1 is maintained constant, a leakage current of the first sensing transistor LT1 may be prevented or minimized, and the noise signal that causes the degradation of the accuracy of the fingerprint reading operation may be prevented or minimized.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
    a data line extending in a first direction;
    an emission control line extending in a second direction crossing the first direction; and
    a pixel driver and a sensing driver adjacent to each other, wherein
    the pixel driver includes:
        a driving transistor that controls a driving current; and
        a first transistor comprising one electrode connected to the data line, the sensing driver includes:
        a first sensing transistor that controls a sensing current flowing to a readout line according to a voltage of a gate electrode of the first sensing transistor;
        a second sensing transistor between the gate electrode of the first sensing transistor and a reset voltage line; and
        a third sensing transistor between a first electrode of the first sensing transistor and the readout line, and
    the reset voltage line between the gate electrode of the first sensing transistor and the data line in the second direction extends in the first direction.

2. The display device of claim 1, wherein the pixel driver further includes a second transistor between a first electrode of the driving transistor and a first initialization voltage line to which a first initialization voltage is supplied.

3. The display device of claim 2, wherein the first initialization voltage line is connected to a second electrode of the first sensing transistor.

4. The display device of claim 2, wherein a gate electrode of the first transistor and a gate electrode of the third sensing transistor are connected to a first scan write line.

5. The display device of claim 4, wherein a gate electrode of the second transistor is connected to a second scan write line.

6. The display device of claim 1, wherein an active layer of the second sensing transistor includes an oxide semiconductor.

7. The display device of claim 1, wherein an active layer of the first sensing transistor and an active layer of the third sensing transistor include a polysilicon.

8. The display device of claim 1, wherein the gate electrode of the first sensing transistor is connected to a first sensing connection electrode through a first sensing contact hole.

9. The display device of claim 8, wherein a first electrode of the second sensing transistor is connected to the first sensing connection electrode through a second sensing contact hole.

10. The display device of claim 9, wherein the reset voltage line adjacent to the gate electrode of the first sensing transistor, the first sensing connection electrode, and the first electrode of the second sensing transistor extends in the first direction.

11. The display device of claim 1, further comprising:
    a shielding electrode around at least a side of the gate electrode of the first sensing transistor in plan view.

12. The display device of claim 11, wherein the shielding electrode has a same material with the gate electrode of the first sensing transistor.

13. The display device of claim 11, wherein the shielding electrode includes a first shielding portion and a second shielding portion extending in the first direction.

14. The display device of claim 13, wherein the gate electrode of the first sensing transistor is between the first shielding portion and the second shielding portion in the second direction.

15. The display device of claim 13, wherein the first shielding portion overlaps the reset voltage line.

16. The display device of claim 13, wherein the first shielding portion is disposed between the gate electrode of the first sensing transistor and the data line in the second direction.

17. The display device of claim 13, wherein the shielding electrode further comprising:
    a third shielding portion connected to the first shielding portion;
    a fourth shielding portion connected to the second shielding portion; and
    a fifth shielding portion between the third shielding portion and the fourth shielding portion.

18. The display device of claim 17, wherein
    the fifth shielding portion extends in the second direction, and
    the fifth shielding portion is space away from the gate electrode of the first sensing transistor in the first direction.

19. The display device of claim 2, wherein the pixel driver further includes a third transistor between a gate electrode of the driving transistor and a second initialization voltage line to which a second initialization voltage is supplied.

20. The display device of claim 19, wherein the second initialization voltage line is connected to a second electrode of the first sensing transistor.

* * * * *